(12) United States Patent
Fessler et al.

(10) Patent No.: US 12,241,953 B2
(45) Date of Patent: Mar. 4, 2025

(54) SYSTEMS AND METHODS FOR ACCELERATED MAGNETIC RESONANCE IMAGING (MRI) RECONSTRUCTION AND SAMPLING

(71) Applicant: REGENTS OF THE UNIVERSITY OF MICHIGAN, Ann Arbor, MI (US)

(72) Inventors: Jeffrey Allen Fessler, Ann Arbor, MI (US); Douglas Clair Noll, Ann Arbor, MI (US); Guanhua Wang, Ann Arbor, MI (US)

(73) Assignee: REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 166 days.

(21) Appl. No.: 18/097,632

(22) Filed: Jan. 17, 2023

(65) Prior Publication Data
US 2023/0236271 A1 Jul. 27, 2023

Related U.S. Application Data

(60) Provisional application No. 63/301,944, filed on Jan. 21, 2022.

(51) Int. Cl.
*G01V 3/00* (2006.01)
*G01R 33/48* (2006.01)
(Continued)

(52) U.S. Cl.
CPC ............ *G01R 33/4826* (2013.01); *G06T 5/20* (2013.01); *G06T 5/70* (2024.01); *G06T 11/008* (2013.01);
(Continued)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 10,393,842 B1   8/2019  Cheng et al.
10,692,250 B2   6/2020  Cheng et al.
(Continued)

FOREIGN PATENT DOCUMENTS

CN      111063000 A       4/2020
WO   WO-2020190870 A1 *   9/2020   ......... G01R 33/4816
WO   WO-2020209566 A1    10/2020

OTHER PUBLICATIONS

C. Lazarus et al., "SPARKLING: variable-density k-space filling curves for accelerated T2*-weighted MRI," Mag. Res. Med., vol. 81, No. 6, pp. 3643-3661, Jun. 2019.
(Continued)

*Primary Examiner* — Walter L Lindsay, Jr.
*Assistant Examiner* — Frederick Wenderoth
(74) *Attorney, Agent, or Firm* — MARSHALL, GERSTEIN & BORUN LLP; Randall G. Rueth

(57) ABSTRACT

The following relates generally to accelerated magnetic resonance imaging (MRI) reconstruction. In some embodiments, a MRI machine learning algorithm is trained based on reference MRI data in non-Cartesian k-space. During the training, at each iteration of a plurality of iterations: (i) a non-Cartesian sampling trajectory ω may be optimized under the physical constraints, and/or (ii) an image reconstructor may be jointly iteratively optimized. Examples of the image reconstructor include a convolutional neural network (CNN) denoiser, a model-based deep learning (MoDL) image reconstructor, iterative image reconstructor, a regularizer, and an invertible neural network.

20 Claims, 26 Drawing Sheets

(51) Int. Cl.
G06T 5/20 (2006.01)
G06T 5/70 (2024.01)
G06T 11/00 (2006.01)

(52) U.S. Cl.
CPC .............. G06T 2207/10088 (2013.01); G06T 2207/20081 (2013.01); G06T 2207/20084 (2013.01); G06T 2207/30016 (2013.01); G06T 2210/41 (2013.01)

(58) Field of Classification Search
USPC ....................................................... 324/309
See application file for complete search history.

(56) References Cited

U.S. PATENT DOCUMENTS

| | | | |
|---|---|---|---|
| 10,712,416 B1 | 7/2020 | Sandino et al. | |
| 11,085,988 B2 | 8/2021 | Chen et al. | |
| 2014/0015527 A1* | 1/2014 | Griswold | G01R 33/4826 324/309 |
| 2019/0277935 A1 | 9/2019 | Zeng et al. | |
| 2020/0034998 A1 | 1/2020 | Schlemper et al. | |
| 2020/0217914 A1 | 7/2020 | Huang et al. | |
| 2020/0309883 A1* | 10/2020 | Ding | G01R 33/4826 |
| 2020/0402644 A1 | 12/2020 | Zhou et al. | |
| 2022/0076460 A1* | 3/2022 | Vaughan, Jr. | G16H 50/20 |

OTHER PUBLICATIONS

T. Weiss et al., "PILOT: physics-informed learned optimal trajectories for accelerated MRI," 2019. [Online]. Available: http://arxiv.org/abs/1909.05773.
Jun e tal., "Joint Deep Model-Based MR Image and Coil Sensitivity Reconstruction Network (Joint-ICNet) for Fast MRI," Proceedings of the IEEE/CVF Conference on Computer Vision and Pattern Recognition (CVPR), 2021, pp. 5270-5279.
Pineda et al., "Active MR k-space Sampling with Reinforcement Learning. In: Martel A.L. et al. (eds) Medical Image Computing and Computer Assisted Intervention," MICCAI 2020. MICCAI 2020. Lecture Notes in Computer Science, vol. 12262. Springer, Cham.
Aggarwal et al., "Joint Optimization of Sampling Patterns and Deep Priors for Improved Parallel MRI," ICASSP 2020—2020 IEEE International Conference on Acoustics, Speech and Signal Processing (ICASSP), 2020, pp. 8901-8905.
Zeng et al., "Reinforcement learning for online undersampling pattern optimization," in Proc. Intl. Soc. Magn. Reson. Med. (ISMRM), 2019, p. 1092.
Jin et al., "Self-supervised deep active accelerated MRI," 2020. [Online]. arXiv:1901.04547 [cs.CV].
Sherry et al., "Learning the sampling pattern for MRI," 2020. [Online]. arXiv:1906.08754 [eess.IV].
Han et al., "k-Space Deep Learning for Accelerated MRI," in IEEE Transactions on Medical Imaging, vol. 39, No. 2, pp. 377-386, Feb. 2020, doi: 10.1109/TMI.2019.2927101.
Sanchez et al., "Scalable learning-based sampling optimization for compressive dynamic MRI," in 2020 IEEE Intl. Conf. on Acous., Speech and Sig. Proc. (ICASSP), May 2020, pp. 8584-8588.
Huijben et al., "Learning sampling and model-based signal recovery for compressed sensing MRI," in 2020 IEEE Intl. Conf. on Acous., Speech and Sig. Proc. (ICASSP), May 2020, pp. 8906-8910.
Bahadir et al., "Deep-learning-based optimization of the under-sampling pattern in MRI," IEEE Trans. Comput. Imag., vol. 6, pp. 1139-1152, 2020.
Liang et al., "Deep MRI Reconstruction: Unrolled Optimization Algorithms Meet Neural Networks," 2019, arXiv:1907.11711 [eess.IV].
Ryu et al., "K-space refinement in deep learning MR reconstruction via regularizing scan specific SPIRIT-based self consistency," 2021 International Conference on Computer Vision.

Zhu, B., Liu, J., Cauley, S. et al. Image reconstruction by domain-transform manifold learning. Nature 555, 487-492 (2018).
Chaithya et al., "Hybrid Learning of Non-Cartesian K-Space Trajectory and MR Image Reconstruction Networks," 2021 Electrical Engineering and Systems Science.
P. C. Lauterbur, "Image formation by induced local interactions: examples employing nuclear magnetic resonance," Nature, vol. 242, No. 5394, pp. 190-191, 1973.
C. B. Ahn, J. H. Kim, and Z. H. Cho, "High-speed spiral-scan echo planar NMR imaging-I," IEEE Trans. Med. Imag., vol. 5, No. 1, pp. 2-7, Mar. 1986.
D. J. Larkman and R. G. Nunes, "Parallel magnetic resonance imaging," Phys. Med. Biol., vol. 52, No. 7, pp. R15-R55, Mar. 2007.
Z. Wang and G. R. Arce, "Variable density compressed image sampling," IEEE Trans. Image Proc., vol. 19, No. 1, pp. 264-270, Jan. 2010.
F. Knoll, C. Clason, C. Diwoky, and R. Stollberger, "Adapted random sampling patterns for accelerated MRI," Magn. Reson. Mater. Phys. Biol. Med., vol. 24, No. 1, pp. 43-50, Feb. 2011.
M. Seeger, H. Nickisch, R. Pohmann, and B. Schölkopf, "Optimization of k-space trajectories for compressed sensing by Bayesian experimental design," Magn. Reson. Med., vol. 63, No. 1, pp. 116-126, 2010.
N. Chauffert, P. Ciuciu, and P. Weiss, "Variable density compressed sensing in MRI. Theoretical vs heuristic sampling strategies," in 2013 IEEE 10th Intl. Symp. on Biomed. Imag. (ISBI), Apr. 2013, pp. 298-301.
R. K. Robison, Z. Li, D. Wang, M. B. Ooi, and J. G. Pipe, "Correction of B0 eddy current effects in spiral MRI," Magn. Reson. Med., vol. 81, No. 4, pp. 2501-2513, 2019.
J. H. Lee, B. A. Hargreaves, B. S. Hu, and D. G. Nishimura, "Fast 3D imaging using variable-density spiral trajectories with applications to limb perfusion," Magn. Reson. Med., vol. 50, No. 6, pp. 1276-1285, 2003.
S. Winkelmann, T. Schaeffter, T. Koehler, H. Eggers, and O. Doessel, "An optimal radial profile order based on the golden ratio for timeresolved MRI," IEEE Trans. Med. Imag., vol. 26, No. 1, pp. 68-76, Jan. 2007.
B. Bilgic et al., "Wave-CAIPI for highly accelerated 3D imaging," Magn. Reson. Med., vol. 73, No. 6, pp. 2152-2162, 2015.
A. Bilgin, T. Troouard, A. Gmitro, and M. Altbach, "Randomly perturbed radial trajectories for compressed sensing MRI," in Proc. Intl. Soc. Magn. Reson. Med. (ISMRM), vol. 16, 2008, p. 3152.
M. Lustig, S. Kim, and J. M. Pauly, "A fast method for designing timeoptimal gradient waveforms for arbitrary k-space trajectories," IEEE Trans. Med. Imag., vol. 27, No. 6, pp. 866-873, Jun. 2008.
S. Sabat, R. Mir, M. Guarini, A. Guesalaga, and P. Irarrazaval, "Three dimensional k-space trajectory design using genetic algorithms," Magn. Reson. Imag., vol. 21, No. 7, pp. 755-764, Sep. 2003.
W. Fong and E. Darve, "The black-box fast multipole method," J. Comput. Phys., vol. 228, No. 23, pp. 8712-8725, Dec. 2009.
N. Chauffert, P. Weiss, J. Kahn, and P. Ciuciu, "A projection algorithm for gradient waveforms design in magnetic resonance imaging," IEEE Trans. Med. Imag., vol. 35, No. 9, pp. 2026-2039, Sep. 2016.
S. Elmalem, R. Giryes, and E. Marom, "Learned phase coded aperture for the benefit of depth of field extension," Opt. Exp., vol. 26, No. 12, pp. 15 316-15 331, Jun. 2018.
I. A. M. Huijben, B. S. Veeling, K. Janse, M. Mischi, and R. J. G. van Sloun, "Learning sub-sampling and signal recovery with applications in ultrasound imaging," IEEE Trans. Med. Imag., vol. 39, No. 12, pp. 3955-3966, Dec. 2020.
C. D. Bahadir, A. Q. Wang, A. V. Dalca, and M. R. Sabuncu, "Deeplearning-based optimization of the under-sampling pattern in MRI," IEEE Trans. Comput. Imag., vol. 6, pp. 1139-1152, 2020.
I. A. M. Huijben, B. S. Veeling, and R. J. G. van Sloun, "Learning sampling and model-based signal recovery for compressed sensing MRI," in 2020 IEEE Intl. Conf. on Acous., Speech and Sig. Proc. (ICASSP), May 2020, pp. 8906-8910.

(56) References Cited

OTHER PUBLICATIONS

T. Sanchez et al., "Scalable learning-based sampling optimization for compressive dynamic MRI," in 2020 IEEE Intl. Conf. on Acous., Speech and Sig. Proc. (ICASSP), May 2020, pp. 8584-8588.
M. V. Zibetti, G. T. Herman, and R. R. Regatte, "Fast data-driven learning of MRI sampling pattern for large scale problems," 2020. [Online]. Available: http://arxiv.org/abs/2011.02322.
C. Qian, Y. Yu, and Z.-H. Zhou, "Subset selection by Pareto optimization," in Proc. Intl. Conf. Neur. Info. Proc. Sys. (NeurIPS), ser. NIPS'15, Dec. 2015, pp. 1774-1782.
K. H. Jin, M. Unser, and K. M. Yi, "Self-supervised deep active accelerated MRI," 2020. [Online]. Available: <http://arxiv.org/abs/1901.> 04547.
D. Zeng, C. Sandino, D. Nishimura, S. Vasanawala, and J. Cheng, "Reinforcement learning for online undersampling pattern optimization," in Proc. Intl. Soc. Magn. Reson. Med. (ISMRM), 2019, p. 1092.
F. Sherry et al., "Learning the sampling pattern for MRI," 2020. [Online]. Available: http://arxiv.org/abs/1906.08754.
H. K. Aggarwal and M. Jacob, "Joint optimization of sampling patterns and deep priors for improved parallel MRI," in 2020 IEEE Intl. Conf. on Acous., Speech and Sig. Proc. (ICASSP), May 2020, pp. 8901-8905.
T. Weiss, O. Senouf, S. Vedula, O. Michailovich, M. Zibulevsky, and A. Bronstein, "PILOT: physics-informed learned optimal trajectories for accelerated MRI," 2019. [Online]. Available: http://arxiv.org/abs/1909.05773.
O. Ronneberger, P. Fischer, and T. Brox, "U-Net: convolutional networks for biomedical image segmentation," in Med. Imag. Comput. and Comput.-Assist. Interv. (MICCAI), 2015, pp. 234-241.
K. P. Pruessmann, M. Weiger, P. Börnert, and P. Boesiger, "Advances in sensitivity encoding with arbitrary k-space trajectories," Magn. Reson. Med., vol. 46, No. 4, pp. 638-651, 2001.
S. Hao, J. A. Fessler, D. C. Noll, and J.-F. Nielsen, "Joint design of excitation k-space trajectory and RF pulse for small-tip 3D tailored excitation in MRI," IEEE Trans. Med. Imag., vol. 35, No. 2, pp. 468-479, Feb. 2016.
F. J. Nielsen JF, Sun H and N. DC, "Improved gradient waveforms for small-tip 3D spatially tailored excitation using iterated local search," in Proc. Intl. Soc. Magn. Reson. Med. (ISMRM), 2016, p. 1013.
H. K. Aggarwal, M. P. Mani, and M. Jacob, "MoDL: model-based deep learning architecture for inverse problems," IEEE Trans. Med. Imag., vol. 38, No. 2, pp. 394-405, Feb. 2019.
Y. Yang, J. Sun, H. Li, and Z. Xu, "Deep ADMM-Net for compressive sensing MRI," in Proc. of the 30th Intl. Conf. on Neur. Info. Proc. Sys. (NIPS), Dec. 2016, pp. 10-18.
K. Hammernik et al., "Learning a variational network for reconstruction of accelerated MRI data," Magn. Reson. Med., vol. 79, No. 6, pp. 3055-3071, 2018.
J. Schlemper, C. Qin, J. Duan, R. M. Summers, and K. Hammernik, "Sigma-net: ensembled iterative deep neural networks for accelerated parallel MR image reconstruction," 2020. [Online]. Available: http://arxiv.org/abs/1912.05480.
J. A. Fessler, S. Lee, V. T. Olafsson, H. R. Shi, and D. C. Noll, "Toeplitz-based iterative image reconstruction for MRI with correction for magnetic field inhomogeneity," IEEE Trans. Sig. Proc., vol. 53, No. 9, pp. 3393-3402, Sep. 2005.
K. Gregor and Y. LeCun, "Learning fast approximations of sparse coding," in Proc. of the 27th Intl. Conf. on Mach. Learn. (ICML), Jun. 2010, pp. 399-406.
S. Yu, B. Park, and J. Jeong, "Deep iterative down-up CNN for image denoising," in Proc. of the IEEE Conf. on Comput. Vis. and Patt. Recog. Work. (CVPRW), 2019, pp. 0-0.
S. J. Vannesjo et al., "Gradient system characterization by impulse response measurements with a dynamic field camera," Magn. Reson. Med., vol. 69, No. 2, pp. 583-593, 2013.
J. H. Duyn, Y. Yang, J. A. Frank, and J. W. van der Veen, "Simple correction method for k-space trajectory deviations in MRI," J. Magn. Reson., vol. 132, pp. 150-153, May 1998.
J.-F. Nielsen and D. C. Noll, "TOPPE: a framework for rapid prototyping of MR pulse sequences," Magn. Reson. Med., vol. 79, No. 6, pp. 3128-3134, 2018.
C. Lazarus, "Compressed sensing in MRI: optimization-based design of k-space filling curves for accelerated MRI," Ph.D. dissertation, Université Paris Saclay (COmUE), Sep. 2018.
A. Horé and D. Ziou, "Image quality metrics: PSNR vs. SSIM," in Intl. Conf. on Patn. Recog. (ICPR), Aug. 2010, pp. 2366-2369.
J. Zbontar et al., "fastMRI: An open dataset and benchmarks for accelerated MRI," 2018. [Online]. Available: <http://arxiv.org/abs/1811.> 08839.
M. Uecker et al., "ESPIRIT—an eigenvalue approach to autocalibrating parallel MRI: where SENSE meets GRAPPA," Mag. Reson. Med., vol. 71, No. 3, pp. 990-1001, Mar. 2014.
D. P. Kingma and J. Ba, "Adam: a method for stochastic optimization," 2017. [Online]. Available: http://arxiv.org/abs/1412.6980.
M. Mardani et al., "Deep generative adversarial neural networks for compressive sensing MRI," IEEE Trans. Med. Imag., vol. 38, No. 1, pp. 167-179, 2018.
J. Schlemper, J. Caballero, J. V. Hajnal, A. N. Price, and D. Rueckert, "A deep cascade of convolutional neural networks for dynamic MR image reconstruction," IEEE Trans. Med. Imag., vol. 37, No. 2, pp. 491-503, Feb. 2018.
S. C. van de Leemput, J. Teuwen, B. van Ginneken, and R. Manniesing, "MemCNN: a Python/PyTorch package for creating memory-efficient invertible neural networks," J. Open Source Softw., vol. 4, No. 39, p. 1576, Jul. 2019.
S. Nah et al., "NTIRE 2020 challenge on image and video deblurring," in Proc. of the IEEE Conf. on Comput. Vis. and Patt. Recog. Work. (CVPRW), 2020, pp. 416-417.
A. Lugmayr et al., "NTIRE 2020 challenge on real-world image superresolution: methods and results," in Proc. of the IEEE Conf. on Comput. Vis. and Patt. Recog. Work. (CVPRW), 2020, pp. 494-495.
J. A. Fessler, "Model-based image reconstruction for MRI," IEEE Sig. Proc. Mag., vol. 27, No. 4, pp. 81-89, 2010.
J. A. Fessler and B. P. Sutton, "Nonuniform fast Fourier transforms using min-max interpolation," IEEE Trans. Sig. Proc., vol. 51, No. 2, pp. 560-574, Feb. 2003.
B. Dale, M. Wendt, and J. L. Duerk, "A rapid look-up table method for reconstructing MR images from arbitrary k-space trajectories," IEEE Trans. Med. Imag., vol. 20, No. 3, pp. 207-217, 2001.
M. J. Muckley, R. Stern, T. Murrell, and F. Knoll, "TorchKbNufft: A high-level, hardware-agnostic non-uniform fast fourier transform," in ISMRM Workshop on Data Sampling & Image Reconstruction, 2020.
F. Knoll, C. Clason, C. Diwoky, and R. Stollberger, "Adapted random sampling patterns for accelerated MRI," Mag. Res. Mat. Phys. Bio. Med., vol. 24, No. 1, pp. 43-50, Feb. 2011.
M. M. Bronstein, A. M. Bronstein, M. Zibulevsky, and H. Azhari, "Reconstruction in diffraction ultrasound tomography using nonuniform FFT," IEEE Trans. Med. Imag., vol. 21, No. 11, pp. 1395-1401, Nov. 2002.
S. Matej, J. A. Fessler, and I. G. Kazantsev, "Iterative tomographic image reconstruction using Fourier-based forward and backprojectors," IEEE Trans. Med. Imag., vol. 23, No. 4, pp. 401-412, Apr. 2004.
G. A. Wright, "Magnetic resonance imaging," IEEE Sig. Proc. Mag., vol. 14, No. 1, pp. 56-66, Jan. 1997.
J. A. Fessler, "Model-based image reconstruction for MRI," IEEE Sig. Proc. Mag., vol. 27, No. 4, pp. 81-89, Jul. 2010.
Z. Yang and M. Jacob, "Mean square optimal NUFFT approximation for efficient non-Cartesian MRI reconstruction," J. Mag. Res., vol. 242, pp. 126-135, May 2014.
P. J. Beatty, D. G. Nishimura, and J. M. Pauly, "Rapid gridding reconstruction with a minimal oversampling ratio," IEEE Trans. Med. Imag., vol. 24, No. 6, pp. 799-808, Jun. 2005.
G. Wang, T. Luo, J.-F. Nielsen, D. C. Noll, and J. A. Fessler, "B-spline parameterized joint optimization of reconstruction and kspace trajectories (BJORK) for accelerated 2D MRI," 2021. [Online]. Available: http://arxiv.org/abs/2101.11369.

(56) References Cited

OTHER PUBLICATIONS

T. Adali, P. J. Schreier, and L. L. Scharf, "Complex-valued signal processing: the proper way to deal with impropriety," IEEE Trans. Sig. Proc., vol. 59, No. 11, pp. 4516-4528, Nov. 2011.

L. Sorber, M. V. Barel, and L. D. Lathauwer, "Unconstrained optimization of real functions in complex variables," Siam J. Optim., vol. 22, No. 3, pp. 879-898, 2012.

K. Kreutz-Delgado, "The complex gradient operator and the CRcalculus," arXiv preprint arXiv:0906.4835, 2009.

M. Zehni, L. Donati, E. Soubies, Z. Zhao, and M. Unser, "Joint angular refinement and reconstruction for single-particle cryo-EM," IEEE Trans. Im. Proc., vol. 29, pp. 6151-6163, 2020.

J. R. Magnus and H. Neudecker, Matrix differential calculus with applications in statistics and econometrics. John Wiley & Sons, 2019.

K. P. Pruessmann, M. Weiger, M. B. Scheidegger, and P. Boesiger, "SENSE: sensitivity encoding for fast MRI," Magn. Reson. Med., vol. 42, No. 5, pp. 952-962, 1999.

O. Maier et al., "CG-SENSE revisited: Results from the first ISMRM reproducibility challenge," Magn. Reson. Med., vol. 85, No. 4, pp. 1821-1839, 2021.

D. Kim and J. A. Fessler, "Adaptive Restart of the Optimized Gradient Method for Convex Optimization," J Optim Theory Appl, vol. 178, No. 1, pp. 240-263, Jul. 2018.

J. A. Fessler, "Optimization methods for MR image reconstruction," IEEE Sig. Proc. Mag., vol. 37, No. 1, pp. 33-40, Jan. 2020.

D. C. Noll, J. A. Fessler, and B. P. Sutton, "Conjugate phase MRI reconstruction with spatially variant sample density correction," IEEE Trans. Med. Imag., vol. 24, No. 3, pp. 325-336, 2005.

M. V. W. Zibetti, G. T. Herman, and R. R. Regatte, "Fast data-driven learning of parallel MRI sampling patterns for large scale problems," Sci Rep, vol. 11, No. 1, p. 19312, Sep. 2021.

Ahn CB, Kim JH, Cho ZH. High-speed Spiral-scan Echo Planar NMR Imaging-I. IEEE Trans Med Imaging Mar. 1986;5(1):2-7.

Breuer, et al. Controlled Aliasing in Volumetric Parallel Imaging (2D CAIPIRINHA). Magn Reson Med 2006;55(3):549-556.

Pipe JG. Motion Correction with Propeller MRI: Application to Head Motion and Free-Breathing Cardiac Imaging. Magn Reson Med 1999;42(5):963-969.

Glover GH, Law CS. Spiral-in/out BOLD fMRI for Increased SNR and Reduced Susceptibility Artifacts. Magn Reson Med 2001;46(3):515-522.

Johansson et al., Rigid-Body Motion Correction of the Liver in Image Reconstruction for Golden-Angle Stack-of-Stars DCE MRI. Magn Reson Med 2018;79(3):1345-1353.

Yu et al., Clinical Application of Controlled Aliasing in Parallel Imaging Results in a Higher Acceleration (CAIPIRINHA)-Volumetric Interpolated Breathhold (VIBE) Sequence for Gadoxetic Acid-Enhanced Liver MR Imaging. J Magn Reson Imaging 2013;38(5):1020-1026.

Forbes et al., Propeller MRI: Clinical Testing of a Novel Technique for Quantification and Compensation of Head Motion. J Magn Reson Imaging 2001;14(3):215-222.

Lee et al., Fast 3D Imaging Using Variable-density Spiral Trajectories with Applications to Limb Perfusion. Magn Reson Med 2003;50(6):1276-1285.

Gurney et al., Design and Analysis of a Practical 3D Cones Trajectory. Magn Reson Med 2006;55(3):575-582.

Johnson KM. Hybrid Radial-Cones Trajectory for Accelerated MRI. Magn Reson Med 2017;77(3):1068-1081.

Zhou et al., Golden-Ratio Rotated Stack-of-Stars Acquisition for Improved Volumetric MRI. Magn Reson Med 2017;78(6):2290-2298.

Ham et al., A. Peripheral Nerve Stimulation during MRI: Eects of High Gradient Amplitudes and Switching Rates. J Magn Reson Imaging 1997;7(5):933-937.

Aggarwal et al., Joint Optimization of Sampling Patterns and Deep Priors for Improved Parallel MRI. In: 2020 IEEE Intl. Conf. on Acous., Speech and Sig. Process. (ICASSP); 2020. p. 8901-8905.

Bilgic et al. Wave-CAIPI for Highly Accelerated 3D Imaging. Magn Reson Med 2015;73(6):2152-2162.

Chaithya et al., Optimizing Full 3D Sparkling Trajectories for High-Resolution Magnetic Resonance Imaging. IEEE Trans Med Imaging Aug. 2022;41(8):2105-2117.

Lazarus et al. SPARKLING: Variable-density K-space Filling Curves for Accelerated T2*-weighted MRI. Mag Res Med Jun. 2019;81(6):3643-61.

Huijben et al., Learning Sampling and Model-based Signal Recovery for Compressed Sensing MRI. In: 2020 IEEE Intl. Conf. on Acous., Speech and Sig. Process (ICASSP); 2020. p. 8906-8910.

Wang et al., B-Spline Parameterized Joint Optimization of Reconstruction and K-Space Trajectories (BJORK) for Accelerated 2D MRI. IEEE Trans Med Imaging Sep. 2022;41(9):2318-2330.

Bahadir et al., Deep-learning based Optimization of the Undersampling Pattern in MRI. IEEE Trans Comput Imag 2020;6:1139-1152.

Weiss et al., PILOT: Physics-Informed Learned Optimized Trajectories for Accelerated MRI. Melba 2021;p. 1-23.

Sanchez et al., Scalable Learning-based Sampling Optimization for Compressive Dynamic MRI. In: 2020 IEEE Intl. Conf. on Acous., Speech and Sig. Process. (ICASSP); 2020. p. 8584-8588.

Jin et al., Self-supervised Deep Active Accelerated MRI; 2020. http://arxiv.org/abs/1901.04547.

Sherry et al., Learning the Sampling Pattern for MRI. IEEE Trans Med Imaging Dec. 2020;39(12):4310-21.

Gözcü et al., Learning-Based Compressive MRI. IEEE Trans Med Imaging Jun. 2018;37(6):1394-1406.

Alush-Aben et al., 3D FLAT: Feasible Learned Acquisition Trajectories for Accelerated MRI. In: Deeba F, Johnson P, Würfl T, Ye JC, editors. Mach. Learn. Med. Image Reconstr. Lecture Notes in Computer Science, Cham: Springer International Publishing; 2020. p. 3-16.

Wang et al., Efficient Approximation of Jacobian Matrices Involving a Non-uniform Fast Fourier Transform (NUFFT); 2021. https://arxiv.org/abs/2111.02912.

Fessler et al., Nonuniform Fast Fourier Transforms Using Min-max Interpolation. IEEE Trans Sig Process Feb. 2003;51(2):560-74.

Pruessmann et al., Advances in Sensitivity Encoding with Arbitrary k-space Trajectories. Magn Reson Med 2001;46(4):638-651.

Fessler et al., Toeplitzbased Iterative Image Reconstruction for MRI with Correction for Magnetic Field Inhomogeneity. IEEE Trans Sig Process Sep. 2005;53(9):3393-402.

Wang et al., Image Quality Assessment: From Error Visibility to Structural Similarity. IEEE Trans Image Process Apr. 2004;13(4):600-612.

Schulte et al., Peripheral Nerve Stimulation—Optimal Gradient Waveform Design. Magn Reson Med 2015;74(2):518-522.

Davids et al., Prediction of Peripheral Nerve Stimulation Thresholds of MRI Gradient Coils Using Coupled Electromagnetic and Neurodynamic Simulations. Magn Reson Med 2019;81(1):686-701.

Maier et al. CG-SENSE Revisited: Results from the First ISMRM Reproducibility Challenge. Magn Reson Med 2021;85(4):1821-1839.

Aggarwal et al., MoDL: Model-based Deep Learning Architecture for Inverse Problems. IEEE Trans Med Imaging Feb. 2019;38(2):394-405.

Sun et al., Joint Design of Excitation k-Space Trajectory and RF Pulse for Small-Tip 3D Tailored Excitation in MRI. IEEE Trans Med Imaging Feb. 2016;35(2):468-479.

Welling et al., Learning via Stochastic Gradient Langevin Dynamics. In: Proc. 28th Int. Conf. Int. Conf. Mach. Learn (ICML). Madison, WI, USA: Omnipress; 2011. p. 681-688.

Kingma et al., Adam: A Method for Stochastic Optimization; 2017. http://arxiv.org/abs/1412.6980.

Muckley et al., TorchKbNufft: A High-Level, Hardware-Agnostic Non-Uniform Fast Fourier Transform. In: ISMRM Workshop on Data Sampling & Image Reconstruction; 2020.

Desai et al., SKM-TEA: A Dataset for Accelerated MRI Reconstruction with Dense Image Labels for Quantitative Clinical Evaluation; 2022. http://arxiv.org/abs/2203.06823.

(56) References Cited

OTHER PUBLICATIONS

Welsch et al., Rapid Estimation of Cartilage T2 Based on Double Echo at Steady State (DESS) with 3 Tesla. Magn Reson Med 2009;62(2):544-549.

Uecker et al., ESPIRiT—An Eigenvalue Approach to Autocalibrating Parallel MRI: Where SENSE Meets GRAPPA. Mag Reson Med Mar. 2014;71(3):990-1001.

Barger et al., Time-Resolved Contrast-Enhanced Imaging with Isotropic Resolution and Broad Coverage Using an Undersampled 3D Projection Trajectory. Magn Reson Med 2002;48(2):297-305.

Herrmann et al., Time Efficient 3D Radial UTE Sampling with Fully Automatic Delay Compensation on a Clinical 3T MR Scanner. PLOS One Mar. 2016;11(3):e0150371.

Yu et al., Deep Iterative Down-up CNN for Image Denoising. In: Proc. of the IEEE Conf. on Comput. Vis. and Patt. Recog. Work. (CVPRW); 2019. p. 0-0.

Rettenmeier et al., Three Dimensional Radial Echo Planar Imaging for Functional MRI. Magn Reson Med 2022;87(1):193-206.

Guo et al., Oscillating Steady-State Imaging (OSSI): A Novel Method for Functional MRI. Magn Reson Med 2020;84(2):698-712.

Guo et al., High-Resolution Oscillating Steady-State fMRI Using Patch-Tensor Low-Rank Reconstruction. IEEE Trans Med Imaging Dec. 2020;39(12):4357-4368.

Nielsen et al., TOPPE: a framework for rapid prototyping of MR pulse sequences. Magn Reson Med 2018;79(6):3128-3134.

Zibetti et al., Fast Data-Driven Learning of Parallel MRI Sampling Patterns for Large Scale Problems. Sci Rep Sep. 2021;11(1):19312.

Gözcü et al., Rethinking Sampling in Parallel MRI: A Data-Driven Approach. In: 2019 27th Euro. Sig. Process. Conf. (EUSIPCO); 2019. p. 1-5.

Muckley et al. Results of the 2020 fastMRI Challenge for Machine Learning MR Image Reconstruction. IEEE Trans Med Imaging Sep. 2021;40(9):2306-2317.

Sutton et al., Fast, Iterative Image Reconstruction for MRI in the Presence of Field Inhomogeneities. IEEE Trans Med Imaging Feb. 2003;22(2):178-188.

Ahn et al., Analysis of the Eddy-Current Induced Artifacts and the Temporal Compensation in Nuclear Magnetic Resonance Imaging. IEEE Trans Med Imaging Mar. 1991;10(1):47-52.

Hidalgo-Tobon Ss. Theory of Gradient Coil Design Methods for Magnetic Resonance Imaging. Concepts Magn Reson Part A 2010;36A(4):223-242.

Duyn et al., Simple correction method for k-space trajectory deviations in MRI. J Magn Reson May 1998;132:150-153.

Robison et al., Correction of B0 Eddy Current Eects in Spiral MRI. Magn Reson Med 2019;81(4):2501-2513.

Ma et al., Magnetic Resonance Fingerprinting. Nature 2013;495(7440):187.

\* cited by examiner

Auto-diff of NUFFT

Proposed approximation

SYSTEMS AND METHODS FOR ACCELERATED MAGNETIC RESONANCE IMAGING (MRI) RECONSTRUCTION AND SAMPLING

CROSS REFERENCE TO RELATED APPLICATIONS

This application claims the benefit of U.S. Provisional Patent Application No. 63/301,944, entitled "Systems and Methods for Accelerated Magnetic Resonance Imaging (MRI) Reconstruction," filed Jan. 21, 2022, which is hereby expressly incorporated by reference herein in its entirety.

STATEMENT OF GOVERNMENT SUPPORT

This invention was made with government support under EB023618 and EB026977 awarded by the National Institutes of Health and under 1838179 awarded by the National Science Foundation. The government has certain rights in the invention.

BACKGROUND

In magnetic resonance imaging (MRI) systems, a MRI machine gathers data from a patient along a k-space trajectory (e.g., a "sampling trajectory"). The gathered data is then used to create an MRI image (commonly referred to as "reconstructing" the MRI image from the gathered data). However, current systems use k-space trajectories that are not optimized. Also, current MRI image reconstruction methods are often computationally intensive, and thus burdensome in terms of the processing power that they require. In addition, current systems sometimes produce artifacts in the reconstructed MRI images (e.g., produce features in the MRI image that are not actually present in the patient or object that was scanned).

The systems and methods disclosed herein provide solutions to these problems and others.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one aspect, a computer-implemented method for designing a non-Cartesian sampling trajectory for either a prespecified image reconstructor or an optimized image reconstructor for producing a magnetic resonance imaging (MRI) image may be provided. The method may comprise: (1) training, via machine learning with one or more processors, to design a non-Cartesian MRI sampling trajectory for either the prespecified image reconstructor or for the optimized image reconstructor for producing an MRI image; (2) parameterizing, by the one or more processors, the non-Cartesian sampling trajectory using a basis function set; (3) generating, by the one or more processors, the non-Cartesian sampling trajectory for imaging a patient using the MRI machine learning model; (4) generating, by the one or more processors, MRI data for the patient using the non-Cartesian sampling trajectory; and (5) reconstructing, by the one or more processors, the MRI data using either prespecified reconstructor or the trained reconstruction parameters.

In another aspect, a device for designing a non-Cartesian sampling trajectory for either a prespecified image reconstructor or an optimized image reconstructor for producing a magnetic resonance imaging (MRI) image may be provided. The device may comprise one or more processors configured to: (1) train, via machine learning, to design a non-Cartesian MRI sampling trajectory for either the prespecified image reconstructor or for the optimized image reconstructor for producing an MRI image; (2) parameterize the non-Cartesian sampling trajectory using a basis function set; (3) generate the non-Cartesian sampling trajectory for imaging a patient using the MRI machine learning model; (4) generate MRI data for the patient using the non-Cartesian sampling trajectory; and (5) reconstruct the MRI data using either prespecified reconstruction parameters or the trained reconstruction parameters.

In yet another aspect, a system for designing a non-Cartesian sampling trajectory for either a prespecified image reconstructor or an optimized image reconstructor for producing a magnetic resonance imaging (MRI) image may be provided. The system may comprise: (a) one or more processors; (b) a transmit coil; (c) a receive coil; and (d) one or more memories coupled to the one or more processors. The one or more memories including computer executable instructions stored therein that, when executed by the one or more processors, cause the one or more processors to: (1) train, via machine learning, to design a non-Cartesian MRI sampling trajectory for either the prespecified image reconstructor or for the optimized image reconstructor for producing an MRI image; (2) parameterize the non-Cartesian sampling trajectory using a basis function set; (3) generate the non-Cartesian sampling trajectory for imaging a patient using the MRI machine learning model; (4) generate MRI data for the patient using the non-Cartesian sampling trajectory; and (5) reconstruct the MRI data using either prespecified reconstruction parameters or the trained reconstruction parameters.

Advantages will become more apparent to those skilled in the art from the following description of the preferred embodiments which have been shown and described by way of illustration. As will be realized, the present embodiments may be capable of other and different embodiments, and their details are capable of modification in various respects. Accordingly, the drawings and description are to be regarded as illustrative in nature and not as restrictive.

DETAILED DESCRIPTION

The present embodiments relate to, inter alia, accelerated MRI image reconstruction.

Example System

Figure 1:
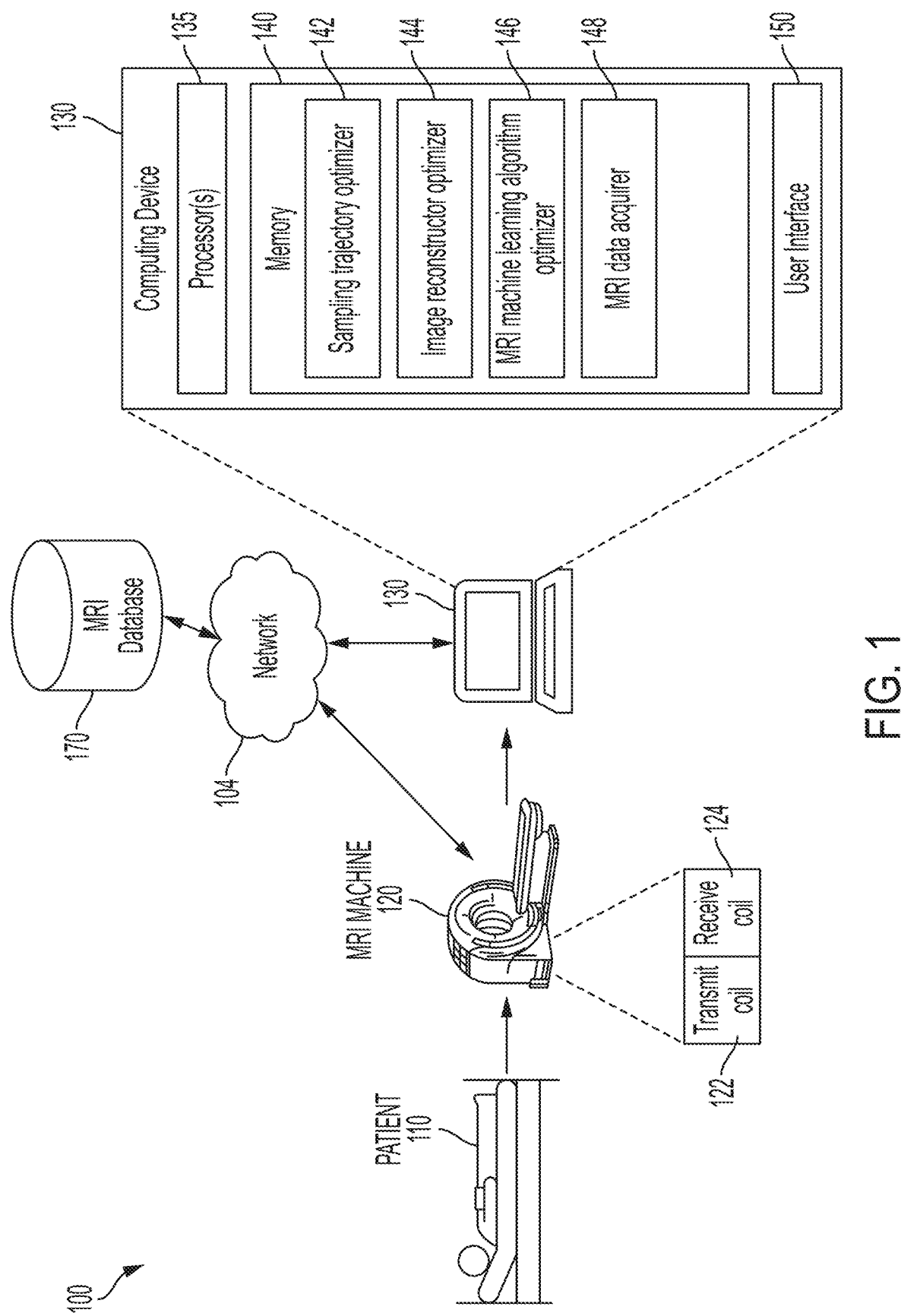
FIG. 1 shows an example MRI system in accordance with an embodiment.

By way of a brief overview and illustrative example, FIG. 1 shows an example MRI system 100, including patient 110 entering a MRI machine 120. The MRI machine 120 may produce k-space data that is analyzed and processed by the computing device 130. For example, the MRI machine 120 (and/or the one or more processors 135) may control the transmit coil 122 and the receive coil 124 to produce the k-space data. It should be understood that although the example of FIG. 1 illustrates one transmit coil 122 and one receive coil 124, any number of transmit coils 122 (and gradient coils) and/or receive coils 124 may be used.

As is understood in the art, the k-space data may comprise a grid of raw data, in a form such as $k_x,k_y$, acquired directly from the MR signal. Further, the k-space data may comprise an array of numbers representing spatial frequencies (e.g., a number of wave cycles per unit distance) in the MR image. As is further understood in the art, the k-space data may be converted to MR image using a Fourier Transform. Each point in k-space includes spatial frequency and phase information about every point (e.g., pixel) in the final MR image; thus, each point in k-space maps to every point in the final MR image.

The computing device 130 may include one or more processors 135 such as one or more microprocessors, controllers, and/or any other suitable type of processor. The computing device 130 may further include a memory 140 (e.g., volatile memory, non-volatile memory) accessible by the one or more processors 135 (e.g., via a memory controller). Additionally, the computing device 130 may include a user interface 150, which may be controlled by the one or more processors 135 to display, for example, MRI images of the patient 110.

The one or more processors 135 may interact with the memory 140 to obtain, for example, computer-readable instructions stored in the memory 140. Additionally or alternatively, computer-readable instructions may be stored on one or more removable media (e.g., a compact disc, a digital versatile disc, removable flash memory, etc.) that may be coupled to the computing device 130 to provide access to the computer-readable instructions stored thereon. In particular, the computer-readable instructions stored on the memory 140 may include instructions for executing various applications, such as sampling trajectory optimizer 142, image reconstructor optimizer 144, MRI machine learning algorithm optimizer 146, and/or MRI data acquirer 148.

Furthermore, the computing device 130 may be connected to the MRI machine 120 and/or MRI database 170 via network 104, which may be a wired or wireless network, such as the internet. The MRI database 170 may store any MRI data, such as fully or partially sampled reference MRI data.

As used herein, a non-Cartesian sampling pattern means a sampling pattern where not every dimension of the sample coordinates has a least common divisor; in addition, as is understood in the art, radial, spiral, cylindrical, and spherical sampling patterns are non-Cartesian. However, it may be noted that some embodiments include non-Cartesian sampling patterns where every dimension of the sampling pattern does not have a least common divisor. It also may be noted that most prior systems use Cartesian sampling; whereas, advantageously, the techniques disclosed herein leverage aspects of non-Cartesian sampling in k-space to create an improved method for producing a MRI image.

Overview

Optimizing k-space sampling trajectories is a challenging topic for MRI. The systems and methods disclosed herein propose to optimize a reconstruction algorithm and sampling trajectories jointly concerning image reconstruction quality. As disclosed herein, trajectories may be parameterized with basis functions like quadratic B-spline kernels to reduce the number of parameters and enable multi-scale optimization, which may help to avoid sub-optimal local minima. In some embodiments, the method includes an efficient non-Cartesian unrolled neural network-based image reconstruction algorithm and an accurate approximation for backpropagation through the non-uniform fast Fourier transform (NUFFT) operator to accurately reconstruct and backpropagate multi-coil non-Cartesian data. Penalties on slew rate and gradient amplitude may enforce hardware constraints. Sampling and reconstruction may be trained jointly using large public datasets. To correct the potential eddy-current effect introduced by the curved trajectory, some embodiments use a pencil-beam trajectory mapping technique to measure the actual k-space trajectory. In both simulations and in-vivo experiments, the learned trajectory demonstrates significantly improved image quality compared to previous model-based and learning-based trajectory optimization methods for twenty-fold acceleration factors. Though trained with neural network-based reconstruction, the proposed trajectory also leads to improved image quality with compressed sensing-based reconstruction.

I. Introduction

As mentioned above, MRI systems acquire raw data in the frequency domain (k-space). Most scanning protocols sample data points sequentially according to a predetermined sampling pattern. The most common sampling patterns are variants of Cartesian rasters and non-Cartesian trajectories, such as radial spokes [P. C. Lauterbur, "Image formation by induced local interactions: examples employing nuclear magnetic resonance," Nature, vol. 242, no. 5394, pp. 190-191, 1973.] and spiral interleaves [C. B. Ahn, J. H. Kim, and Z. H. Cho, "High-speed spiral-scan echo planar NMR imaging-I," IEEE Trans. Med. Imag., vol. 5, no. 1, pp. 2-7, March 1986]. The local smoothness of these patterns facilitates to ensure that they obey hardware limits, namely the maximum gradient and slew rate that constrain the speed and acceleration when traversing k-space. These patterns also make it easy to ensure sufficient sampling densities. In recent years, hardware improvements, especially with the radio frequency (RF) and gradient systems, enable more complex gradient waveform designs and sampling patterns. For a given readout time, optimized designs can cover a broader and potentially more useful region in k-space, reducing the overall scanning time and/or improving image quality, particularly when combined with multiple receive coils.

For fast imaging, many works focus on acceleration in the phase-encoding (PE) direction with fully sampled frequency-encoding (FE) lines [D. J. Larkman and R. G. Nunes, "Parallel magnetic resonance imaging," Phys. Med. Biol., vol. 52, no. 7, pp. R15-R55, March 2007; Z. Wang and G. R. Arce, "Variable density compressed image sampling," IEEE Trans. Image Proc., vol. 19, no. 1, pp. 264-270, January 2010; F. Knoll, C. Clason, C. Diwoky, and R. Stollberger, "Adapted random sampling patterns for accelerated MRI," Magn. Reson. Mater. Phys. Biol. Med., vol. 24, no. 1, pp. 43-50, February 2011; M. Seeger, H. Nickisch, R. Pohmann, and B. Scholkopf, "Optimization of k-space trajectories for compressed sensing by Bayesian experimental design," Magn. Reson. Med., vol. 63, no. 1, pp. 116-126, 2010; N. Chauffert, P. Ciuciu, and P. Weiss, "Variable density compressed sensing in MRI. Theoretical vs heuristic sampling strategies," in 2013 IEEE 10th Intl. Symp. on Biomed. Imag. (ISBI), April 2013, pp. 298-301].

Usually, there is enough time for the $\Delta k$ shift in the PE direction, so gradient and slew rate constraints are readily satisfied. More general non-Cartesian trajectory designs in 2D and 3D can further exploit the flexibility in the FE direction. However, in addition to hardware physical constraints, the system is affected by imperfections, such as the eddy currents that cause the actual trajectory to deviate from the nominal one and introduce undesired phase fluctuations in the acquired data [R. K. Robison, Z. Li, D. Wang, M. B. Ooi, and J. G. Pipe, "Correction of B0 eddy current effects in spiral MRI," Magn. Reson. Med., vol. 81, no. 4, pp. 2501-2513, 2019]. Some studies optimize properties of existing trajectories, such as the density of spiral trajectories [J. H. Lee, B. A. Hargreaves, B. S. Hu, and D. G. Nishimura, "Fast 3D imaging using variable-density spiral trajectories with applications to limb perfusion," Magn. Reson. Med., vol. 50, no. 6, pp. 1276-1285, 2003.] or the rotation angle of radial trajectories [S. Winkelmann, T. Schaeffter, T. Koehler, H. Eggers, and O. Doessel, "An optimal radial profile order based on the golden ratio for time-resolved MRI," IEEE Trans. Med. Imag., vol. 26, no. 1, pp. 68-76, January 2007].

More complex waveforms, for example, wave-like patterns [B. Bilgic et al., "Wave-CAIPI for highly accelerated 3D imaging," Magn. Reson. Med., vol. 73, no. 6, pp. 2152-2162, 2015.] can provide more uniform coverage of k-space and mitigate aliasing artifacts. To accommodate the incoherence requirements of compressed sensing based methods, some works, such as [A. Bilgin, T. Troouard, A. Gmitro, and M. Altbach, "Randomly perturbed radial trajectories for compressed sensing MRI," in Proc. Intl. Soc. Magn. Reson. Med. (ISMRM), vol. 16, 2008, p. 3152] and [M. Lustig, S. Kim, and J. M. Pauly, "A fast method for designing timeoptimal gradient waveforms for arbitrary k-space trajectories," IEEE Trans. Med. Imag., vol. 27, no. 6, pp. 866-873, June 2008.] introduce slight perturbations to existing trajectories, such as radial or spiral trajectories. Some works also explore genetic algorithms to solve this non-convex constrained problem [S. Sabat, R. Mir, M. Guarini, A. Guesalaga, and P. Irarrazaval, "Three dimensional k-space trajectory design using genetic algorithms," Magn. Reson. Imag., vol. 21, no. 7, pp. 755-764, September 2003].

The recent SPARKLING method [C. Lazarus et al., "SPARKLING: variable-density k-space filling curves for accelerated T2*-weighted MRI," Mag. Res. Med., vol. 81, no. 6, pp. 3643-61, June 2019.] considers two criteria for trajectory design: (1) the trajectory should match a predetermined density according to a certain measure, and (2) the sampling points should be locally uniform to avoid clusters or gaps. The density and uniformity criteria are transformed into "attraction" and "repulsion" forces among the sampling points. The work uses fast multipole methods (FMM) [W. Fong and E. Darve, "The black-box fast multipole method," J. Comput. Phys., vol. 228, no. 23, pp. 8712-8725, December 2009.] to efficiently calculate the interactions between points.

Projection-based optimization handles the gradient and slew rate constraints [N. Chauffert, P. Weiss, J. Kahn, and P. Ciuciu, "A projection algorithm for gradient waveforms design in magnetic resonance imaging," IEEE Trans. Med. Imag., vol. 35, no. 9, pp. 2026-2039, September 2016]. In-vivo and simulation experiments demonstrate that this approach reduces the level of aliasing artifacts for 2D and 3D T2*-weighted imaging. However, in SPARKLING, the density is determined heuristically; determining the optimal sampling density for different protocols remains an open problem. The work also does not consider some k-space signal characteristics, such as conjugate symmetry. Furthermore, the point spread function (PSF) of the calculated trajectory for high under-sampling rates is not guaranteed to be optimal for reconstruction algorithms, such as those based on convolution neural networks, because the reconstruction algorithm is not part of the SPARKLING design process.

With rapid advances in deep learning and autodifferentiation software, learning-based signal sampling strategies are being investigated in multiple fields, such as optics and ultrasound [S. Elmalem, R. Giryes, and E. Marom, "Learned phase coded aperture for the benefit of depth of field extension," Opt. Exp., vol. 26, no. 12, pp. 15 316-15 331, June 2018.], [I. A. M. Huijben, B. S. Veeling, K. Janse, M. Mischi, and R. J. G. van Sloun, "Learning sub-sampling and signal recovery with applications in ultrasound imaging," IEEE Trans. Med. Imag., vol. 39, no. 12, pp. 3955-3966, December 2020].

In MRI, the majority of learning-based works have focused on sampling patterns of phase encoding locations. Some studies formulate the on-grid sampling pattern as i.i.d. samples from multivariate Bernoulli distribution [C. D. Bahadir, A. Q. Wang, A. V. Dalca, and M. R. Sabuncu, "Deep-learning-based optimization of the under-sampling pattern in MRI," IEEE Trans. Comput. Imag., vol. 6, pp. 1139-1152, 2020.], [I. A. M. Huijben, B. S. Veeling, and R. J. G. van Sloun, "Learning sampling and model-based signal recovery for compressed sensing MRI," in 2020 IEEE Intl. Conf. on Acous., Speech and Sig. Proc. (ICASSP), May 2020, pp. 8906-8910]. Since random sampling operations are not differentiable, different surrogate gradients, such as Gumbel-Softmax, are developed in these works.

Rather than gradient descent, [T. Sanchez et al., "Scalable learning-based sampling optimization for compressive dynamic MRI," in 2020 IEEE Intl. Conf. on Acous., Speech and Sig. Proc. (ICASSP), May 2020, pp. 8584-8588.] uses a greedy search method. Another work, [M. V. Zibetti, G. T. Herman, and R. R. Regatte, "Fast data-driven learning of MRI sampling pattern for large scale problems," 2020. (Online). Available: http://arxiv.org/abs/2011.02322] further reduces the complexity of greedy search by using Pareto optimization, an evolutionary algorithm for sparse regression [C. Qian, Y. Yu, and Z.-H. Zhou, "Subset selection by Pareto optimization," in Proc. Intl. Conf. Neur. Info. Proc. Sys. (NeurIPS), ser. NIPS'15, December 2015, pp. 1774-1782].

Some works have used reinforcement learning. For example, [K. H. Jin, M. Unser, and K. M. Yi, "Self-supervised deep active accelerated MRI," 2020. (Online). Available: http://arxiv.org/abs/1901.04547] and [D. Zeng, C. Sandino, D. Nishimura, S. Vasanawala, and J. Cheng, "Reinforcement learning for online undersampling pattern optimization," in Proc. Intl. Soc. Magn. Reson. Med. (ISMRM), 2019, p. 1092.] adopted a double network setting: one for reconstruction and the other generating a sampling pattern, where the first work used Monte-Carlo Tree Search (MCTS) and the second used Q-learning to optimize the 1-D sub-sampling.

Instead of using an end-to-end CNN as the reconstruction algorithm in other works, [F. Sherry et al., "Learning the sampling pattern for MRI," 2020. [Online]. Available: http://arxiv.org/abs/1906.08754] constructs a differentiable compressed sensing reconstruction framework. [H. K. Aggarwal and M. Jacob, "Joint optimization of sampling patterns and deep priors for improved parallel MRI," in 2020 IEEE Intl. Conf. on Acous., Speech and Sig. Proc. (ICASSP), May 2020, pp. 8901-8905.] used an unrolled neural network as the reconstruction algorithm.

PILOT [T. Weiss, O. Senouf, S. Vedula, O. Michailovich, M. Zibulevsky, and A. Bronstein, "PILOT: physics-informed learned optimal trajectories for accelerated MRI," 2019. [Online]. Available: http://arxiv.org/abs/1909.05773] is believed to be the first work to optimize a 2D non-Cartesian trajectory and an image reconstruction method jointly. The training loss is the reconstruction error since the ultimate goal of trajectory optimization is high image quality. The trained parameters were the locations of sampling points and the weights of the reconstruction neural network. Large datasets and stochastic gradient descent were used to optimize the parameters. To meet the hardware limits, a penalty was applied on the gradient and slew rate. Since the reconstruction involves non-Cartesian data, PILOT uses a non-iterative (bilinear, hence differentiable) gridding reconstruction algorithm to map the k-space data into the image domain, followed by a non-iterative U-net [O. Ronneberger, P. Fischer, and T. Brox, "U-Net: convolutional networks for biomedical image segmentation," in Med. Imag. Comput. and Comput.-Assist. Interv. (MICCAI), 2015, pp. 234-241.] to refine the gridded image data. Simulation experiments report encouraging results compared to ordinary trajectories. Nevertheless, the algorithm often gets stuck in sub-optimal local minima where the initial trajectory is only slightly perturbed yet the slew rate rapidly oscillates. To reduce the effect of initialization, the paper uses a randomized initialization algorithm based on the traveling salesman problem (TSP). However, this initialization approach works only with single-shot long TE sequences, limiting its utility in many clinical applications. The implementation in [T. Weiss, O. Senouf, S. Vedula, O. Michailovich, M. Zibulevsky, and A. Bronstein, "PILOT: physics-informed learned optimal trajectories for accelerated MRI," 2019. [Online]. Available: http://arxiv.org/abs/1909.05773] relies on auto-differentiation to calculate the Jacobian of the non-uniform Fourier transform. In contrast, the systems and methods described herein adopt a new NUFFT Jacobian approximation that is faster and more accurate.

To overcome the limitations of previous methods and further expand their possible applications, the systems and methods described herein propose an improved supervised learning workflow referred to hereinafter as B-spline parameterized Joint Optimization of Reconstruction and K-space trajectory (BJORK). Some of the proposals and contributions discussed herein include the following. (1) A proposal to parameterize the trajectories with quadratic B-spline kernels. This reparameterization reduces the number of parameters and enables multilevel optimization, enabling non-local improvements to the initial trajectory. Moreover, the local smoothness of B-spline kernels avoids rapid slew rate oscillations. (2) A proposal to adopt an unrolled neural network reconstruction method for non-Cartesian sampling patterns. Compared to the end-to-end model implemented in previous works, the proposed approach combines the strength of learning-based and model-based reconstruction, improving the effect of both reconstruction and trajectory learning. (3) A proposal to derive a more accurate and efficient approximation of the NUFFT Jacobian matrix. (4) In addition to a simulation experiment, phantom and in-vivo experiments were also conducted with protocols that differ from the training dataset to evaluate the generalizability and applicability of the model. (5) A k-space mapping technique was used to correct potential eddy current-related artifacts. (6) Compared with SPARKLING, the proposed learning-based approach does not need to assume signal characteristics, such as spectrum energy density. Instead, the required sampling trajectories are learned from a large data set in a supervised manner.

II. Example Methods

This section describes the proposed approach for supervised learning of the sampling trajectory and image reconstruction method.

A. Problem Formulation

Figure 2A:
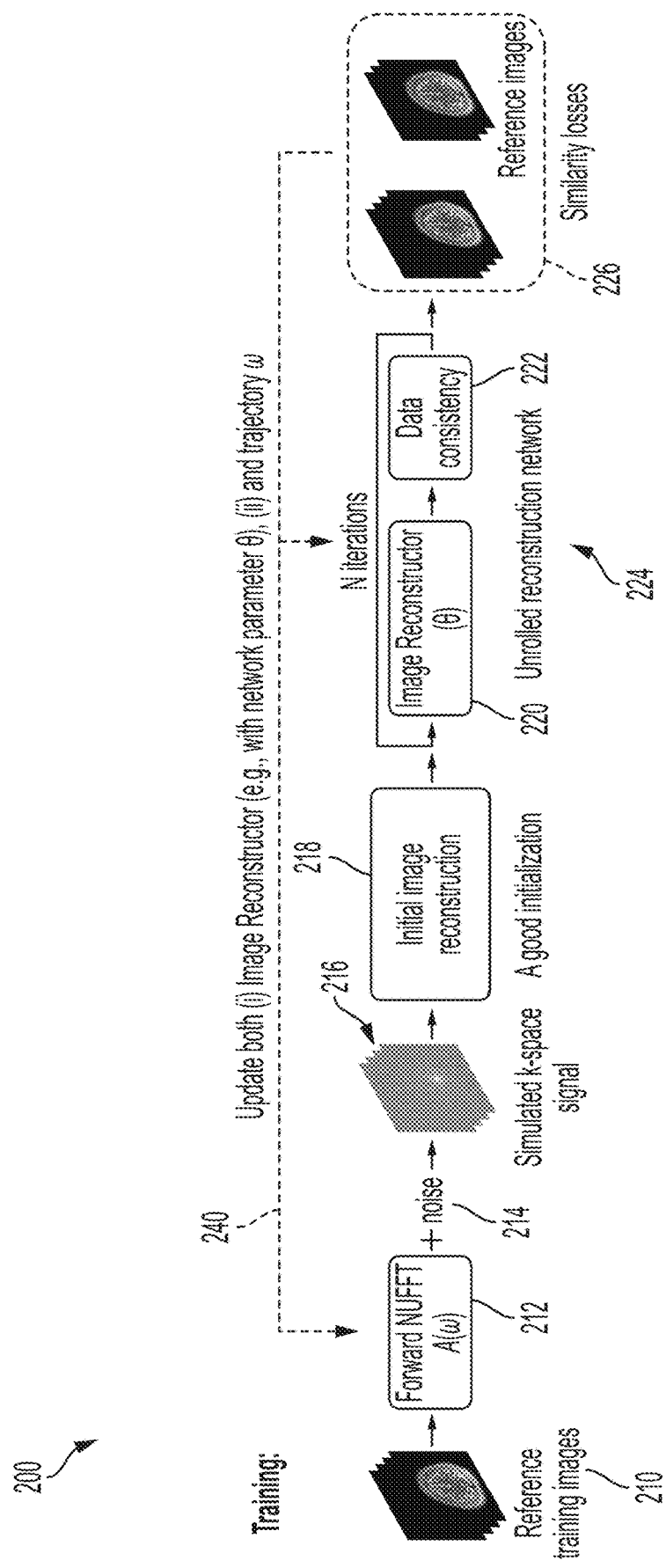
FIG. 2A illustrates an example training phase.
Figure 2B:
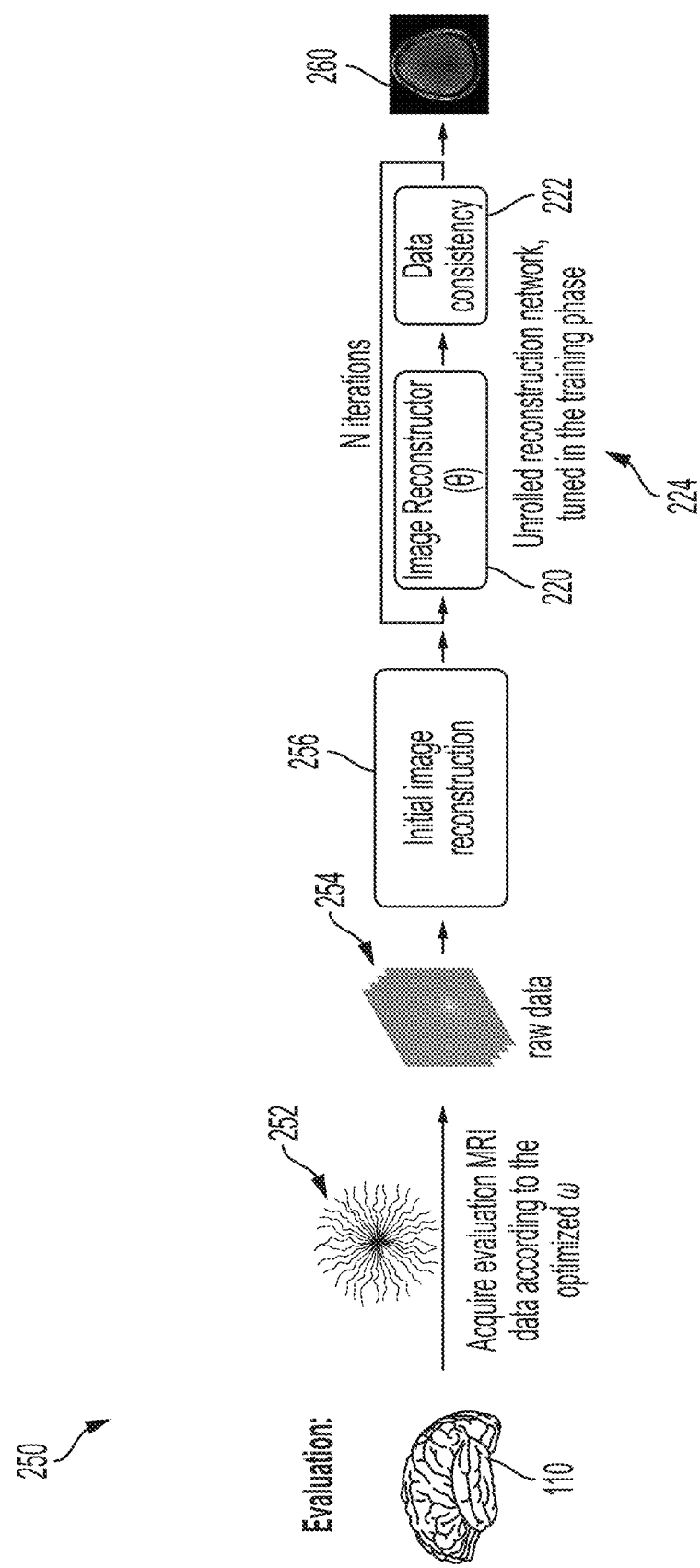
FIG. 2B illustrates an example evaluation phase.

FIGS. 2A-2B illustrate an example of the overall workflow of the proposed approach, with FIG. 2A illustrating a training phase 200 (e.g., training of a MRI machine learning algorithm), and FIG. 2B illustrating an evaluation or testing phase 250 (e.g., to produce a MRI image). In practice, the evaluation/testing phase 250 is sometimes referred to as the prospective phase 250 or clinical use phase 250. In some embodiments, the training phase 200 and/or the evaluation phase 250 are performed by the one or more processors 135.

Broadly speaking, the training phase 200 jointly optimizes: (i) the sampling trajectory ω, and (ii) the image reconstructor 220. It may be noted that the image reconstructor 220 may comprise any algorithm or model capable of reconstructing a MRI image. For example, the image reconstructor 220 may comprise a model based deep learning algorithm, a convolutional neural network (CNN) denoiser, a model-based method with a regularizer, an invertible neural network, etc. In some embodiments, the algorithm(s) of the image reconstructor 220 are iterative reconstruction algorithms. The training phase 200 may begin at 210 when fully sampled training data is received (e.g., by the one or more processors 135 from the MRI database 170).

In some embodiments, the goal of optimizing the sampling trajectory ω is accomplished by optimizing ω∈ $\mathbb{R}^{N_s \times N_d}$, a trainable (possibly multi-shot) sampling pattern; and the goal of optimizing the reconstruction parameter θ is accomplished by optimizing θ∈ $\mathbb{R}^M$, the M parameters of the image reconstruction method, where $N_s$ denotes the total number of k-space samples, and $N_d$ denotes the image dimensionality. (The results are for $N_d$=2, i.e., 2D images, but the method is general.) It may be noted that as used herein reconstruction parameter θ may refer to a single parameter or a plurality of parameters.

The training loss for jointly optimizing the parameters is as follows:

$$\underset{\omega \in \mathbb{R}^{N_s \times N_d}, \theta \in \mathbb{R}^M}{\text{argmin}} \quad \mathbb{E}\|f_\theta(\omega; A(\omega)x + \varepsilon) - x\| \qquad \text{eq. (1)}$$

$$\text{s.t. } \|D_1 \omega^{[d]}\|_\infty \leq \gamma \Delta t g_{max},$$

$$\|D_2 \omega^{[d]}\|_\infty \leq \gamma \Delta t^2 s_{max}, d = 1, \ldots, N_d,$$

where x∈ $\mathbb{C}^{N_V}$ is a fully sampled reference image (batch) (e.g., received at 210 of FIG. 2A) having $N_V$ voxels from the training data set and E is simulated additive complex Gaussian noise (e.g., noise is added at 214 to generate the simulated k-space signal 216). A∈ $\mathbb{C}^{N_s N_c \times N_V}$ denotes the system matrix of MR imaging, where $N_C$ denotes the number of receive coils. For multi-coil non-Cartesian acquisition, it is a non-Cartesian SENSE operator [K. P. Pruessmann, M. Weiger, P. Bornert, and P. Boesiger, "Advances in sensitivity encoding with arbitrary k-space trajectories," Magn. Reson. Med., vol. 46, no. 4, pp. 638-651,2001] that applies a pointwise multiplication of the sensitivity maps followed by a NUFFT operator (e.g., 212 of FIG. 2A); further, some embodiments do not consider field inhomogeneity.

$f_\theta(\omega;\cdot)$ in eq. (1) denotes an image reconstruction method (one example of the image reconstructor 220) with reconstruction parameter θ that is applied to simulated undersampled data A(ω)x+ε. As detailed in later sections, some embodiments use an unrolled neural network 224. The reconstruction loss $\|\cdot\|$ (e.g., at 226), in some embodiments, may be a combined $\ell_1$ and square of $\ell_2$ norm. $D_1$ and $D_2$ are the first-order and second-order finite difference operators. Δt is the dwell time and γ denotes the gyromagnetic ratio. For multi-shot imaging, the difference operator applies to each shot individually. The constraints stand for maximum gradient field strength ($g_{max}$) and slew rate ($s_{max}$). To use the stochastic gradient descent (SGD) method, some embodiments convert the box constraint into a penalty function ϕ, which in the present case is a soft-thresholding function, leading to the following final optimization problem:

$$\underset{\omega \in \mathbb{C}^{N_s \times N_d}, \theta \in \mathbb{R}^M}{\text{argmin}} \quad \mathbb{E}_x\|f_{\theta,\omega}(\omega; A(\omega)x + \varepsilon) - x\| + \qquad \text{eq. (2)}$$

$$\phi_{\gamma \Delta t g_{max}}(|D_1 \omega|) + \phi_{\gamma \Delta t^2 s_{max}}(|D_2 \omega|)$$

Thus, some embodiments update θ and ω simultaneously for each mini-batch of training data (e.g., 240 of FIG. 2A).

It may be noted that in some embodiments where the image reconstructor 220 comprises the CNN denoiser, a stochastic gradient descent (SGD)-type method may be used to jointly optimize the sampling trajectory ω and update the CNN denoiser. To this end, some embodiments construct the differentiable forward MRI system matrix A(ω) that simulates k-space data w.r.t. trajectory ω from ground truth images, and an unrolled neural network 224 that reconstructs the simulated data. The reconstruction errors compared with the ground truth are used as the training loss to update learnable parameters (the trajectory ω and the network's parameters θ) (e.g., at 240 of FIG. 2A).

B. Parameterization and Multi-Level Optimization

Some embodiments parameterize the sampling pattern with 2nd-order quadratic B-spline kernels:

$$\omega^{[d]} = Bc^{[d]}, \qquad \text{eq. (3)}$$

where B∈ $\mathbb{R}^{N_s \times L}$ denotes the interpolation matrix, and $c^{[d]}$ denotes the dth column of the coefficient matrix c∈ $\mathbb{R}^{L \times N_d}$. L denotes the length of $c^{[d]}$, or the number of interpolation kernels in each dimension. Using B-spline kernels to parameterize the trajectory reduces the number of individual inequality constraints from $4N_d N_s$ to $4N_d L$ [S. Hao, J. A. Fessler, D. C. Noll, and J.-F. Nielsen, "Joint design of excitation k-space trajectory and RF pulse for small-tip 3D tailored excitation in MRI," IEEE Trans. Med. Imag., vol. 35, no. 2, pp. 468-479, February 2016.], where typically L<<$N_s$.

As shown in previous works [T. Weiss, O. Senouf, S. Vedula, O. Michailovich, M. Zibulevsky, and A. Bronstein, "PILOT: physics-informed learned optimal trajectories for accelerated MRI," 2019. [Online]. Available: http://arxiv.org/abs/1909.05773], the optimized trajectories are often local minima near the initialization, only slightly perturbing the initial trajectory.

Some techniques described herein use a multilevel training strategy to improve the optimization process [J. F. Nielsen, J. Fessler, H. Sun, and D. C. Noll, "Improved gradient waveforms for small-tip 3D spatially tailored excitation using iterated local search," in Proc. Intl. Soc. Magn. Reson. Med. (ISMRM), 2016, p. 1013]. The decimation rate $N_s/L$ is initialized with a large value (e.g., 64).

Thus, many neighboring sample points are controlled by the same coefficient. After both c and θ converge, some embodiments reduce the decimation rate, typically by a factor of 2, and begin a new round of training initialized with ω and θ of the previous round.

C. Reconstruction

In the joint learning model, some embodiments adopt a model-based unrolled neural network (UNN) approach to image reconstruction [H. K. Aggarwal, M. P. Mani, and M. Jacob, "MoDL: model-based deep learning architecture for inverse problems," IEEE Trans. Med. Imag., vol. 38, no. 2, pp. 394-405, February 2019; Y. Yang, J. Sun, H. Li, and Z.

Xu, "Deep ADMM-Net for compressive sensing MRI," in Proc. of the 30th Intl. Conf. on Neur. Info. Proc. Sys. (NIPS), December 2016, pp. 10-18; K. Hammernik et al., "Learning a variational network for reconstruction of accelerated MRI data," Magn. Reson. Med., vol. 79, no. 6, pp. 3055-3071, 2018; J. Schlemper, C. Qin, J. Duan, R. M. Summers, and K. Hammernik, "Sigma-net: ensembled iterative deep neural networks for accelerated parallel MR image reconstruction," 2020. [Online]. Available: http://arxiv.org/abs/1912.05480].

Compared to the previous joint learning model (PILOT) that used a single end-to-end network [T. Weiss, O. Senouf, S. Vedula, O. Michailovich, M. Zibulevsky, and A. Bronstein, "PILOT: physics-informed learned optimal trajectories for accelerated MRI," 2019. [Online]. Available: http://arxiv.org/abs/1909.05773], an unrolled network can lead to a more accurate reconstruction [H. K. Aggarwal, M. P. Mani, and M. Jacob, "MoDL: model-based deep learning architecture for inverse problems," IEEE Trans. Med. Imag., vol. 38, no. 2, pp. 394-405, February 2019].

A typical cost function for regularized MR image reconstruction has the form:

$$\hat{x} = \underset{x}{\operatorname{argmin}} \|Ax - y\|_2^2 + \mathcal{R}(x) \qquad \text{eq. (4)}$$

The first term ($\|Ax-y\|_2^2$) may be called the data-consistency term (e.g., corresponding in some embodiments to block 222 of FIGS. 2A and 2B) that ensures the reconstructed image is consistent with the acquired k-space data y. (In the training phase, $A(\omega)x+\varepsilon$ is the simulated y.)

The regularization term $\mathcal{R}(\cdot)$ is designed to control aliasing and noise when the data is under-sampled. By introducing an auxiliary variable z, eq. (4) is replaced with the following alternative:

$$\hat{x} = \underset{x}{\operatorname{argmin}} \underset{z}{\min} \|Ax - y\|_2^2 + \mathcal{R}(z) + \mu\|x - z\|_2^2, \qquad \text{eq. (5)}$$

where $\mu > 0$ is a penalty parameter. Using an alternating minimization approach, the optimization updates become:

$$x_{i+1} = \underset{x}{\operatorname{argmin}} \|Ax - y\|_2^2 + \mu\|x - z_i\|_2^2, \qquad \text{eq. (6)}$$

$$z_{i+1} = \underset{z}{\operatorname{argmin}} \mathcal{R}(z) + \mu\|x_{i+1} - z\|_2^2. \qquad \text{eq. (7)}$$

The analytical solution for the x update is $$x_{i+1} = (A'A + \mu I)^{-1}(A'y + \mu z_i),$$

But the direct inverse is useful only for single-coil Cartesian sampling. Instead, some embodiments use a few iterations of the conjugate gradient (CG) method for the x update, often applying the Toeplitz embedding technique to accelerate computation of A'A [J. A. Fessler, S. Lee, V. T. Olafsson, H. R. Shi, and D. C. Noll, "Toeplitz-based iterative image reconstruction for MRI with correction for magnetic field inhomogeneity," IEEE Trans. Sig. Proc., vol. 53, no. 9, pp. 3393-3402, September 2005].

For a mathematically defined regularizer (e.g., when the image reconstructor 220 is a regularizer), the z update would be a proximal operator.

Some embodiments in some aspects follow previous work [K. Gregor and Y. LeCun, "Learning fast approximations of sparse coding," in Proc. of the 27th Intl. Conf. on Mach. Learn. (ICML), June 2010, pp. 399-406.] and use a CNN-based denoiser $z_{i+1} = \mathcal{D}_\theta(x_{i+1})$. To minimize memory usage and avoid over-fitting, some embodiments use the same $\theta$ across iterations, though iteration-specific networks may improve the reconstruction result [J. Schlemper, C. Qin, J. Duan, R. M. Summers, and K. Hammernik, "Sigma-net: ensembled iterative deep neural networks for accelerated parallel MR image reconstruction," 2020. [Online]. Available: http://arxiv.org/abs/1912.05480].

For when the image reconstructor 220 is a CNN-based denoiser, some embodiments use the Deep Iterative Down-Up CNN (DIDN) [S. Yu, B. Park, and J. Jeong, "Deep iterative down-up CNN for image denoising," in Proc. of the IEEE Conf. on Comput. Vis. and Patt. Recog. Work. (CVPRW), 2019, pp. 0-0]. As a state-of-art model for image denoising, the DIDN model uses less memory than popular models like U-net [O. Ronneberger, P. Fischer, and T. Brox, "U-Net: convolutional networks for biomedical image segmentation," in Med. Imag. Comput. and Comput.-Assist. Interv. (MICCAI), 2015, pp. 234-241] with improved reconstruction results. The DIDN model used along with the embodiments described herein also leads to faster convergence of training than previous denoising networks.

Since neural networks are sensitive to the scale of the input, a good and consistent initial estimate of x is important. Some embodiments use the following quadratic roughness penalty approach (e.g., at 218 of FIG. 2A) to compute an initial image estimate:

$$\begin{aligned} x_0 &= \underset{x}{\operatorname{argmin}} \|Ax - y\|_2^2 + \lambda\|Rx\|_2^2, \\ &= (A'A + \lambda R'R)^{-1}A'y, \end{aligned} \qquad \text{eq. (8)}$$

where R denotes the $N_d$-dimensional first-order finite difference (roughness) operator. Some embodiments also use the CG method to (approximately) solve this quadratic minimization problem.

D. Correction of Eddy-Current Effect

Rapidly changing gradient waveforms may suffer from eddy-current effects, even with shielded coils. This hardware imperfection requires additional measurements and corrections so that the actual sampling trajectory is used for reconstructing real MRI data. Some previous works used a field probe and corresponding gradient impulse-response (GIRF) model [S. J. Vannesjo et al., "Gradient system characterization by impulse response measurements with a dynamic field camera," Magn. Reson. Med., vol. 69, no. 2, pp. 583-593, 2013].

Some embodiments use the 'k-space mapping' method [R. K. Robison, Z. Li, D. Wang, M. B. Ooi, and J. G. Pipe, "Correction of BO eddy current effects in spiral MRI," Magn. Reson. Med., vol. 81, no. 4, pp. 2501-2513, 2019.], [J. H. Duyn, Y. Yang, J. A. Frank, and J. W. van der Veen, "Simple correction method for k-space trajectory deviations in MRI," J. Magn. Reson., vol. 132, pp. 150-153, May 1998.] that does not require additional hardware. Rather than mapping the $k_x$ and $k_y$ separately as in previous works, some embodiments excite a pencil-beam region using one 90° flip and a subsequent 180° spin-echo pulse [J.-F. Nielsen and D. C. Noll, "TOPPE: a framework for rapid prototyping of MR pulse sequences," Magn. Reson. Med., vol. 79, no. 6, pp. 3128-3134,2018]. Some embodiments average multiple repetitions to estimate the actual acquisition trajectory. Some embodiments also subtracted a zero-order eddy current phase term from the acquired data [R. K. Robison, Z. Li, D.

Wang, M. B. Ooi, and J. G. Pipe, "Correction of B0 eddy current effects in spiral MRI," Magn. Reson. Med., vol. 81, no. 4, pp. 2501-2513, 2019].

E. Evaluation to Produce a Reconstructed Image

Once the MRI machine learning algorithm has been trained, it may be used to produce a reconstructed image. In this regard, FIG. 2B shows an example evaluation phase 250 that may produce MRI image 260. As mentioned above, in some embodiments, the evaluation phase 250 may be performed by the one or more processors 135 of FIG. 1.

The evaluation phase 250 may begin by the one or more processors 135 acquiring evaluation MRI data according to the optimized sampling trajectory ω. Put another way, in some embodiments, the transmit coil 122 and receive coil 124 may be controlled to acquire evaluation MRI data along the sampling trajectory ω determined during the training phase 200.

Acquiring the evaluation MRI data along the sampling trajectory ω at 252 produces the raw data at 254. A quadratic roughness penalized least squares reconstruction may be applied at 256. Subsequently, the image reconstructor 220 (e.g., using the reconstruction parameter θ determined in the training phase 200) and the data consistency unit 222 receive the data, and perform N iterations on the data to produce the MRI image 260. It may be noted that in some embodiments, the image reconstructor 220 together with the data consistency unit 222 form an unrolled reconstruction network.

It may be further noted that in some embodiments, a prespecified image reconstructor 220 (e.g., an image reconstructor with prespecified reconstruction parameters) is used rather than an image reconstructor 220 that was trained (e.g., as in a training phase 200).

III. Experiments

A. Comparison with Prior Art

The proposed BJORK approach was compared with the SPARKLING method for trajectory design in all experiments. The initial trajectories were identical for both BJORK and SPARKLING methods. SPARKLING used the default multilevel optimization strategy and parameter settings, as detailed in [C. Lazarus, "Compressed sensing in MRI: optimization-based design of k-space filling curves for accelerated MRI," Ph.D. dissertation, Université Paris Saclay (COmUE), September 2018].

Both BJORK and PILOT [T. Weiss, O. Senouf, S. Vedula, O. Michailovich, M. Zibulevsky, and A. Bronstein, "PILOT: physics-informed learned optimal trajectories for accelerated MRI," 2019. [Online]. Available: http://arxiv.org/abs/1909.05773] are methods for joint sampling design and reconstruction optimization. Three key differences were compared between the three methods individually: (1) the accuracy of the NUFFT Jacobian matrices, as will be further discussed below; (2) the reconstruction method involved—the proposed BJORK approach uses an unrolled neural network, while PILOT uses a single end-to-end reconstruction neural network in the image domain; and (3) the effect of trajectory parameterization; it may be noted that a version of PILOT also uses trajectory parameterization and multi-level optimization, focusing on long readout cases.

B. Image Quality Evaluation

To evaluate the reconstruction quality provided by different trajectories, two types of reconstruction methods were used in the test phase: unrolled neural network (UNN) (with learned θ) and compressed sensing (sparsity regularization for an orthogonal wavelet transform). For SPARKLING and standard undersampled trajectories, the unrolled neural network's θ for reconstruction were trained with the same hyper-parameters as the proposed approach. The difference is that BJORK learns a trajectory simultaneously whereas SPARKLING uses a trajectory based on a specified sampling density. Some embodiments described herein also used compressed sensing-based reconstruction to test the generalizability of different kinds of trajectories. The penalty function is the $\ell_1$ norm of the orthogonal wavelet transform with a Daubechies 4 wavelet. The ratio between the penalty term and the data-fidelity term is 1 e-7. Some implementations used the SigPy package [https://github.com/mikgroup/sigpy] and its default primal-dual hybrid gradient (PDHG) algorithm. This study used two evaluation metrics: the structural similarity metric (SSIM) and peak signal-to-noise ratio (PSNR) [A. Horé and D. Ziou, "Image quality metrics: PSNR vs. SSIM," in Intl. Conf. on Patn. Recog. (ICPR), August 2010, pp. 2366-2369].

C. Trajectories

To demonstrate the proposed model's adaptability, two types of trajectory initializations were investigated: an undersampled in-out radial trajectory with a shorter readout time (≈2:5 ms) and an undersampled spiral trajectory with a longer readout time (≈16 ms). For the radial initialization, the number of spokes is 16, and each spoke has 640 points of acquisition. The rotation angle is equidistant between $-\pi/2$ and $\pi/2$. For the spiral initialization, the number of shots is 8, and each leaf has around 4000 points.

The variable-density spiral design package [https://mrsrl.stanford.edu/~brian/vdspiral] was used from [J. H. Lee, B. A. Hargreaves, B. S. Hu, and D. G. Nishimura, "Fast 3D imaging using variable-density spiral trajectories with applications to limb perfusion," Magn. Reson. Med., vol. 50, no. 6, pp. 1276-1285, 2003].

For both simulation and real acquisition, the dwell time for both waveforms and data sampling is set to 4 μsec, with a field-of-view (FOV) of 22 cm. The maximum gradient strength is 5 Gauss/cm, and the maximum slew rate is 15 Gauss/cm/ms.

D. Network Training and Hyper-Parameter Setting

The simulation experiments used the NYU fastMRI brain dataset to train the trajectories and neural networks [J. Zbontar et al., "fastMRI: An open dataset and benchmarks for accelerated MRI," 2018. [Online]. Available: http://arxiv.org/abs/1811.08839]. The dataset comprises multiple contrasts, including T1w, T2w, and FLAIR. FastMRI's knee subset was also used in a separate training run to investigate the influence of training data on learned sampling patterns. The central 320×320 region was cropped to exclude the noise in the air background. Sensitivity maps were estimated using the ESPIRiT method [M. Uecker et al., "ESPIRiT—an eigenvalue approach to autocalibrating parallel MRI: where SENSE meets GRAPPA," Mag. Reson. Med., vol. 71, no. 3, pp. 990-1001, March 2014] with the central 24 phase-encoding lines, and the corresponding conjugate phase reconstruction was regarded as the ground truth x.

The batch size was 4. The number of blocks, or the number of outer iterations for the unrolled neural network was 6. The weight μ in eq. (5) could also be learned, but this operation will double the computation load with minor improvement. In the current setting, μ was set to 2. The number of training epochs was set to 10 for each level of B-spline kernel length. Four levels of optimization were used, and the total number of epochs was 40. For training the network with existing trajectories (radial, spiral, and SPARKLING), 40 training epochs were also used. The Adam optimizer [D. P. Kingma and J. Ba, "Adam: a method for stochastic optimization," 2017. (Online). Available: http:// arxiv.org/abs/1412.6980] with decay rate β=[0.5; 0.999] was used for both trajectories ω and reconstruction parameters θ. The learning rate linearly decayed from 1e-3 to 0 for the trajectory update, and from 1e-5 to 0 for the network update. No obvious over-fitting phenomena was observed on the validation set.

E. Phantom and In-Vivo Experiments

TABLE 1

| Protocols for data Acquisition | | | | | | | | | |
|---|---|---|---|---|---|---|---|---|---|
| Name | FOV(cm) | dz(mm) | Gap(mm) | TR(ms) | TE(ms) | FA | Acqs | dt(us) | Time |
| Protocols for the phantom experiment: | | | | | | | | | |
| Radial-like | 22*22*5 | 2 | 0.5 | 13.8 | 2.24 | 15° | 16 * 640 | 4 | 0:05 |
| Radial-full | 22*22*5 | 2 | 0.5 | 13.8 | 2.24 | 15° | 320 * 640 | 4 | 1:30 |
| Protocols for the in-vivo experiment: | | | | | | | | | |
| Radial-like | 22*22*4 | 2 | 0.5 | 318.4 | 3.56 | 90° | 16 * 1280 | 4 | 0:05 |
| Radial-full | 22*22*4 | 2 | 0.5 | 318.4 | 3.56 | 90° | 320 * 1280 | 4 | 1:40 | dz: slice thickness;
Gap: gap between slices;
Acqs: number of shots * readout points;
FA: flip angle Table 1 details the scanning protocols of the RF-spoiled, gradient echo (GRE) sequences used. For in-vivo acquisitions, a fat-saturation pulse was applied before the tip-down RF pulse. For radial-like sequences, a GRE sequence was tested with 3 different readout trajectories: standard (golden-angle) undersampled radial, BJORK initialized with undersampled radial, and SPARKLING initialized with undersampled radial. In table 1, radial-full means the fully sampled radial trajectory. An additional dual-echo Cartesian GRE image was also acquired for generating the sensitive map and (potentially) B0 map. The sensitivity maps were generated by ESPIRiT [M. Uecker et al., "ESPIRiT—an eigenvalue approach to autocalibrating parallel MRI: where SENSE meets GRAPPA," Mag. Reson. Med., vol. 71, no. 3, pp. 990-1001, March 2014.] methods. The sequences were programmed with TOPPE [J.-F. Nielsen and D. C. Noll, "TOPPE: a framework for rapid prototyping of MR pulse sequences," Magn. Reson. Med., vol. 79, no. 6, pp. 3128-3134, 2018], and implemented on a GE MR750 3.0 T scanner with a Nova Medical 32 channel Rx head coil. For in-vivo imaging, to increase the SNR of acquired signal, the trajectory had a longer readout (≈5 ms, 1280 sampling points), trained by the procedure described above in the "network training and hyper-parameter setting" section. Subjects gave informed consent under local IRB approval. For phantom experiments, a water phantom with 3 internal cylinders was used.

The k-space mapping was implemented on a water phantom. The thickness of the pencil-beam was 2 mm×2 mm. The trajectory estimates were based on an average of 30 repetitions.

IV. Results

TABLE 2

| | | Standard | SPARKLING | BJORK |
|---|---|---|---|---|
| QUANTITATIVE RESULTS FOR SIMULATION EXPERIMENTS | | | | |
| radial-like | UNN | 0.958 | 0.963 | 0.968 |
| | CS | 0.911 | 0.927 | 0.921 |

TABLE 2-continued

| | | Standard | SPARKLING | BJORK |
|---|---|---|---|---|
| spiral-like | UNN | 0.985 | 0.978 | 0.989 |
| | CS | 0.958 | 0.924 | 0.961 |

TABLE 2-continued

| | | Standard | SPARKLING | BJORK |
|---|---|---|---|---|
| PSNR (in dB): | | | | |
| radial-like | UNN | 35.5 | 36.3 | 37.0 |
| | CS | 33.0 | 34.6 | 33.9 |
| spiral-like | UNN | 43.9 | 38.9 | 44.3 |
| | CS | 38.5 | 34.7 | 40.9 |

1) Quantitative results: The test set includes 950 slices. Table 2 shows the quantitative results (SSIM and PSNR). The proposed method has significant improvement compared with un-optimized trajectories (P<0:005). It also has improved reconstruction quality compared with SPARKLING when considering unrolled neural network-based reconstruction. For CS-based reconstruction of radial-like sequences, the results for the SPARKLING trajectory were slightly better than those from the BJORK-optimized trajectory (that was not tuned for CS-based reconstruction). The reason is that CS-based reconstruction using the BJORK trajectory may have some streak artifacts that can be resolved by the neural network-based reconstruction, but that poses a challenge to CS-based reconstruction. Compared to undersampled radial trajectory or SPARKLING trajectory, the proposed method has a better restoration of details and lower levels of artifacts.

Figure 3A:
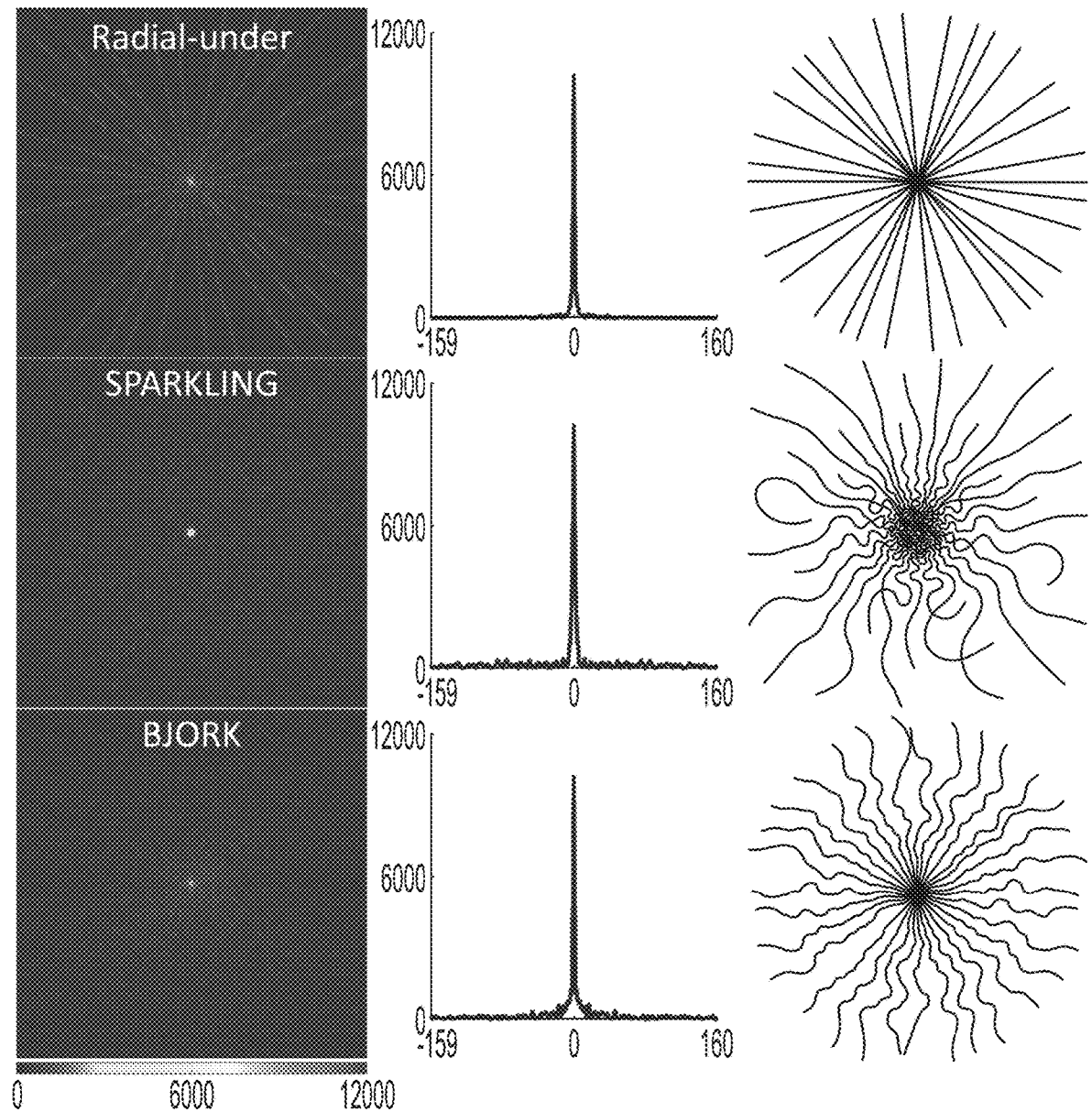
FIG. 3A illustrates example point spread functions (PSFs) of radial-like trajectories.

FIG. 3A illustrates example point spread functions (PSFs) of radial-like trajectories (e.g., PSFs of different sampling patterns). As can be seen, some embodiments of the proposed BJORK PSF have a narrower central-lobe than SPARKLING and much fewer streak artifacts than standard radial. The illustrated plots show the magnitude of the row across the zero point.

Figure 3B:
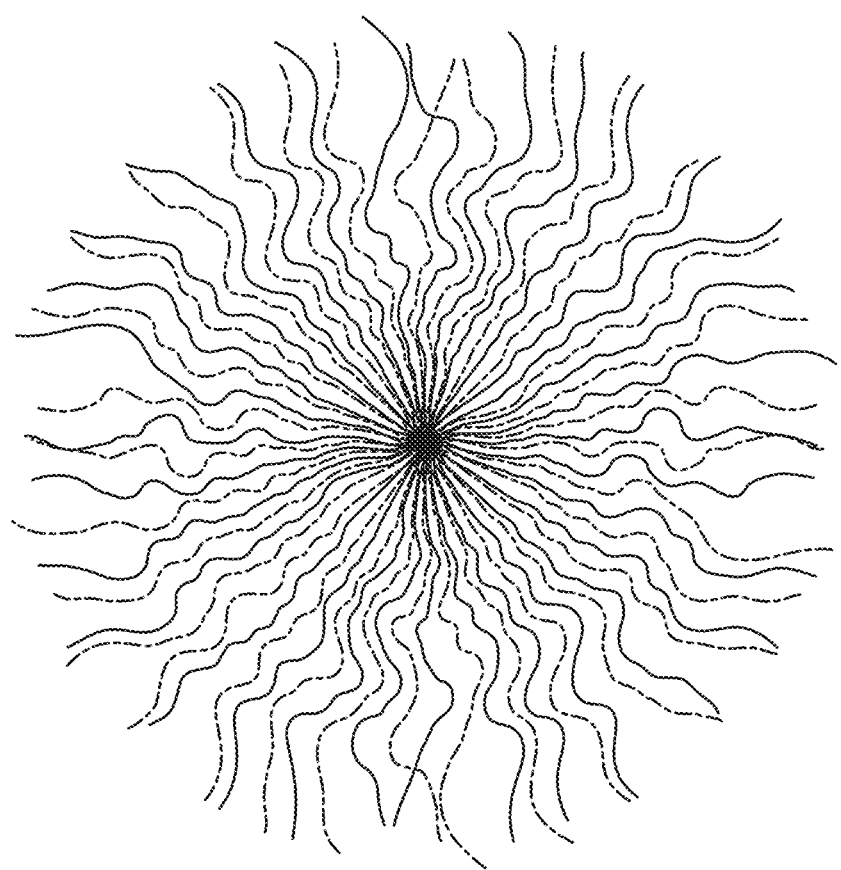
FIG. 3B illustrates an example conjugate symmetry relationship implicitly learned in accordance with the principles disclosed herein.

FIG. 3B illustrates an example conjugate symmetry relationship implicitly learned in the BJORK trajectory. With reference thereto, the dash-dot line shows the 180° rotated BJORK trajectory. The original and rotated trajectory have little overlap, suggesting that the BJORK automatically learned a sampling pattern that exploits k-space symmetry.

Figure 4:
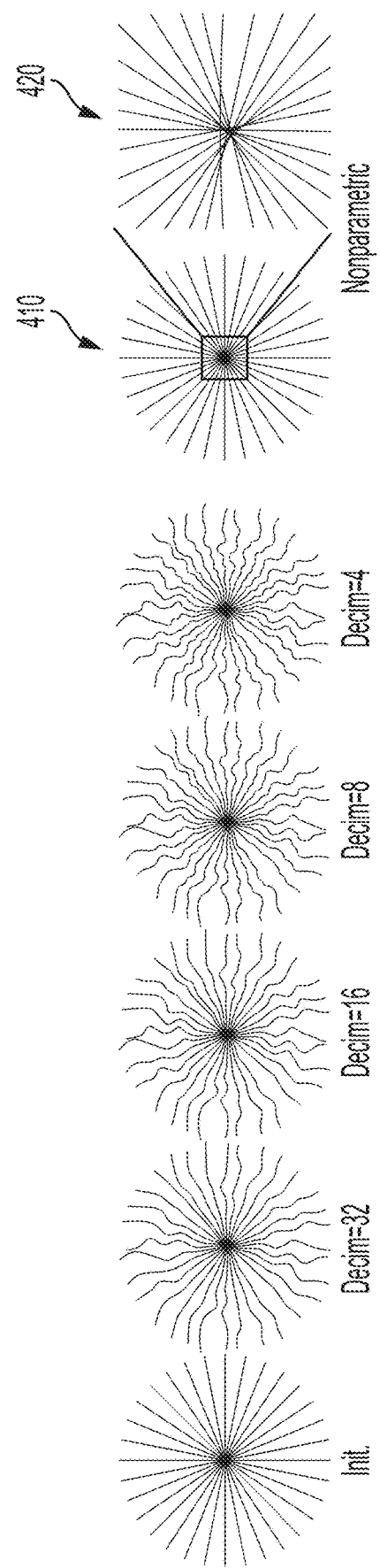
FIG. 4 shows an example evolution of sampling patterns (e.g., trajectories) using the proposed multi-level optimization.

2) Multi-level optimization: FIG. 4 shows an example evolution of sampling patterns (e.g., trajectories) using the proposed multi-level optimization. Different widths of the B-spline kernels introduce different levels of improvement as the acquisition is optimized. Also shown are the results of multi-level optimization and a nonparametric trajectory as used in the first PILOT paper [T. Weiss, O. Senouf, S. Vedula, O. Michailovich, M. Zibulevsky, and A. Bronstein, "PILOT: physics-informed learned optimal trajectories for accelerated MRI," 2019. [Online]. Available: http://arxiv.org/abs/1909.05773; version 1]. Directly optimizing sampling points seems only to introduce a small perturbation to the initialization.

With reference to FIG. 4, it may be noted that Decim means $N_s$=L in eq. (3). Nonparametric means the locations of each sampling points are independent trainable variables, rather than being parameterized by quadratic B-spline kernels. As can be seen, the sampling pattern 420 is a zoomed in set of the sampling pattern 410. The sampling pattern 420 shows the very small perturbations produced by the nonparametric approach.

Figure 5:
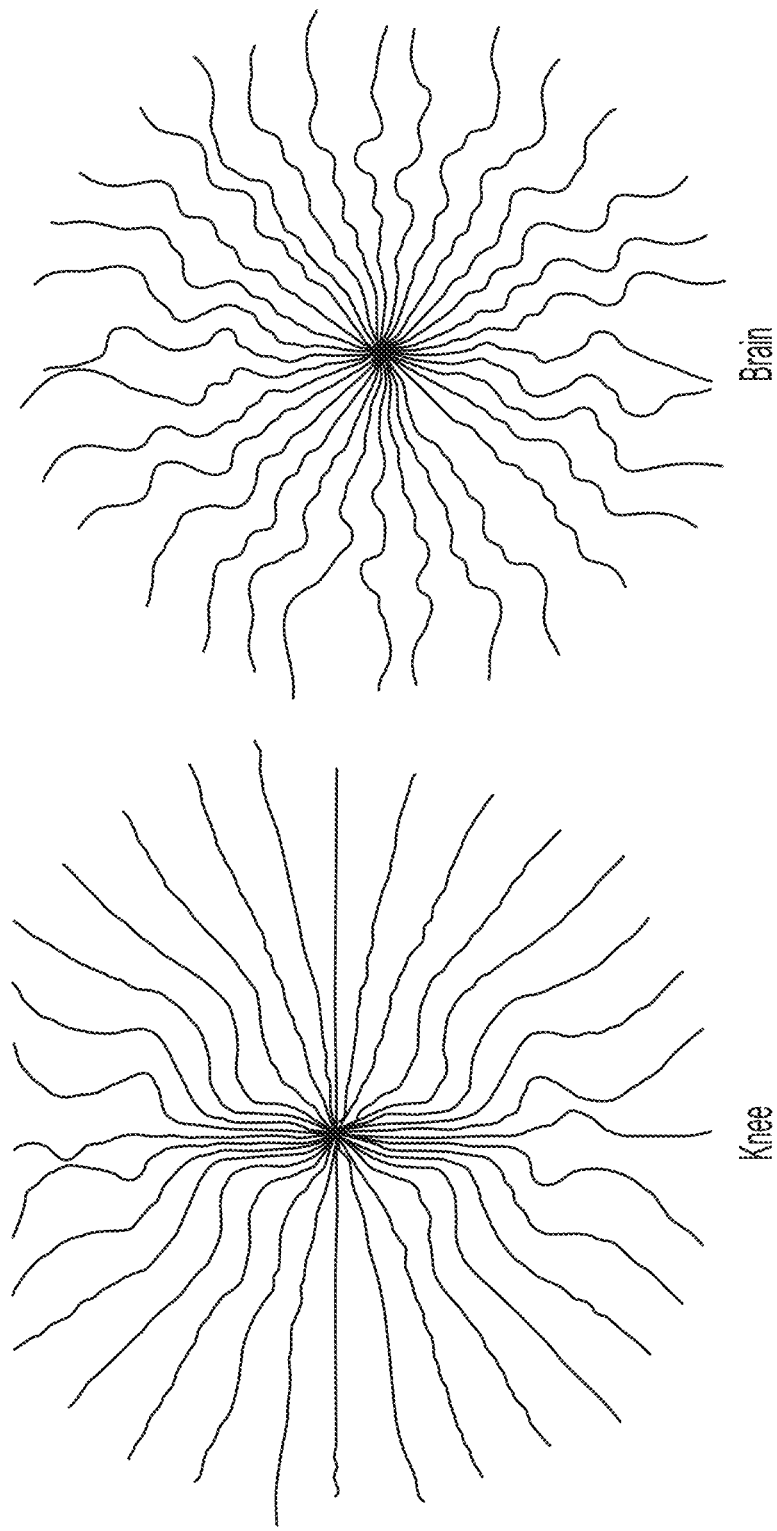
FIG. 5 shows example radial-initialized trajectories trained in accordance with the principles disclosed herein, and with brain and knee datasets.

3) Effect of training set: FIG. 5 shows example radial-initialized trajectories trained by BJORK with brain and knee datasets. Different trajectories are learned from different datasets. The inventors hypothesize that the difference is related to frequency distribution of energy, as well as the noise-level, which requires further study.

4) Effect of reconstruction methods: To test the influence of reconstruction methods on trajectory optimization, a single image-domain refinement network was tried as the reconstruction method in the joint learning model, similar to PILOT's approach. Quadratic roughness penalty reconstruction in (8) still is the network's input. The initialization of the sampling pattern is an undersampled radial trajectory. A proposed reconstruction method (UNN) improves reconstruction quality compared to a single end-to-end model, as shown in Table 3. Such improvements are consistent with other comparisons between UNN methods and image-domain CNN methods using non-learned sampling patterns [H. K. Aggarwal, M. P. Mani, and M. Jacob, "MoDL: model-based deep learning architecture for inverse problems," IEEE Trans. Med. Imag., vol. 38, no. 2, pp. 394-405, February 2019], [Y. Yang, J. Sun, H. Li, and Z. Xu, "Deep ADMM-Net for compressive sensing MRI," in Proc. of the 30th Intl. Conf. on Neur. Info. Proc. Sys. (NIPS), December 2016, pp. 10-18], [K. Hammernik et al., "Learning a variational network for reconstruction of accelerated MRI data," Magn. Reson. Med., vol. 79, no. 6, pp. 3055-3071, 2018].

TABLE 3

EFFECT OF DIFFERENT RECONSTRUCTION NETWORKS INVOLVED IN THE JOINT LEARNING MODEL

|  | SSIM | PSNR(dB) |
| --- | --- | --- |
| UNN | 0.968 | 37.0 |
| Single U-net | 0.933 | 32.7 |

Figure 6:
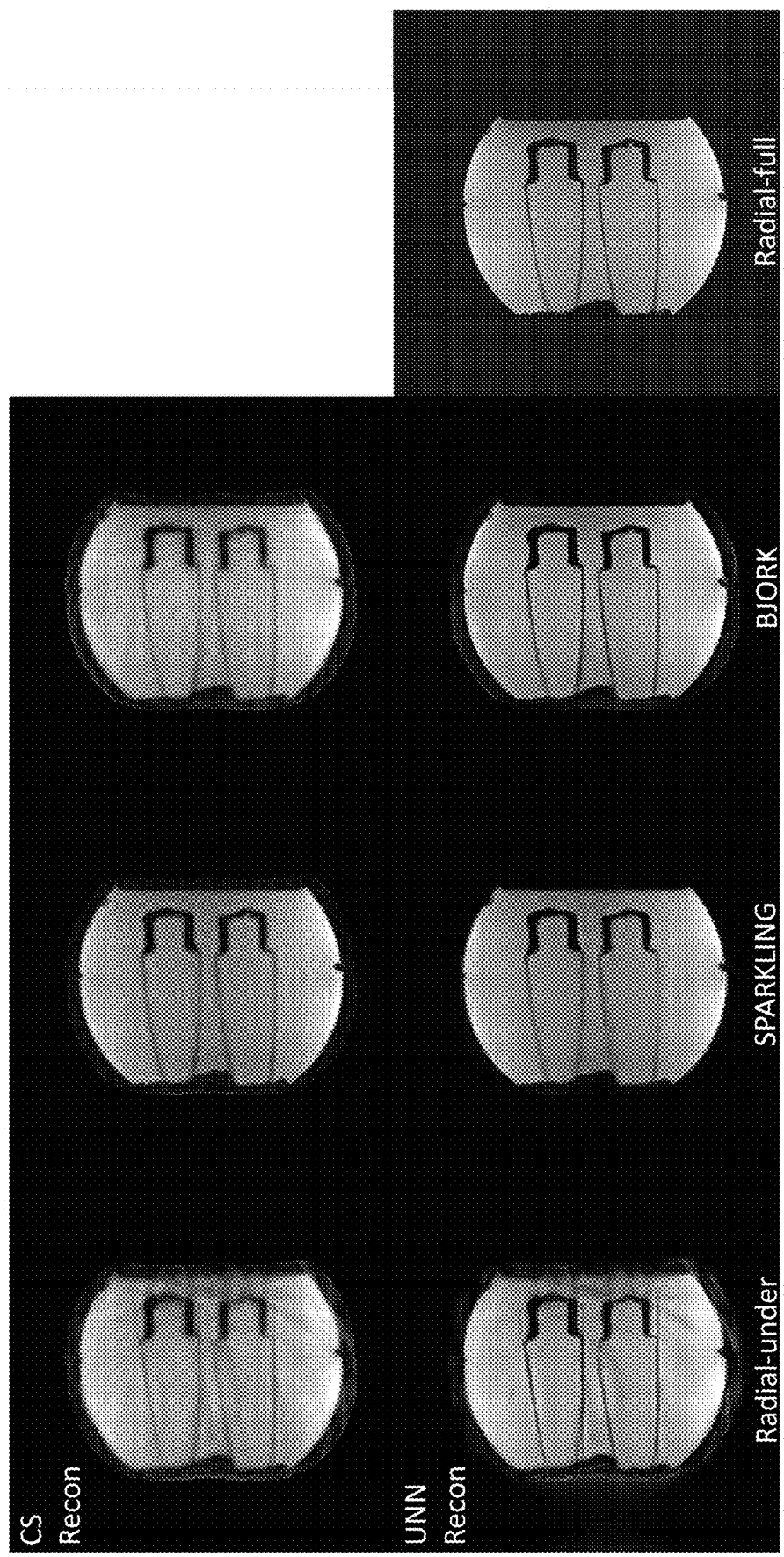
FIG. 6 shows example water (e.g., phantom) results for different reconstruction algorithms.

5) Phantom and in-vivo Experiments: FIG. 6 shows example water (e.g., phantom) results for different reconstruction algorithms. The rightmost column is the fully sampled ground truth (Radialfull). Note that the unrolled neural network (UNN) here was trained with fastMRI brain dataset, and did not receive fine-tuning on the phantom dataset. Advantageously, the BJORK optimized trajectory leads to fewer artifacts and improved contrast for the UNN-based reconstruction.

To further elaborate, the example of FIG. 6 illustrates representative results of the phantom experiment using CS-based and UNN-based reconstruction algorithms. The sequences involved were radial-like GRE (detailed in Table 1). The readout length was 2.56 ms, and the illustrated example experiment used 16/320 spokes for undersampled (Radial-Under, SPARKLING, BJORK) trajectories and the fully sampled radial trajectory.

Figure 7:
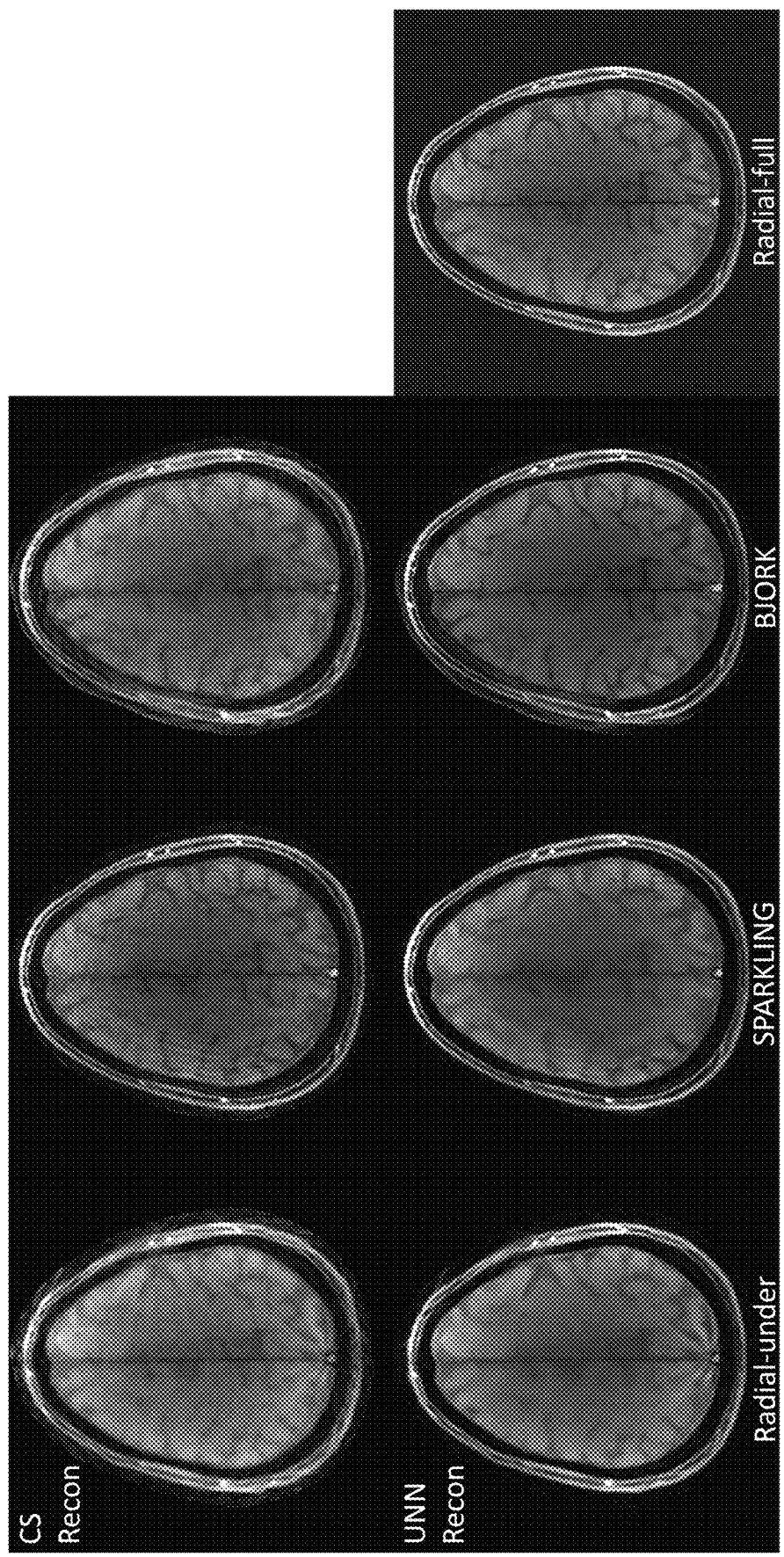
FIG. 7 illustrates results from a prospective in-vivo experiment.

FIG. 7 illustrates results from the discussed in-vivo experiment. For CS-based reconstruction, the undersampled radial trajectory exhibits stronger streak artifacts. The SPARKLING image has higher levels of ringing artifacts. CS reconstruction with the BJORK sampling pattern has less obvious artifacts but the tissue contrast is not as good as SPARKLING. For UNN-based reconstruction, all trajectories' results show reductions of artifacts compared to CS-based reconstruction. The proposed method restores most of the structures and fine details, with minimal remaining artifacts. The contrast between grey and white matter seems suboptimal for all three methods. The reason may be that the acceleration ratio is too high (20×) for recovering high-frequency details. Also, the short acquisition time (≈5 ms) and the GRE signal characteristics limit the SNR of the acquisition.

To further elaborate, in the example of FIG. 7, the trajectories were also radial-like (detailed in Table 1). The readout time was 5.12 ms. The number of shots for undersampled trajectories was 16, and for the fully-sampled radial trajectory was 320 (20× acceleration). The FOV was 22 cm.

V. Discussion

The systems and methods discussed herein propose an efficient learning-based framework for joint design of MRI sampling trajectories and reconstruction parameters. Defining an appropriate objective function for trajectory optimization is an open question. Some embodiments circumvent this long-lasting problem by directly using the reconstruction quality as the training loss function in a supervised manner.

The workflow includes a differentiable reconstruction algorithm for which the learning process obtains an intermediate gradient w.r.t. the reconstruction loss. However, solely depending on stochastic gradient descent cannot guarantee optimal results for this non-convex problem. To improve the training effect, several tricks were adopted, including trajectory parameterization, multi-level training, warm initialization of the reconstruction network, and an accurate approximation of NUFFT's Jacobian. Results show that these approaches can stabilize the training and avoid sub-optimal local minima, or at least provide better local minima than previous methods.

Some embodiments construct an unrolled neural network-based reconstruction for non-Cartesian MRI data. In previous work, a single end-to-end network approach cannot efficiently remove aliasing artifacts. Additionally, the k-space "hard" data-consistency method for data fidelity [M. Mardani et al., "Deep generative adversarial neural networks for compressive sensing MRI," IEEE Trans. Med. Imag., vol. 38, no. 1, pp. 167-179, 2018], [J. Schlemper, J. Caballero, J. V. Hajnal, A. N. Price, and D. Rueckert, "A deep cascade of convolutional neural networks for dynamic MR image reconstruction," IEEE Trans. Med. Imag., vol. 37, no. 2, pp. 491-503, February 2018] is inapplicable for non-Cartesian sampling. An unrolled algorithm can reach a balance between data fidelity and the de-aliasing effect across multiple iterations. For 3D trajectory design using the proposed approach, the unrolled method's memory consumption can be very large. More memory-efficient reconstruction models, such as the memory efficient network [S.

C. van de Leemput, J. Teuwen, B. van Ginneken, and R. Manniesing, "MemCNN: a Python/PyTorch package for creating memory-efficient invertible neural networks," J. Open Source Softw., vol. 4, no. 39, p. 1576, July 2019] can be explored in further study.

For learning-based medical imaging algorithms, one main obstacle towards clinical application is the gap between simulation and the physical world. Some factors include the following.

First, inconsistency exists between the training datasets and real-world acquisition, such as different vendors and protocols, posing a challenge to reconstruction algorithms' robustness and generalizability. The training dataset used in some embodiments included T1w/T2w/FLAIR Fast Spin-Echo (FSE or TSE) sequences, acquired on Siemens 1.5 T/3.0 T scanners. The number of receiver channels includes 4, 8, and 16, etc. The in-vivo/phantom experiment was conducted on a 3.0 T GE scanner equipped with a 32-channel coil. The sequence is a T1w GRE sequence that has lower SNR compared to FSE sequences in the training set. Despite the very large differences with the training set, techniques disclosed herein still demonstrated improved and robust results in the in-vivo and phantom experiment. The inventors hypothesize that several factors could contribute to the results: (1) the reconstruction network uses the quadratic roughness penalized reconstruction as the initialization, normalized by the median value. Previous works typically use the adjoint reconstruction as the input of the network. In comparison, the disclosed regularized initialization helps provide consistency between different protocols, without excessive compromise of the computation time/complexity, (2) the PSF of the learned trajectory has a compact central lobe, without large streak artifacts. Thus, the reconstruction is basically a de-blurring/denoising task that is a local low-level problem, and thus may require less training data than dealiasing problems. For deblurring of natural images, networks are usually adaptive to different noise levels and color spaces, and require small cohorts of data [S. Nah et al., "NTIRE 2020 challenge on image and video deblurring," in Proc. of the IEEE Conf. on Comput. Vis. and Patt. Recog. Work. (CVPRW), 2020, pp. 416-417], [A. Lugmayr et al., "NTIRE 2020 challenge on real-world image superresolution: methods and results," in Proc. of the IEEE Conf. on Comput. Vis. and Patt. Recog. Work. (CVPRW), 2020, pp. 494-495]. In contrast, a CNN applied to an adjoint reconstruction must remove global aliasing artifacts, such as the streak and ringing artifacts for trajectories like radial and SPARKLING. The dynamics behind the neural network's ability to resolve such artifacts is still an unsolved question, and the training may require a large amount of diverse data.

Second, it is not easy to simulate system imperfections like eddy currents and off-resonance in the training phase. These imperfections can greatly affect image quality in practice. Some embodiments used a trajectory measurement method to correct for the eddy-current effect. Some embodiments may incorporate field inhomogeneity into the workflow.

Furthermore, even though the BJORK sampling was optimized for a UNN reconstruction method, the results in FIG. 6 and FIG. 7 suggest that the learned trajectory is also useful with a CS-based reconstruction method or other model-based reconstruction algorithms. This approach can still noticeably improve the image quality by simply replacing the readout waveform in the existing workflow, promoting the applicability of the proposed approach. Some embodiments may apply the general framework to optimize a trajectory for (convex)CS-based reconstruction and compare to the (non-convex) open-loop UNN approach in future work.

Though the proposed trajectory is learned via a data-driven approach, it can also reflect the ideas behind SPARKLING and Poisson disk sampling: sampling patterns having large gaps or tight clusters of points are inefficient, and the sampling points should be somewhat evenly distributed (but not too uniform). Furthermore, some embodiments appear to have learned some latent characteristics, such as the conjugate symmetry for these spin echo training datasets. To combine both methods' strength, a promising future direction is to use SPARKLING as a primed initialization of BJORK.

In some implementations, the network was trained on a large public data set. In the experiment discussed above, knee imaging and brain imaging led to different learned trajectories (e.g., FIG. 5). This demonstrates that the data set can greatly influence the optimization results. Also implemented was a complementary experiment on a smaller training set (results not shown). The inventors found that a small subset (3000 slices) also led to similar learned trajectories. Therefore, for some organs where a sizeable dataset is not publicly available, this approach may still work with small-scale private datasets. To examine the influence of scanner models, field strength, and sequences, following studies should investigate more diversity in datasets.

The eddy-current effect poses a long-term problem for non-Cartesian trajectories and impedes their widespread clinical usage. Some embodiments used a simple k-space mapping technique as the correction method. The downside of this method is its long calibration time, although it can be performed in the scanner's idle time. This method is waveform-specific, which means that correction should be done for different trajectories. Other methods relying on field probes may obtain a more accurate correction with less time. However, this approach demands dedicated hardware. In a future study, the eddy current-related artifacts could be simulated according to the GIRF model in the training phase, so that the trajectory is learned to be robust against the eddy current effect.

Aside from practical challenges with GPU memory, the general approach described here is readily extended from 2D to 3D sampling trajectories. A more challenging future direction is to extend the work to dynamic imaging applications, such as fMRI and cardiac imaging, where both the sampling pattern and the reconstruction method should exploit redundancies in the time dimension, e.g., using low-rank models [M. Jacob, M. P. Mani, and J. C. Ye, "Structured low-rank algorithms: theory, MR applications, and links to machine learning," IEEE Sig. Proc. Mag., vol. 37, no. 1, pp. 54-68, January 2020].

VI. Additional Materials

A. Experiments

Figure 8:
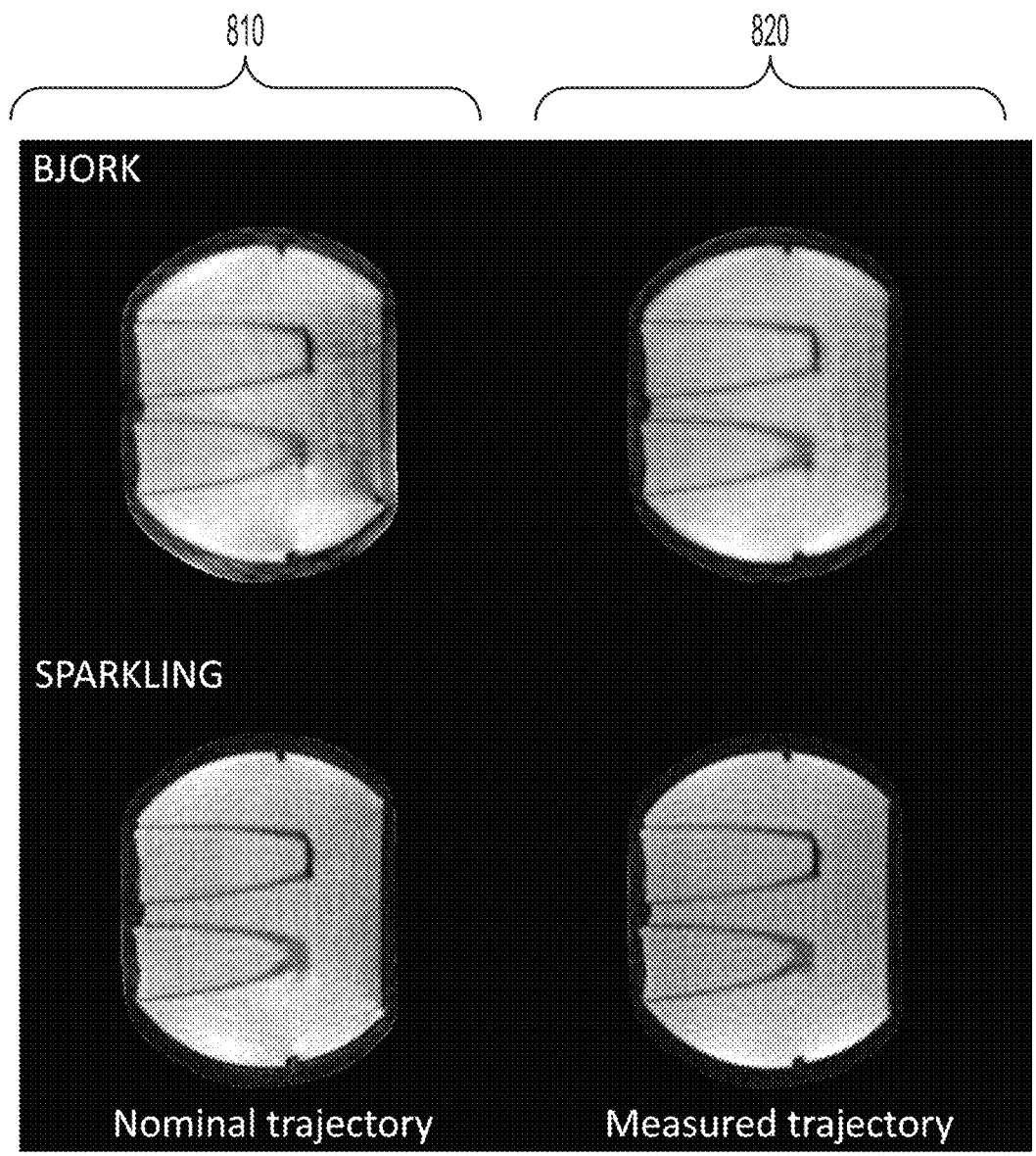
FIG. 8 illustrates an example of compressed sensing-based reconstruction of real acquisitions according to nominal/measured trajectories.
Figure 9A:
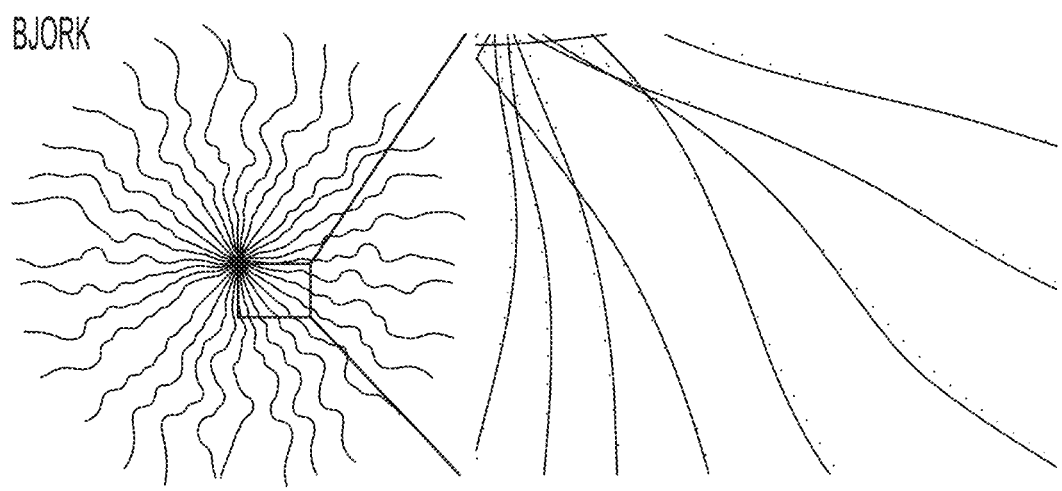
FIGS. 9A and 9B show the measurement results of the trajectories from FIG. 8.
Figure 9B:
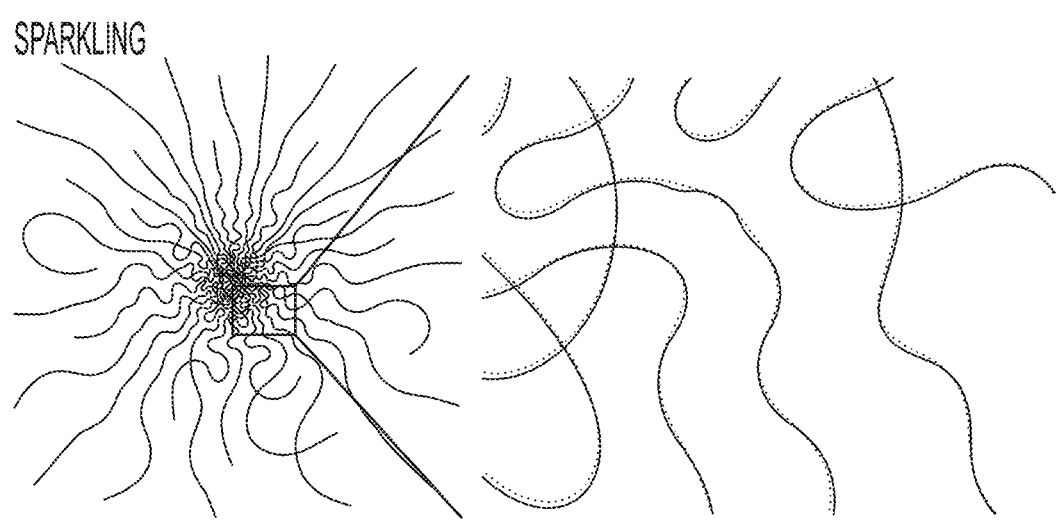

1) Eddy-current effect: FIG. 8 illustrates an example of CS-based reconstruction of real acquisitions according to nominal/measured trajectories. More specifically, FIG. 8 illustrates an example CS-based reconstruction of a water phantom. The left column 810 is the reconstruction with the nominal trajectory, and right column 820 is with the measured trajectory. Reconstruction with the mapped trajectory introduces fewer artifacts FIGS. 9A and 9B show the measurement results of the trajectories from FIG. 8, with FIG. 9A showing the BJORK measurement results, and FIG. 9B showing the SPAR- KLING measurement results. The solid line is the nominal trajectory, and the dotted line is the measurement. As can be seen, using the measurement of the actual trajectory seems to mitigate the influence of eddy current effects in the reconstruction results.

Figure 10:
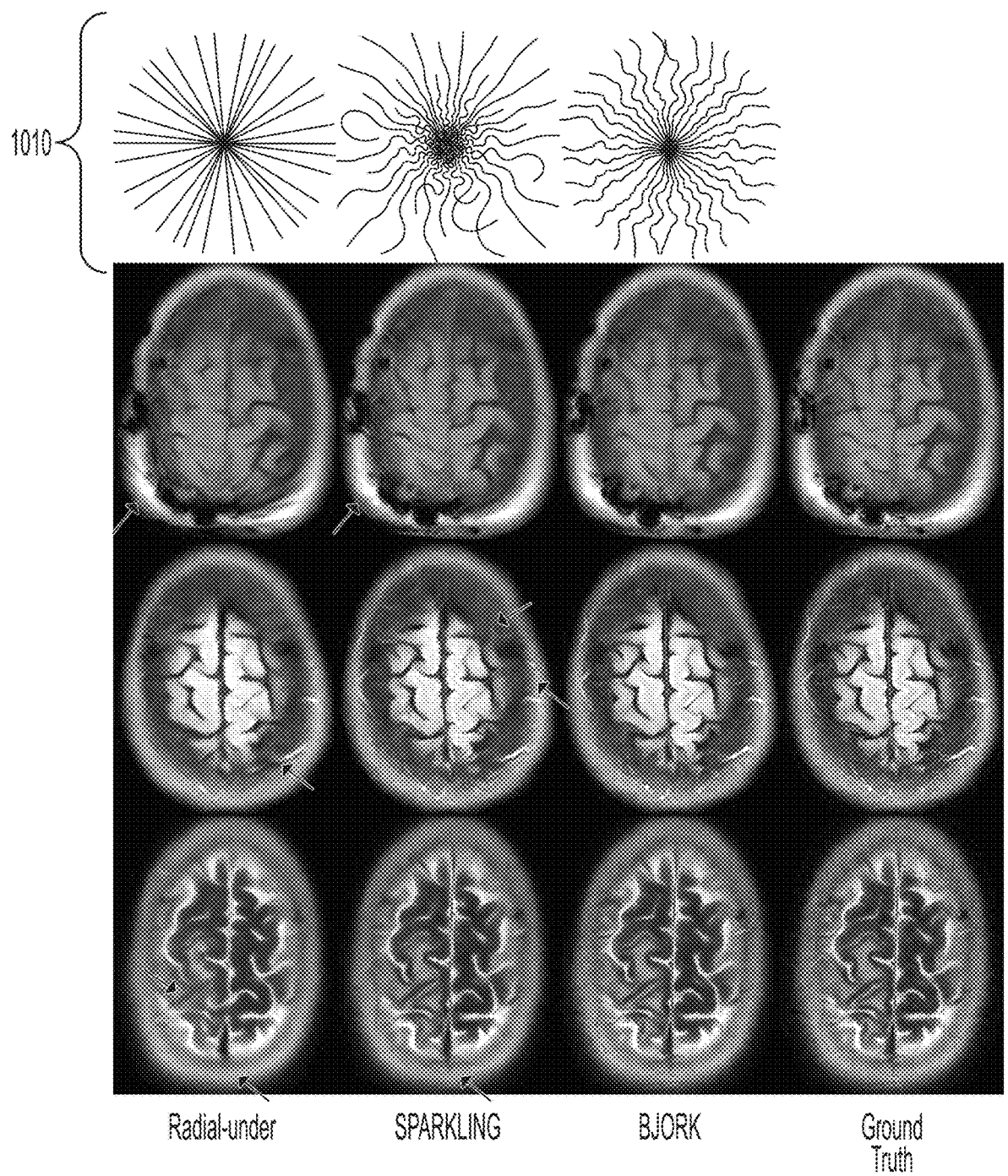
FIG. 10 shows examples of the machine learning-based reconstruction for different trajectories in a simulation experiment.

2) Simulation Experiments: FIG. 10 shows examples of the UNN-based reconstruction for different trajectories in the simulation experiment, with the first row 1010 showing the trajectories. Compared with undersampled radial trajectory or SPARKLING trajectory, the proposed BJORK trajectory leads to a lower level of artifacts and better restoration of fine structures.

B. Efficient Backpropagation of NUFFT Operators

The following describes an efficient approximation for the Jacobian of the NUFFT operation used in the MRI system model for non-Cartesian sampling. This approximation facilitates fast and accurate backpropagation methods for learning non-Cartesian k-space trajectories.

Consider the (single-coil) MRI measurement model [J. A. Fessler, "Model-based image reconstruction for MRI," IEEE Sig. Proc. Mag., vol. 27, no. 4, pp. 81-89, 2010]

$$y = Ax + \varepsilon$$

$y \in \mathbb{C}^M$, $x \in \mathbb{C}^N$, $A \in \mathbb{C}^{M \times N}$ where $\lambda = A(\omega)$ has elements $$a_{ij} = e^{-i\vec{\omega}_i \cdot \vec{r}_j}$$

for $\vec{\omega}_i \in \mathbb{R}^D$ and $\vec{r}_j \in \mathbb{R}^D$ where $D \in \{1,2,3\}$ denotes the image dimension, and where $$\omega = [\omega^{[1]} \omega^{[2]} \ldots \omega^{[D]}]$$

is the M×d vector representation of all the k-space sampling locations and $w^{[d]} \in \mathbb{R}^M$ denotes its dth column. N denotes the number of voxels, and M stands for the number of samples (in k-space). Typically A is approximated by a NUFFT operator [J. A. Fessler and B. P. Sutton, "Nonuniform fast Fourier transforms using min-max interpolation," IEEE Trans. Sig. Proc., vol. 51, no. 2, pp. 560-74, February 2003].

For simplicity, consider the training loss of trajectory optimization for a single image (or a mini-batch):

$$L(\omega) = \|f\theta, \omega(\omega; A(\omega)x + \varepsilon) - x\|,$$

where $x \in \mathbb{C}^N$. Note that $L: \mathbb{R}^M \mapsto \mathbb{R}$ so $\nabla L \in \mathbb{R}^M$.

The update of ω w.r.t. L(ω) involves the gradients w.r.t. NUFFT operators A(ω) and its adjoint. Previous work [T. Weiss, O. Senouf, S. Vedula, O. Michailovich, M. Zibulevsky, and A. Bronstein, "PILOT: physics-informed learned optimal trajectories for accelerated MRI," 2019. [Online]. Available: http://arxiv.org/abs/1909.05773] propagate the gradient calculations through all of the NUFFT steps using the chain rule, which is potentially slow, and could introduce error because of the interpolation operators. The techniques disclosed herein investigate a different approach where that analyzes the gradient using the exact (slow) Fourier transform expression and then implements that expression using (fast) NUFFT approximations. This approach leads to inexact gradient computations; but gradients are often inexact in machine learning problems, due to operations, such as mini-batches.

1) Forward operator: For x:

$$\frac{\partial Ax}{\partial x} = A$$

For the dth column of ω:

$$\left[\frac{\partial Ax}{\partial \omega^{[d]}}\right]_{il} = \frac{\partial [Ax]_i}{\partial \omega_l^{[d]}}$$

$$= \frac{\partial}{\partial \omega_l^{[d]}} \sum_{j=1}^N e^{-i\vec{\omega}_i \cdot \vec{r}_j} x_j$$

$$= \begin{cases} -i \sum_{j=1}^N e^{-i\vec{\omega}_i \cdot \vec{r}_j} x_j r_j^{[d]}, & i = l \\ 0 & \text{otherwise,} \end{cases}$$

for i, l=1, . . . , M. By denoting the point-wise vector product as ⊙, the above summation equals the product of the ith row of A with $x \odot r^{[d]}$. Thus, the M×M Jacobian matrix for the partial derivatives of Ax w.r.t. $\omega^{[d]}$ is:

$$\frac{\partial Ax}{\partial \omega^{[d]}} = -i \operatorname{diag}\{A(x \odot r^{[d]})\} \qquad \text{eq. (S1)}$$

Thus, to apply this Jacobian to a (gradient) vector $v \in \mathbb{C}^M$, as needed in a back-propagation step, some implementations simply compute $$-i(A(x \odot r^{[d]})) \odot v,$$

by applying a NUFFT operation A to $x \odot r^{[d]}$.

2) Adjoint operator: For y:

$$\frac{\partial A'y}{\partial y} = A'$$

For the dth column of ω, the N×M Jacobian matrix has elements:

$$\left[\frac{\partial A'y}{\partial \omega^{[d]}}\right]_{jl} = \frac{\partial [A'y]_j}{\partial \omega_l^{[d]}}$$

$$= \frac{\partial \sum_{i=1}^M e^{i\vec{\omega}_i \cdot \vec{r}_j} y_i}{\partial \omega_l^{[d]}}$$

$$= i e^{i\vec{\omega}_l \cdot \vec{r}_j} y_l r_j^{[d]}$$

Thus, the Jacobian matrix is $$\frac{\partial A'y}{\partial \omega^{[d]}} = i \operatorname{diag}\{r^{[d]}\} A' \operatorname{diag}\{y\} \qquad \text{eq. (S.2)}$$

Applying this Jacobian to a vector $v \in \mathbb{C}^M$, involves an adjoint NUFFT A' of $y \odot v$.

3) Frame operator (Gram matrix): For x:

$$\frac{\partial A'Ax}{\partial x} = A'A$$

For the dth column of ω, the elements of the N×M Jacobian matrix are $$\frac{\partial A'Ax}{\partial \omega^{[d]}_{kl}} = \frac{\partial [A'Ax]_k}{\partial \omega^{[d]}_l}$$

$$= \frac{\partial \sum_{i=1}^{M}\sum_{j=1}^{N} e^{-i\vec{\omega}_i \cdot (\vec{r}_j - \vec{r}_k)} x_j}{\partial \omega^{[d]}_l}$$

$$= -i\sum_{j=1}^{N} e^{-i\vec{\omega}_l \cdot (\vec{r}_j - \vec{r}_k)} x_j \left(r_j^{[d]} - r_k^{[d]}\right)$$

$$= -ie^{i\vec{\omega}_l \cdot \vec{r}_k} \sum_{j=1}^{N} e^{-i\vec{\omega}_l \cdot \vec{r}_j} x_j r_j^{[d]} + ie^{i\vec{\omega}_l \cdot \vec{r}_k} r_k^{[d]} \sum_{j=1}^{N} e^{-i\vec{\omega}_l \cdot \vec{r}_j} x_j$$

Thus, the Jacobian matrix is:

$$\frac{\partial A'Ax}{\partial \omega^{[d]}} = -iA'\mathrm{diag}\{A(x \odot r^{[d]})\} + i\mathrm{diag}\{r^{[d]}\}A'\mathrm{diag}\{Ax\} \qquad \text{eq. (S.3)}$$

Again, this Jacobian is applied to a vector by combining NUFFT operations with Hadamard products.

TABLE 4

| | Computation Time | |
|---|---|---|
| | Auto-diff | Approx. |
| Large image - GPU | 1.31 s | 0.91 s |
| Small image - GPU | 1.29 s | 0.90 s |
| Large image - CPU | 4.32 s | 0.74 s |
| Small image - CPU | 0.71 s | 0.36 s |

Large size: 320*320; small size: 40*40

4) Validation: For validation, a simple test case was examined with different calculation methods. And the following was computed.

$$\frac{\partial \|A'Ax\|_2^2}{\partial \omega^{[d]}} \text{ and } \frac{\partial \|A'Ax\|_2^2}{\partial x}$$

where x is a cropped Shepp-Logan phantom with random additional phase in [−π,π]. The sampling pattern is under-sampled radial spokes. The x and ω displayed are one fragment of the whole vector. Three settings are compared: (1) auto-differentiation of NUFFT; the table finding operation [B. Dale, M. Wendt, and J. L. Duerk, "A rapid look-up table method for reconstructing MR images from arbitrary k-space trajectories," IEEE Trans. Med. Imag., vol. 20, no. 3, pp. 207-217, 2001] is replaced by bi-linear interpolation to enable auto-differentiation, (2) auto-differentiation of exact non-uniform discrete Fourier transform (NDFT), (3) our approximation. It is worth noting that there is no 'ground truth' here. Errors occur in the interpolation of (1). (2) is the accurate gradient of NDFT because the gradient calculation only involves one exponential and one sum operation, with no accumulation error. Since NUFFT is only an approximation of NDFT, the NDFT's Jacobian cannot be directly regarded as the NUFFT's Jacobian. If the NUFFT operation is accurate enough, though, (2) can be a good approximation of NUFFT's Jacobian matrix. As a validation method, some embodiments also compared the trajectory optimization result by (1) and (3) (approach (2) is too time-consuming for this task). The implementation of (1) and (3) were based on [M. J. Muckley, R. Stern, T. Murrell, and F. Knoll, "TorchKbNufft: A high-level, hardware-agnostic non-uniform fast fourier transform," in ISMRM Workshop on Data Sampling & Image Reconstruction, 2020]. Some embodiments disclosed herein jointly train the reconstruction network and the trajectory as described above, but do not parameterize the trajectory.

Figure 11:
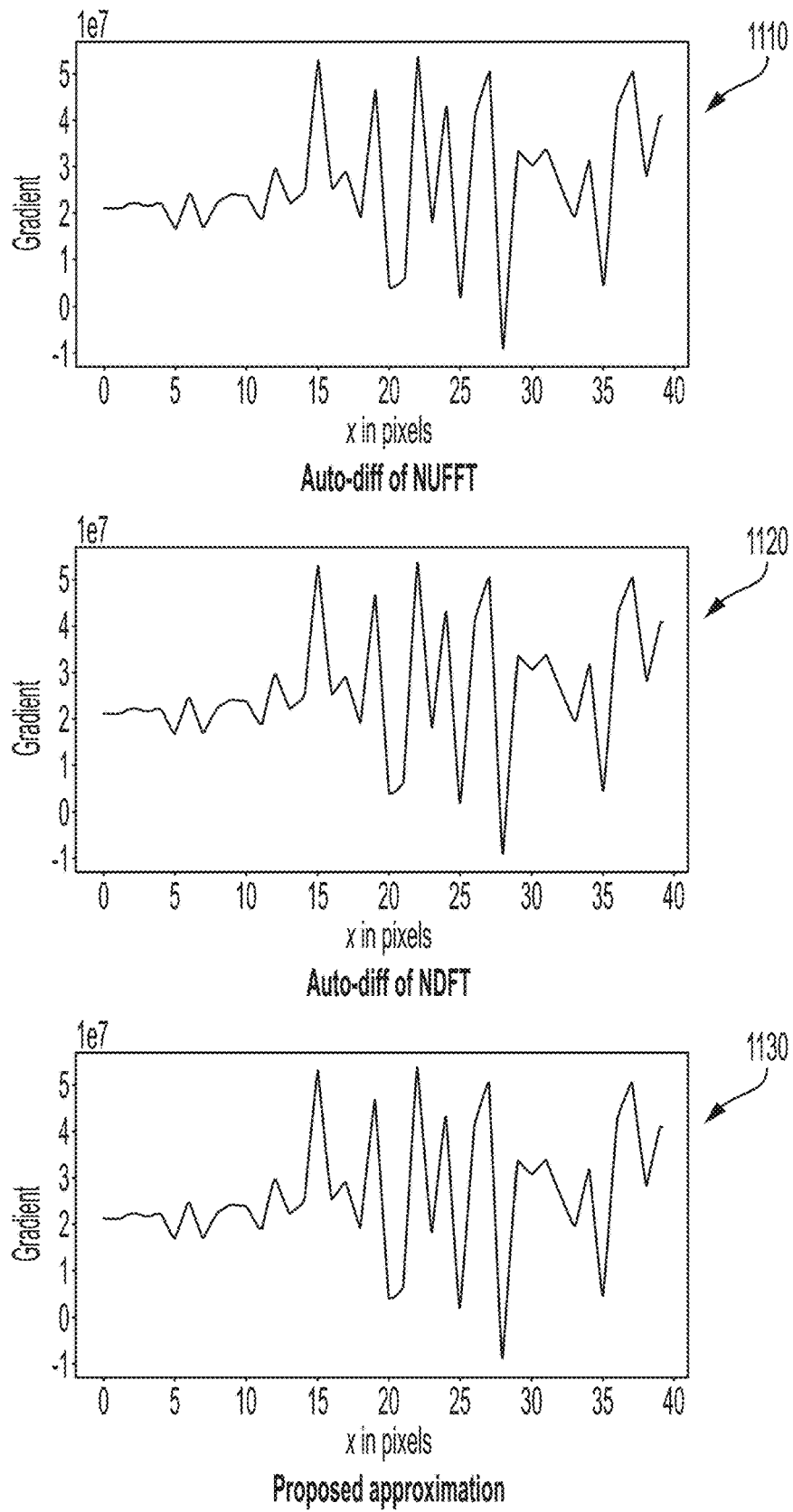
FIG. 11 shows example gradients w.r.t. image x calculated by different methods.

FIG. 11 shows example gradients w.r.t. image x calculated by different methods. In particular, graph 1110 shows an auto-diff of NUFFT method; graph 1120 shows an auto-diff of NDFT method; and 1130 shows an example method in accordance with the techniques disclosed herein. As can be seen from the illustrated examples, the three methods lead to similar results.

Figure 12:
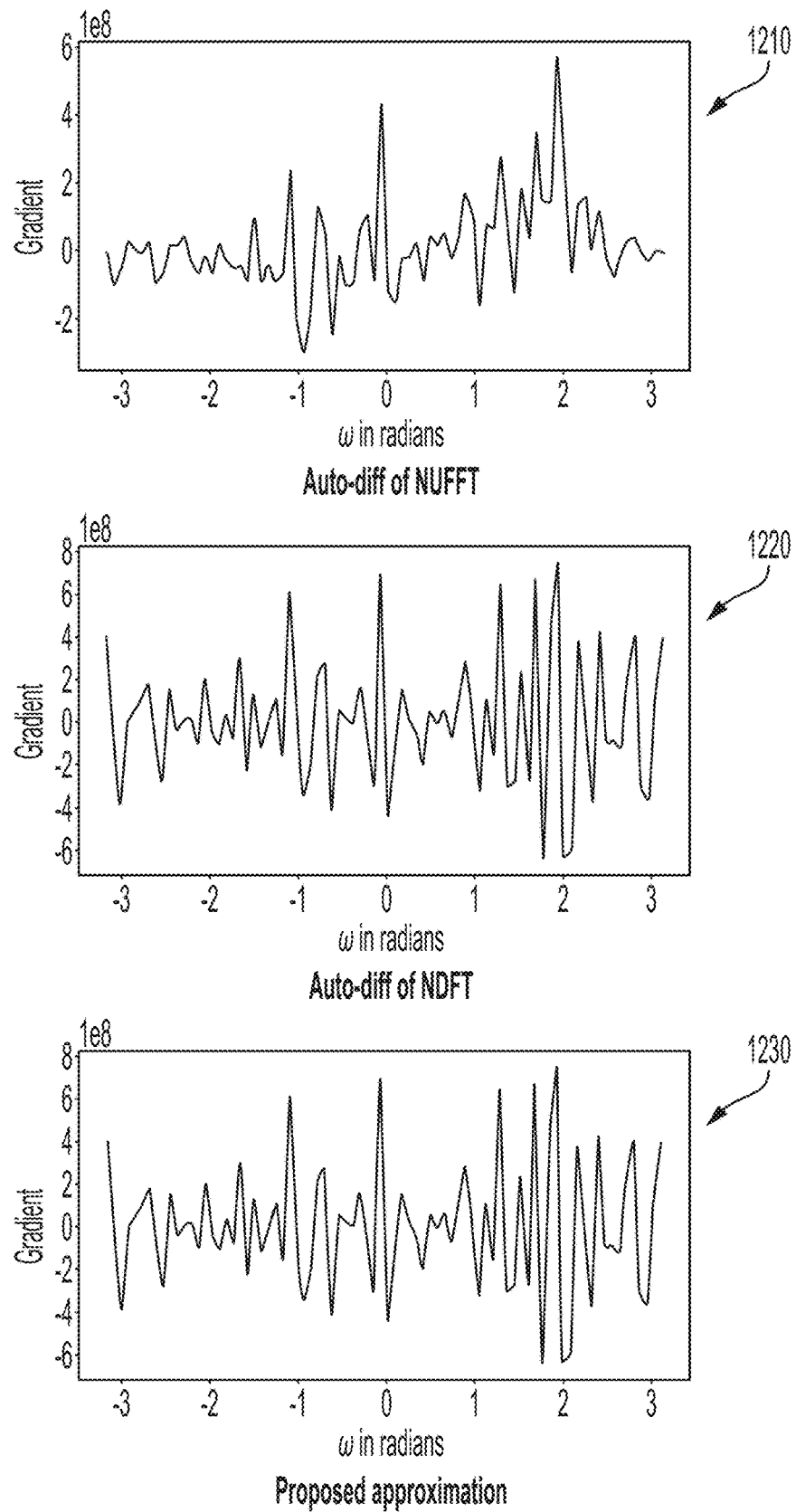
FIG. 12 shows example gradients w.r.t. trajectory ω calculated by different methods.

FIG. 12 shows example gradients w.r.t. trajectory ω calculated by different methods. In particular, graph 1210 shows an auto-diff of NUFFT method; graph 1220 shows an auto-diff of NDFT method; and 1230 shows an example method in accordance with the techniques disclosed herein. For gradient concerning the trajectory ω, the auto-differentiation has larger deviance from the results of exact NDFT. The proposed approximation better matches the gradient of the NDFT.

If random phase is not added to the complex-valued image x, the three methods still have similar results. So here displayed is an extreme case.

Figure 13:
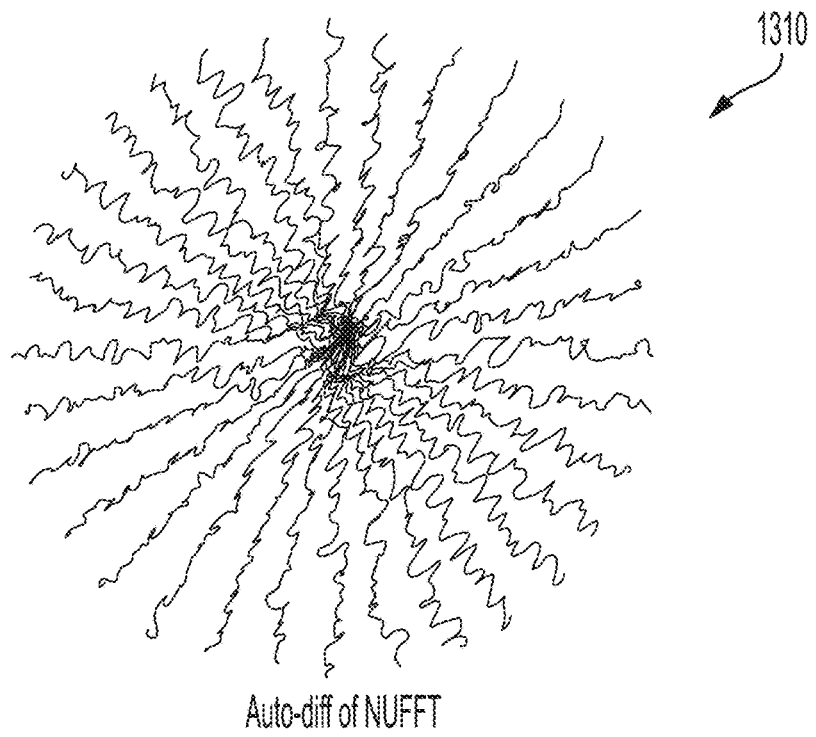
FIG. 13 illustrates examples of learned trajectories with descent directions calculated by different methods.
Figure 13:
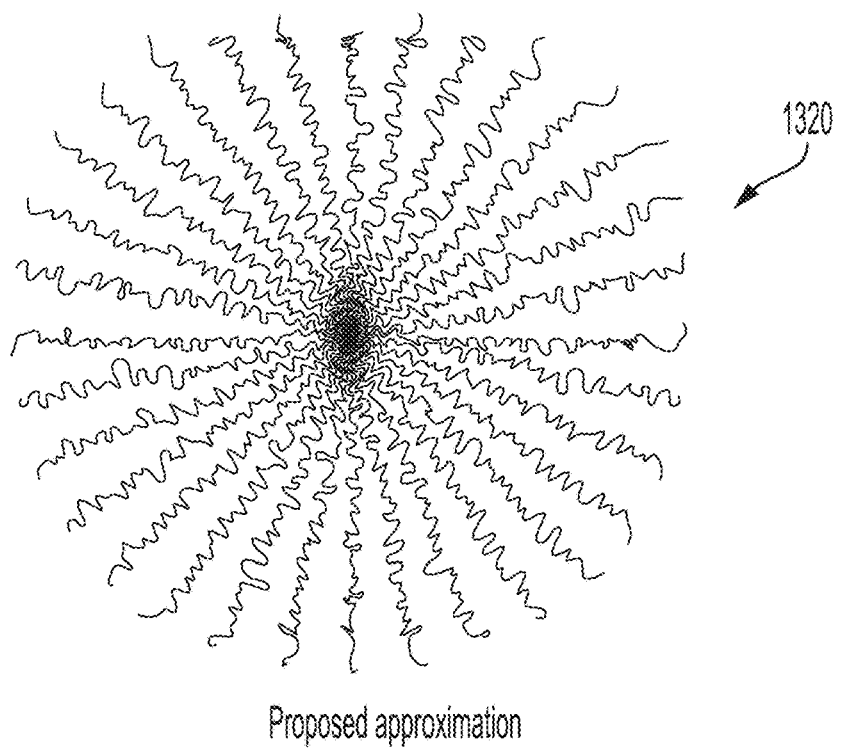

FIG. 13 illustrates examples of learned trajectories ω with descent directions calculated by different methods. In particular, trajectories 1310 were calculated according to an auto-diff of NUFFT method, and trajectories 1320 were calculated according to techniques disclosed herein. As can be seen, the proposed approximation method 1320 leads to a learned trajectory consistent with intuition: sampling points should not be clustered or too distant from each other. The quantitative reconstruction results also demonstrate significant improvement (950 test slices, SSIM: 0.930 vs. 0.957).

Table 4 above compares the time for computing eq. (1) and eq. (2). The CPUs used are Intel Xeon Gold 6138 CPU @ 2.00 GHz and GPU is an Nvidia RTX2080Ti. This illustrates that the disclosed method is faster than auto-differentiation, especially in the CPU mode.

VII. Aspects Related to Efficient Approximation of Jacobian Matrices

There is growing interest in learning k-space sampling patterns for MRI using optimization approaches [F. Knoll, C. Clason, C. Diwoky, and R. Stollberger, "Adapted random sampling patterns for accelerated MRI," Mag. Res. Mat. Phys. Bio. Med., vol. 24, no. 1, pp. 43-50, February 2011], [C. D. Bahadir, A. Q. Wang, A. V. Dalca, and M. R. Sabuncu, "Deep-learning-based optimization of the under-sampling pattern in MRI," IEEE Trans. Comput. Imag., vol. 6, pp. 1139-1152, 2020], [C. Lazarus et al., "SPARKLING: variable-density k-space filling curves for accelerated T2*-weighted MRI," Mag. Res. Med., vol. 81, no. 6, pp. 3643-61, June 2019], [T. Weiss, O. Senouf, S. Vedula, O. Michailovich, M. Zibulevsky, and A. Bronstein, "PILOT: Physics-Informed Learned Optimized Trajectories for Accelerated MRI," MELBA, pp. 1-23, 2021]. For non-Cartesian sampling patterns, reconstruction methods may involve non-uniform FFT (NUFFT) operations. A typical NUFFT method contains frequency domain interpolation using Kaiser-Bessel kernel values that are retrieved by nearest neighbor look-up in a finely tabulated kernel [B. Dale, M. Wendt, and J. L. Duerk, "A rapid look-up table method for reconstructing MR images from arbitrary K-space trajectories," IEEE Trans. Med. Imag., vol. 20, no. 3, pp. 207-17, March 2001]. That look-up operation is not differentiable with respect to the sampling pattern, complicating auto-differentiation routines for backpropagation (stochastic gradient descent) for sampling pattern optimization. The techniques disclosed herein describe an efficient and accurate approach for computing approximate gradients with respect to the sampling pattern for learning k-space sampling. Various numerical experiments validate the accuracy of the proposed approximation. Also showcased are the trajectories optimized for different iterative reconstruction algorithms, including smooth convex regularized reconstruction and compressed sensing-based reconstruction.

Introduction to Efficient Approximation Aspects

There are several computational imaging modalities where the raw measurements can be modeled as non-Cartesian samples of the imaged object's spectrum, including radar [D. C. Munson and J. L. Sanz, "Image reconstruction from frequency offset Fourier data," Proc. IEEE, vol. 72, no. 6, pp. 661-9, June 1984], diffraction ultrasound tomography [M. M. Bronstein, A. M. Bronstein, M. Zibulevsky, and H. Azhari, "Reconstruction in diffraction ultrasound tomography using nonuniform FFT," IEEE Trans. Med. Imag., vol. 21, no. 11, pp. 1395-1401, November 2002], parallel-beam tomography [S. Matej, J. A. Fessler, and I. G. Kazantsev, "Iterative tomographic image reconstruction using Fourier-based forward and back-projectors," IEEE Trans. Med. Imag., vol. 23, no. 4, pp. 401-12, April 2004], and magnetic resonance imaging (MRI) [G. A. Wright, "Magnetic resonance imaging," IEEE Sig. Proc. Mag., vol. 14, no. 1, pp. 56-66, January 1997], [J. A. Fessler, "Model-based image reconstruction for MRI," IEEE Sig. Proc. Mag., vol. 27, no. 4, pp. 81-9, July 2010]. Image reconstruction methods for such modalities all use non-uniform fast Fourier transform (NUFFT) operations to accelerate computation [J. A. Fessler and B. P. Sutton, "Nonuniform fast Fourier transforms using min-max interpolation," IEEE Trans. Sig. Proc., vol. 51, no. 2, pp. 560-74, February 2003], [Z. Yang and M. Jacob, "Mean square optimal NUFFT approximation for efficient non-Cartesian MRI reconstruction," J. Mag. Res., vol. 242, pp. 126-35, May 2014]. The quality of the reconstructed image depends both on the image reconstruction method and on the characteristics of the frequency domain sampling pattern. MRI has particular flexibility in the design of the k-space sampling patterns and recently there has been a growing interest in learning k-space sampling patterns for MRI using data-driven optimization approaches inspired by machine learning approaches, e.g., [F. Knoll, C. Clason, C. Diwoky, and R. Stollberger, "Adapted random sampling patterns for accelerated MRI," Mag. Res. Mat. Phys. Bio. Med., vol. 24, no. 1, pp. 43-50, February 2011], [C. D. Bahadir, A. Q. Wang, A. V. Dalca, and M. R. Sabuncu, "Deep learning-based optimization of the under-sampling pattern in MRI," IEEE Trans. Comput. Imag., vol. 6, pp. 1139-1152,2020], [C. Lazarus et al., "SPARKLING: variable-density k-space filling curves for accelerated T2*-weighted MRI," Mag. Res. Med., vol. 81, no. 6, pp. 3643-61, June 2019], [T. Weiss, O. Senouf, S. Vedula, O. Michailovich, M. Zibulevsky, and A. Bronstein, "PILOT: Physics-Informed Learned Optimized Trajectories for Accelerated MRI," MELBA, pp. 1-23, 2021].

To learn a non-Cartesian k-space sampling pattern from training data, one must solve an optimization problem involving both the forward model for the MRI system and the image reconstruction method, both of which depend on NUFFT operations. In principle, the Fourier transform operation is a continuous function of the k-space sample locations and thus should be amenable to gradient-based optimization methods. In practice, the NUFFT is an approximation to the ideal discrete Fourier transform and that approximation often is implemented using non-differentiable table-lookup operations for the interpolation kernel [B. Dale, M. Wendt, and J. L. Duerk, "A rapid look-up table method for reconstructing MR images from arbitrary K-space trajectories," IEEE Trans. Med. Imag., vol. 20, no. 3, pp. 207-17, March 2001.], [P. J. Beatty, D. G. Nishimura, and J. M. Pauly, "Rapid gridding reconstruction with a minimal oversampling ratio," IEEE Trans. Med. Imag., vol. 24, no. 6, pp. 799-808, June 2005]. Such approximations are sufficient for image reconstruction, but are problematic if one attempts to use standard auto-differentiation tools for gradient-based optimization. Furthermore, learning-based approaches are very compute-intensive during end-to-end training, so it is desirable to accelerate computation by using very fast NUFFT approximations (low over-sampling factors and/or small interpolation neighborhoods) in the early epochs of training. However, when the method is deployed on test data, one will want to use an accurate NUFFT method. It would be inefficient to attempt to use "exact" auto-differentiation of the (slow) Fourier transform to evaluate the Jacobians through a very approximate NUFFT step that will eventually be replaced by an accurate NUFFT module. The techniques disclosed herein take an efficient approach that replace memory-hungry auto-differentiation steps with fast Jacobian approximations that are themselves based on NUFFT operations. Moreover, the proposed approach requires much lower memory for iterative updates like conjugate gradient (CG) steps that involve NUFFT operations.

Consider the (single-coil) MRI measurement model [J. A. Fessler, "Model-based image reconstruction for MRI," IEEE Sig. Proc. Mag., vol. 27, no. 4, pp. 81-9, July 2010]

$$y = Ax + \epsilon$$

where $y \in \mathbb{C}^M$ denotes the measured k-space data, $x \in \mathbb{C}^M$ denotes the unknown image to be reconstructed, and $A \in \mathbb{C}^{M \times N}$ denotes the system matrix or encoding matrix, where $A = A(\omega)$ has elements $$a_{ij} = e^{-i\vec{\omega}_i \cdot \vec{r}_j}, i = 1, \ldots M, j = 1, \ldots, N \quad \text{eq. (A-1)}$$

for $\vec{\omega}_i \in \mathbb{R}^D$ and $\vec{r} \in \mathbb{R}^D$ where $D \in \{1, 2, 3 \ldots\}$ denotes the image dimension, and where $$\omega = [\omega^{[1]} \omega^{[2]} \ldots \omega^{[D]}]$$

is the M×d matrix consisting of all the k-space sampling locations and $\omega^{[D]} \in \mathbb{R}^M$ denotes its dth column. (For simplicity, the following calculations ignore other physical effects like field inhomogeneity and relaxation that are sometimes included in the forward model in MRI [J. A. Fessler, "Model-based image reconstruction for MRI," IEEE Sig. Proc. Mag., vol. 27, no. 4, pp. 81-9, July 2010].) The voxel center locations VA lie on a Cartesian grid, but the k-space sample locations ω in principle can be arbitrary subject to the Nyquist constraint that $|\vec{\omega}_i \cdot \vec{r}_j| < \pi$. As discussed above, ω is the k-space sampling trajectory or sampling pattern. Traditionally, ω is a geometrical curve controlled by few parameters (such as radial spokes or spiral leaves), and its tuning relies on derivative-free optimization (such as grid-search). In the following and [T. Weiss, O. Senouf, S. Vedula, O. Michailovich, M. Zibulevsky, and A. Bronstein, "PILOT: Physics-Informed Learned Optimized Trajectories for Accelerated MRI," MELBA, pp. 1-23, 2021], [G. Wang, T. Luo, J.-F. Nielsen, D. C. Noll, and J. A. Fessler, "B-spline parameterized joint optimization of reconstruction and k-space trajectories (BJORK) for accelerated 2D MRI," 2021. [Online]. Available: http://arxiv.org/abs/2101.11369], ω may be optimized by minimizing a training loss function for image reconstruction, where the descent direction of ω is the negative gradient of that loss. Generally, the learning process updates ω in a stochastic optimization manner.

Typically A is approximated by a NUFFT [J. A. Fessler and B. P. Sutton, "Nonuniform fast Fourier transforms using min-max interpolation," IEEE Trans. Sig. Proc., vol. 51, no. 2, pp. 560-74, February 2003]. Usually, the NUFFT operator involves interpolation operations in the frequency domain, which are often non-differentiable. One previous MRI sampling trajectory approach that used auto-differentiation [T. Weiss, O. Senouf, S. Vedula, O. Michailovich, M. Zibulevsky, and A. Bronstein, "PILOT: Physics-Informed Learned Optimized Trajectories for Accelerated MRI," MELBA, pp. 1-23,2021] replaced the non-differentiable table look-up step with a bilinear interpolation operation. Bilinear interpolation is differentiable everywhere except at the sample locations. Auto-differentiation of bilinear interpolation involves differentiating some floor and ceiling operations and those derivatives are defined to be zero in popular deep learning frameworks, such as PyTorch and TensorFlow, leading to suboptimal sub-gradient calculations. This is not a software limitation, but rather a problem that stems from the non-differentiability of bilinear interpolation. Nearest-neighbor interpolation has even worse properties for auto-differentiation because its derivative is zero almost everywhere, leading to a completely vanishing gradient.

The following describes a different approach where the gradients are analyzed w.r.t. ω and x, using the exact Fourier transform expression eq. (A-1), and then implement that expression efficiently using NUFFT approximations. This approach provides much faster computation, with the caveat that it also leads to slightly inexact gradient computations, due to the slight inconsistency between exact FT and NUFFT. However, gradients are often inexact anyway in machine learning optimization implementations, due to operations like mini-batches and the use of 32-bit or even 16-bit numerical precision. Furthermore, as mentioned above this approach allows one to use crude NUFFT approximations in the early epochs and switch to accurate approximations in later epochs or at deployment. Thus, the computational efficiency provided by the proposed approach is practical for learning-based approaches to MRI k-space sampling.

For image reconstruction, consider a convex and smooth regularizer R(·) for simplicity. When the noise statistics are Gaussian, a reasonable optimization cost function is $$\Psi(x) = \frac{1}{2}\|Ax - y\|_2^2 + R(x) \quad \text{eq. (A-2)}$$

Consider applying the kth step of gradient descent (GD) to that cost function:

$$x_{k+1} = x_k - \alpha \nabla \Psi(x_k)$$

$$x_k - \alpha A(\omega)'(A(\omega)x_k - y) - \alpha \nabla R(x_k)$$

where $x_k \in \mathbb{C}^N$, α is a step size, and A' denotes the Hermitian transpose of A. After running K iterations, there is a reconstructed image $x_k = x_k(\omega) = f(\omega, y)$, where the reconstruction method f(ω, y) is a function of both the data y and the sampling pattern ω. To learn/update the sampling pattern ω, consider the loss function for a single training example:

$$L(\omega) = \|x_k(\omega) - x^{true}\|_2^2 \quad \text{eq. (A-3)}$$

where $L: \mathbb{R}^M \mapsto \mathbb{R}$. Learning ω via backpropagation requires differentiating L w.r.t. w, which in turn involves terms involving Jacobians of quantities such as A(ω). Computing such Jacobians efficiently is one focus of this work.

Although the GD algorithm is illustrated with a simple regularizer above, more generally the reconstruction method f(ω, y) can involve much more sophisticated regularizers, such as neural networks [T. Weiss, O. Senouf, S. Vedula, O. Michailovich, M. Zibulevsky, and A. Bronstein, "PILOT: Physics-Informed Learned Optimized Trajectories for Accelerated MRI," MELBA, pp. 1-23, 2021], [G. Wang, T. Luo, J.-F. Nielsen, D. C. Noll, and J. A. Fessler, "B-spline parameterized joint optimization of reconstruction and kspace trajectories (BJORK) for accelerated 2D MRI," 2021. [Online]. Available: http://arxiv.org/abs/2101.11369] or the sparsity models [M. Lustig, D. L. Donoho, J. M. Santos, and J. M. Pauly, "Compressed Sensing MRI," IEEE Signal Process. Mag., vol. 25, no. 2, pp. 72-82, March 2008] used in compressed sensing. In all such cases, backpropagation still uses the chain-rule to calculate a numerical gradient (or sub-gradient) of the loss function L w.r.t. the sampling pattern w. Within the computation graph, some nodes are complex-valued. The loss function L is a real-valued function and usually is not holomorphic. In this situation, one must use Wirtinger calculus [T. Adali, P. J. Schreier, and L. L. Scharf, "Complex-valued signal processing: the proper way to deal with impropriety," IEEE Trans. Sig. Proc., vol. 59, no. 11, pp. 5101-25, November 2011], [L. Sorber, M. V. Barel, and L. D. Lathauwer, "Unconstrained optimization of real functions in complex variables," SIAM J. Optim., vol. 22, no. 3, pp. 879-98, 2012], [K. Kreutz-Delgado, "The complex gradient operator and the CRcalculus," arXiv preprint arXiv:0906.4835, 2009] to update the sampling pattern. Furthermore, in the usual case where there are multiple training samples, often one uses stochastic gradient descent to minimize the training loss. In all such variations, Jacobians of terms involving A(ω) are needed.

Jacobians with respect to ω are also relevant for tomographic image reconstruction problems with unknown view angles (e.g., cryo-EM) where the view angles must be estimated, e.g., [M. Zehni, L. Donati, E. Soubies, Z. Zhao, and M. Unser, "Joint angular refinement and reconstruction for single-particle cryo-EM," IEEE Trans. Im. Proc., vol. 29, pp. 6151-63, 2020].

Jacobian Expressions

This section derives the key Jacobian expressions and their efficient approximations based on NUFFT operations.

A. Notation

The following denotes matrices, vectors and scalars by A, a and a, respectively. A', $A^T$, and A* denote the Hermitian transpose, the transpose and the complex conjugate of A, respectively.

For Jacobian matrices, the "numerator-layout" notation is followed (https://en.wikipedia.org/wiki/Matrix_calculus#Numerator-layout_notation). For example, the derivative of an m-element column vector y w.r.t. an n-element vector x is an m×n matrix:

$$\frac{\partial y}{\partial x} \triangleq \begin{bmatrix} \frac{\partial y_1}{\partial x_1} & \frac{\partial y_1}{\partial x_2} & \cdots & \frac{\partial y_1}{\partial x_n} \\ \frac{\partial y_2}{\partial x_1} & \frac{\partial y_2}{\partial x_2} & \cdots & \frac{\partial y_2}{\partial x_n} \\ \vdots & \vdots & \ddots & \vdots \\ \frac{\partial y_m}{\partial x_1} & \frac{\partial y_m}{\partial x_2} & \cdots & \frac{\partial y_m}{\partial x_n} \end{bmatrix} \quad \text{eq. (A-4)}$$

However, this convention does not handle scenarios such as the derivatives of the elements of one matrix w.r.t the elements of another matrix. Thus, the following adopts a natural extension by using the vec (vectorization) operation. Specifically, for a M×N matrix A that is a function of a P×Q matrix B, derivative is written as a MN×PQ matrix by applying eq. (A-4) to the vec of each matrix:

$$\mathcal{D}_B A = \mathcal{D}_B A(B) \triangleq \frac{\partial vec(A)}{\partial vec(B)} \quad \text{eq. (A-5)}$$

The following equalities are useful in our derivations. (The equalities involving products all assume the sizes are compatible.) For $A \in \mathbb{C}^{K \times L}$, $B \in \mathbb{C}^{L \times M}$, $C \in \mathbb{C}^{M \times N}$:

$$vec(ABC) = (I_N \otimes AB) vec(C) = (C^T B^T \otimes I_K) vec(A) \quad \text{eq. (A-P1)}$$

In general:

$$(A \otimes B)(C \otimes D) = (AC) \otimes (BD) \quad \text{eq. (A-P2)}$$

For $A \in \mathbb{C}^{K \times L}$, $B \in \mathbb{C}^{M \times N}$:

$$A \otimes B = (I_K \otimes B)(A \otimes I_N) = (A_M \otimes I)(I_L \otimes B) \quad \text{eq. (A-P3)}$$

For $A \in \mathbb{C}^{M \times N}$, $X \in \mathbb{C}^N$:

$$\mathcal{D}_A(Ax) = x^T \otimes I_M \quad \text{eq. (A-P4)}$$

Finally there is:

$$A \in \mathbb{R}^{N \times N} \Rightarrow \mathcal{D}_A A^{-1} = -(A^T)^{-1} \otimes A^{-1} \quad \text{eq. (A-P5)}$$

The chain rule still holds for the extended Jacobian formulation. Suppose $F: \mathbb{C}^{K \times L} \to \mathbb{C}^{M \times N}$ and $G: \mathbb{C}^{M \times N} \to \mathbb{C}^{P \times Q}$. For $X \in \mathbb{C}^{K \times L}$, the Jacobian of the composite function is:

$$\underbrace{\mathcal{D}_X G(F(X))}_{PQ \times KL} = \underbrace{\mathcal{D}_Y G(Y)|_{Y=F(X)}}_{PQ \times MN} \underbrace{\mathcal{D}_X F(X)}_{MN \times KL} \quad \text{eq. (A-P6)}$$

Equalities (A-P1)-(A-P3) are common matrix vectorization properties.

See [J. R. Magnus and H. Neudecker, Matrix differential calculus with applications in statistics and econometrics. John Wiley & Sons, 2019; Ch. 9] for eq. (A-P4), eq. (A-P5), [J. R. Magnus and H. Neudecker, Matrix differential calculus with applications in statistics and econometrics. John Wiley & Sons, 2019; Ch. 5] for eq. (A-P6), and more properties of the extended Jacobian formulation.

B. Forward Operator

The following first focuses on the forward operation $A(\omega)x$ and determines Jacobian matrices with respect to x and $\omega$. The M×N Jacobian matrix of the forward operation with respect to x is simply A itself:

$$\frac{\partial Ax}{\partial x} = A$$

For the dth column of $\omega$:

$$\left[\frac{\partial Ax}{\partial \omega^{[d]}}\right]_{il} = \frac{\partial [Ax]_i}{\partial \omega_l^{[d]}}$$

$$= \frac{\partial}{\partial \omega_l^{[d]}} \sum_{j=1}^{N} e^{-i\vec{\omega}_i \cdot \vec{r}_j} x_j$$

$$= \begin{cases} -i \sum_{j=1}^{N} e^{-i\vec{\omega}_i \cdot \vec{r}_j} x_j r_j^{[d]}, & i = l \\ 0, & \text{otherwise,} \end{cases}$$

for i,l=1, . . . , M. The above summation is the product of the ith row of A with $x \odot r^{[d]}$. Thus, the M×M Jacobian matrix for the partial derivatives of Ax w.r.t. $\omega^{[d]}$ is:

$$\frac{\partial Ax}{\partial \omega^{[d]}} = -i \text{diag}\{A(x \odot r^{[d]})\} \quad \text{eq. (A-6)}$$

To apply this Jacobian to a vector $$v = \frac{\partial L}{\partial A^* x^*} \in \mathbb{C}^M,$$

as needed in a back-propagation step (Jacobian-vector product, JVP), one must compute $$\frac{\partial L}{\partial \omega} = \text{real}\left\{\left(-iA(x \odot r^{[d]})\right)' \odot v\right\} \quad \text{eq. (A-7)}$$

To compute this term efficiently, a NUFFT operation is simply applied to $x \odot r^{[d]}$. See [K. Kreutz-Delgado, "The complex gradient operator and the CRcalculus," arXiv preprint arXiv:0906.4835, 2009] for more details about Wirtinger derivatives.

C. Adjoint Operator

Derivations of the Jacobians for the adjoint operation $A'(\omega)y$ follow a similar approach. For y:

$$\frac{\partial A' y}{\partial y} = A'$$

For the dth column of $\omega$, the N×M Jacobian matrix has elements:

$$\left[\frac{\partial A'y}{\partial \omega^{[d]}}\right]_{j,l} = \frac{\partial [A'y]_j}{\partial \omega_l^{[d]}}$$

$$= \frac{\partial \sum_{i=1}^{M} e^{i\vec{\omega}_i \cdot \vec{r}_j} y_j}{\partial \omega_l^{[d]}}$$

$$ie^{i\vec{\omega}_l \cdot \vec{r}_j} y_l r_j^{[d]}$$

Thus the Jacobian matrix is $$\frac{\partial A'y}{\partial \omega^{[d]}} = i\mathrm{diag}\{r^{[d]}\}A'\mathrm{diag}\{y\} \quad \text{eq. (A-8)}$$

To apply this Jacobian to a vector v efficiently, the NUFFT adjoint A' is applied to $v \odot y$, and then scale by $ir^{[d]}$.

D. Gram Matrix

The product $A'(\omega)A(\omega)x$ of the Gram matrix with a vector also arises in data consistency and gradient terms and requires appropriate Jacobian matrices. For x:

$$\frac{\partial A'Ax}{\partial x} = A'A$$

The (k, j)th element of the N×N matrix containing the partial derivatives of the Gram matrix w.r.t. $\omega_l^{[d]}$ is $$\left[\frac{\partial A'y}{\partial \omega_l^{[d]}}\right]_{k,j} = \frac{\partial}{\partial \omega_l^{[d]}} \sum_{i=1}^{M} e^{-i\vec{\omega}_i \cdot (\vec{r}_j - \vec{r}_k)} \quad \text{eq. (A-9)}$$

$$= -i(r_j^{[d]} - r_k^{[d]})e^{-i\vec{\omega}_l \cdot (\vec{r}_j - \vec{r}_k)}$$

$$= -i(r_j^{[d]} - r_k^{[d]})a_{lk}^* a_{lj}$$

In matrix form:

$$\frac{\partial A'A}{\partial \omega_l^{[d]}} = i\mathrm{diag}\{r^{[d]}\}A'e_l e_l' A - iA'e_l e_l' A\mathrm{diag}\{r^{[d]}\} \quad \text{eq. (A-10)}$$

When multiplying the Jacobian with a vector x:

$$\frac{\partial A'A}{\partial \omega_l^{[d]}}x = i\mathrm{diag}\{r^{[d]}\}a_l(x_l'x) - ia_l a_l'\mathrm{diag}\{r^{[d]}\}x \quad \text{eq. (A-11)}$$

$$= i(a_l'x)(r^{[d]} \odot a_l) - i(a_l'(x \odot r^{[d]}))a_l$$

where $a_l = A'e_l$ denotes the lth column of A'.

Consider the extended Jacobian expression:

$$\mathcal{D}_{\omega_l^{[d]}} A'A = \mathrm{vec}\left(\frac{\partial A'A}{\partial \omega_l^{[d]}}\right)$$

Multiplying by x yields:

$$\frac{\partial A'A}{\partial \omega_l^{[d]}}x = \mathrm{vec}\left(\frac{\partial A'A}{\partial \omega_l^{[d]}}x\right) \quad \text{(use eq. A-P1)}$$

$$= (x^T \otimes I_N)\mathrm{vec}\left(\frac{\partial A'A}{\partial \omega_l^{[d]}}\right)$$

$$= (x^T \otimes I_N)\left(\mathcal{D}_{\omega_l^{[d]}} A'A\right)$$

$$= (\mathcal{D}_{A'A} A'Ax)\left(\mathcal{D}_{\omega_l^{[d]}} A'A\right) \quad \text{(use eq. A-P4)}$$

$$= \mathcal{D}_{\omega_l^{[d]}} A'A \quad \text{(use eq. A-P6)}$$

Concatenating eq. (A-11) by columns leads to the matrix $$\left[\frac{\partial A'A}{\partial \omega_1^{[d]}} \cdots \frac{\partial A'A}{\partial \omega_M^{[d]}}\right]x = \quad \text{eq. (A-12)}$$

$$-iA'\mathrm{diag}\{A(x \odot r^{[d]})\} + i\mathrm{diag}\{r^{[d]}\}A'\mathrm{diag}\{Ax\}$$

Alternatively, it is possible to express the extended Jacobian as $$\left[\frac{\partial A'A}{\partial \omega_1^{[d]}} \cdots \frac{\partial A'A}{\partial \omega_M^{[d]}}\right]x = (x^T \otimes I_N)(\mathcal{D}_{\omega^{[d]}} A'A) \quad \text{eq. (A-13)}$$

$$= (\mathcal{D}_{A'A} A'Ax)(\mathcal{D}_{\omega^{[d]}} A'A)$$

$$= \mathcal{D}_{\omega^{[d]}} A'Ax$$

Note that eq. (A-12) and eq. (A-13) establish that even x is relevant to the Jacobian w.r.t. $\omega$.

E. Inverse of Positive Semidefinite Operator

Image reconstruction methods based on algorithms like the augmented Lagrangian approach use "data consistency steps" that often involve least-squares problems having solutions of the following form:

$$(A'A + \lambda I)^{-1}x$$

for some vector $x \in \mathbb{C}^N$, or $$(A'A + \lambda T'T)^{-1}x \quad \text{eq. (A-14)}$$

where T denotes a linear regularization operator that is independent of $\omega$. In both cases, $\lambda > 0$ and the null spaces of T and A are disjoint, so the Hessian matrix is invertible. A few iterations of a conjugate gradient (CG) method usually suffices to efficiently compute the approximate product of such a matrix inverse with a vector.

Following [H. K. Aggarwal, M. P. Mani, and M. Jacob, "MoDL: model-based deep learning architecture for inverse problems," IEEE Trans. Med. Imag., vol. 38, no. 2, pp. 394-405, February 2019], some embodiments treat CG as solving the above equations accurately, because attempting to auto-differentiate through a finite number of CG iterations requires undesirably large amounts of memory. So some embodiments derive the corresponding Jacobian matrices for the exact solution to eq. (A-14) and then apply fast approximations. For x, the Jacobian is $$\frac{\partial (A'A + \lambda T'T)^{-1}x}{\partial x} = (A'A + \lambda T'T)^{-1}$$

It is possible to use CG to efficiently multiply this Jacobian by a vector, albeit approximately.

To consider the Jacobian w.r.t. $\omega^{[d]}$, $z=(A'A+\lambda T'T)^{-1}x$ and $F=A'A+\lambda T'T$. The presented calculation assumes that A and T have disjoint null spaces, so that F is symmetric positive definite and hence invertible. Applying equalities derived above leads to the following Jacobian expression:

$$\mathcal{D}_{\omega^{[d]}}F^{-1}x = (\mathcal{D}_F F^{-1}x)(\mathcal{D}_{\omega^{[d]}}F) \quad \text{eq. (A-15)}$$

$$= -(x^T \otimes I)(F^{-1} \otimes F^{-1})(\mathcal{D}_{\omega^{[d]}}F) \quad \text{(use eq. A-P5)}$$

$$= -(x^T F^{-1}) \otimes F^{-1}(\mathcal{D}_{\omega^{[d]}}F) \quad \text{(use eq. A-P2)}$$

$$= -F^{-1}(x^T F^{-1} \otimes I)(\mathcal{D}_{\omega^{[d]}}F) \quad \text{(use eq. A-P3)}$$

$$= -(A'A+\lambda T'T)^{-1}\begin{pmatrix} -iA'\text{diag}\{A(z\odot r^{[d]})\} + \\ i\text{diag}\{r^{[d]}\}A'\text{diag}\{Az\} \end{pmatrix} \quad \text{(use eq. A-13)}$$

One may apply this Jacobian to a vector by using four NUFFT operations followed by running CG to approximate the product of $F^{-1}$ times a vector. This new fast and low-memory Jacobian approximation is particularly important for enabling the MRI applications shown in the results section.

F. Sensitivity Maps

In multi-coil (parallel) acquisition, the MRI system model involves another linear operator $$s = \begin{bmatrix} S_1 \\ \vdots \\ S_{N_c} \end{bmatrix}$$

where $S_i=\text{diag}\{s_i\}$ denotes a diagonal matrix containing the receive coil sensitivity map [K. P. Pruessmann, M. Weiger, M. B. Scheidegger, and P. Boesiger, "SENSE: sensitivity encoding for fast MRI," Magn. Reson. Med., vol. 42, no. 5, pp. 952-962, 1999]. The total number of receiver channels is $N_C$. The system matrix (E) for MRI in this case becomes $(I_{N_c} \otimes A)S$. Because of the special block-diagonal structure of S, all the Jacobian matrices in previous sections still hold by simply replacing A with E.

To Jacobian derivations are as follows.

$$\frac{\partial Ex}{\partial \omega^{[d]}} = \frac{\partial \begin{bmatrix} AS_1 x \\ \vdots \\ AS_{N_c}x \end{bmatrix}}{\partial \omega^{[d]}}$$

$$= \begin{bmatrix} -i\text{diag}\{A(s_1 \odot x \odot r^{[d]})\} \\ \vdots \\ -i\text{diag}\{A(s_{N_c} \odot x \odot r^{[d]})\} \end{bmatrix}$$

$$= i\text{diag}\{(I_{N_c} \otimes A)S(x \odot r^{[d]})\}$$

$$= i\text{diag}\{E(x \odot r^{[d]})\}$$

The "adjoint operator" section above follows the same proof and produces $$\frac{\partial E'y}{\partial \omega^{[d]}} = i\text{diag}\{r^{[d]}\}E'\text{diag}\{y\}$$

For the "gram matrix" section above, there is $$\frac{\partial E'Ex}{\partial \omega^{[d]}} = \sum_i \frac{\partial S_i' A' AS_i x}{\partial \omega^{[d]}} \quad \text{eq. (A-16)}$$

$$= \sum_i S_i' \frac{\partial A' AS_i x}{\partial \omega^{[d]}}$$

$$= \sum_i -iS_i' A' \text{diag}\{A(Sx \odot r^{[d]})\} +$$

$$iS_i' \text{diag}\{r^{[d]}\}A'\text{diag}\{AS_i x\}$$

$$= \sum_i -iS_i' A'\text{diag}\{A(Sx \odot r^{[d]})\} +$$

$$i\text{diag}\{r^{[d]}\}S_i' A'\text{diag}\{AS_i x\}$$

$$= -iE'\text{diag}\{E(x \odot r^{[d]})\} +$$

$$i\text{diag}\{r^{[d]}\}E'\text{diag}\{Ex\}$$

For the "Inverse of Positive Semidefinite Operator" above, let $G=E'E+\lambda T'T$ and $z=G^{-1}x$ (in the usual case where the regularizer matrix T is designed such that G is invertible). Combining eq. (A-15) and eq. (A-16) produces:

$$\frac{\partial (E'E+\lambda T'T)^{-1}x}{\partial \omega^{[d]}} = -G^{-1}(x^T G^{-1} \otimes I)\mathcal{D}_{\omega^{[d]}}G$$

$$= (E'E+\lambda T'T)^{-1}(-iE'\text{diag}\{E(z\odot r^{[d]})\} +$$

$$i\text{diag}\{r^{[d]}\}E'\text{diag}\{Ez\}).$$

Again, this Jacobian matrix is applied to a vector by combining NUFFT operations and CG.

G. Field Inhomogeneity

For MRI scans with long readouts, one should also consider the effects of off-resonance (e.g., field inhomogeneity), in which case the system matrix elements are given by [J. A. Fessler, "Model-based image reconstruction for MRI," IEEE Sig. Proc. Mag., vol. 27, no. 4, pp. 81-9, July 2010]

$$a_{ij} = e^{-i\vec{\omega}_i \cdot \vec{r}_j} e^{-i\omega_i \cdot t_i},$$

where $\omega_j$ denotes the field map value at the jth voxel and $t_i$ is the time of the ith readout sample.

This form is no longer a Fourier transform operation, but there are fast and accurate approximations [J. A. Fessler, S. Lee, V. T. Olafsson, H. R. Shi, and D. C. Noll, "Toeplitz-based iterative image reconstruction for MRI with correction for magnetic field inhomogeneity," IEEE Trans. Sig. Proc., vol. 53, no. 9, pp. 3393-402, September 2005] that enable the use of O(N log N) NUFFT steps and avoid the very slow $O(N^2)$ matrix-vector multiplication that would be needed otherwise. Such approximations of system matrix E usually have the form:

$$E_f \approx \sum_{l=1}^{L} \text{diag}\{b_{il}\}A(\omega)\text{diag}\{c_{lj}\},$$

where A denotes the usual (possibly non-Cartesian) DFT that is usually approximated by a NUFFT, $b_{il} \in \mathbb{C}^M$, and $b_{il} \in$ $\mathbb{C}^N$. It is relatively straightforward to generalize the Jacobian expressions in this paper to handle the case of field inhomogeneity, similar to the sensitivity map case.

Numerical Experiments

This section investigates the accuracy of the proposed approximations and illustrates their use for MRI trajectory optimization for three iterative image reconstruction methods.

A. Accuracy of the Proposed Approximation

Some embodiments may implement the numerical experiments with torchkbnufft (https://github.com/mmuckley/torchkbnufft) [M. J. Muckley, R. Stern, T. Murrell, and F. Knoll, "TorchKbNufft: A high-level, hardware-agnostic non-uniform fast fourier transform," in ISMRM Workshop on Data Sampling & Image Reconstruction, 2020] and MIRTorch (https://github.com/guanhuaw/MIRTorch) toolboxes.

Some embodiments may compare three different calculation methods for the following gradients $$\frac{\partial \|f(x)\|_2^2}{\partial \omega^{[d]}} \text{ and } \frac{\partial \|f(x)\|_2^2}{\partial x},$$

where f(·) stands for a forward, Gram, or 'inverse of PSD' of sensitivity-informed NUFFTs. The Gram and inverse tests also implicitly test the adjoint approximations. The x adopted is a cropped Shepp-Logan phantom with random additional phases, S is a simulated 8-channel sensitivity map, and ω is one radial spoke crossing the k-space center. The Jacobian calculation methods are: (1) auto-differentiation of NUFFT; the table finding operation [B. Dale, M. Wendt, and J. L. Duerk, "A rapid look-up table method for reconstructing MR images from arbitrary K-space trajectories," IEEE Trans. Med. Imag., vol. 20, no. 3, pp. 207-17, March 2001] is replaced by bi-linear interpolation to enable auto-differentiation, as adopted by [T. Weiss, O. Senouf, S. Vedula, O. Michailovich, M. Zibulevsky, and A. Bronstein, "PILOT: Physics-Informed Learned Optimized Trajectories for Accelerated MRI," MELBA, pp. 1-23, 2021], 2) auto-differentiation of exact non-uniform discrete Fourier transform (DFT), (3) an approximation according to the techniques disclosed herein. Note that there is no exact 'ground truth' in the Jacobian of NUFFTs here. Errors occur during the interpolation operations in method (1). The bilinear interpolation is non-differentiable, while popular auto-differentiation frameworks set the sub-gradient of floor and ceiling function as 0. Method (2) is the accurate gradient of DFT because the gradient calculation introduces negligible numerical errors. Since NUFFT is only an approximation of DFT, DFT's Jacobian is not exactly the same as NUFFT's Jacobian. If the NUFFT operations are accurate enough, which is usually the case, method (2) is a good approximation of NUFFTs' true Jacobian matrices.

Figure 14:
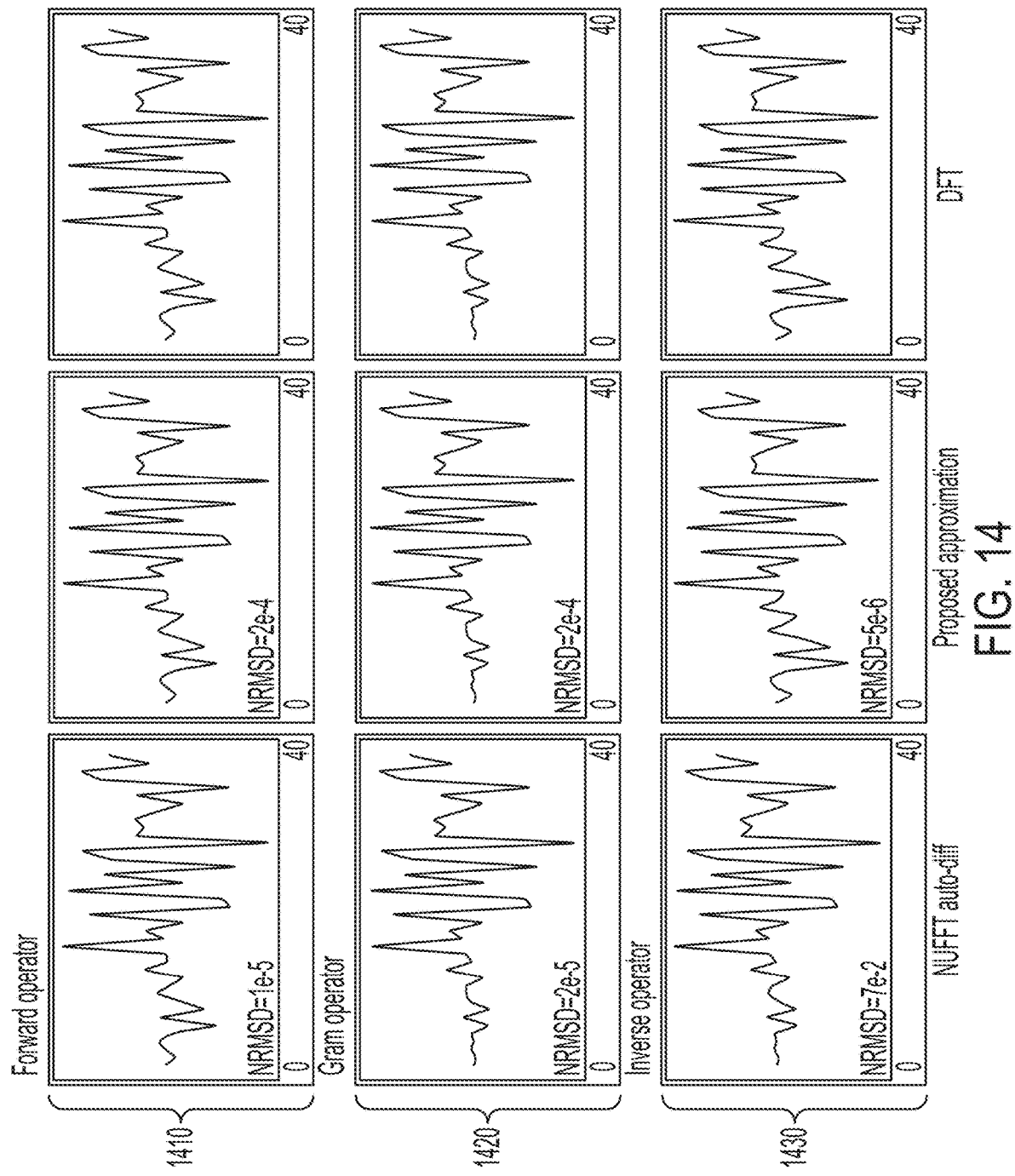
FIG. 14 illustrates an example profile of a gradient w.r.t. a real part of x.
Figure 15:
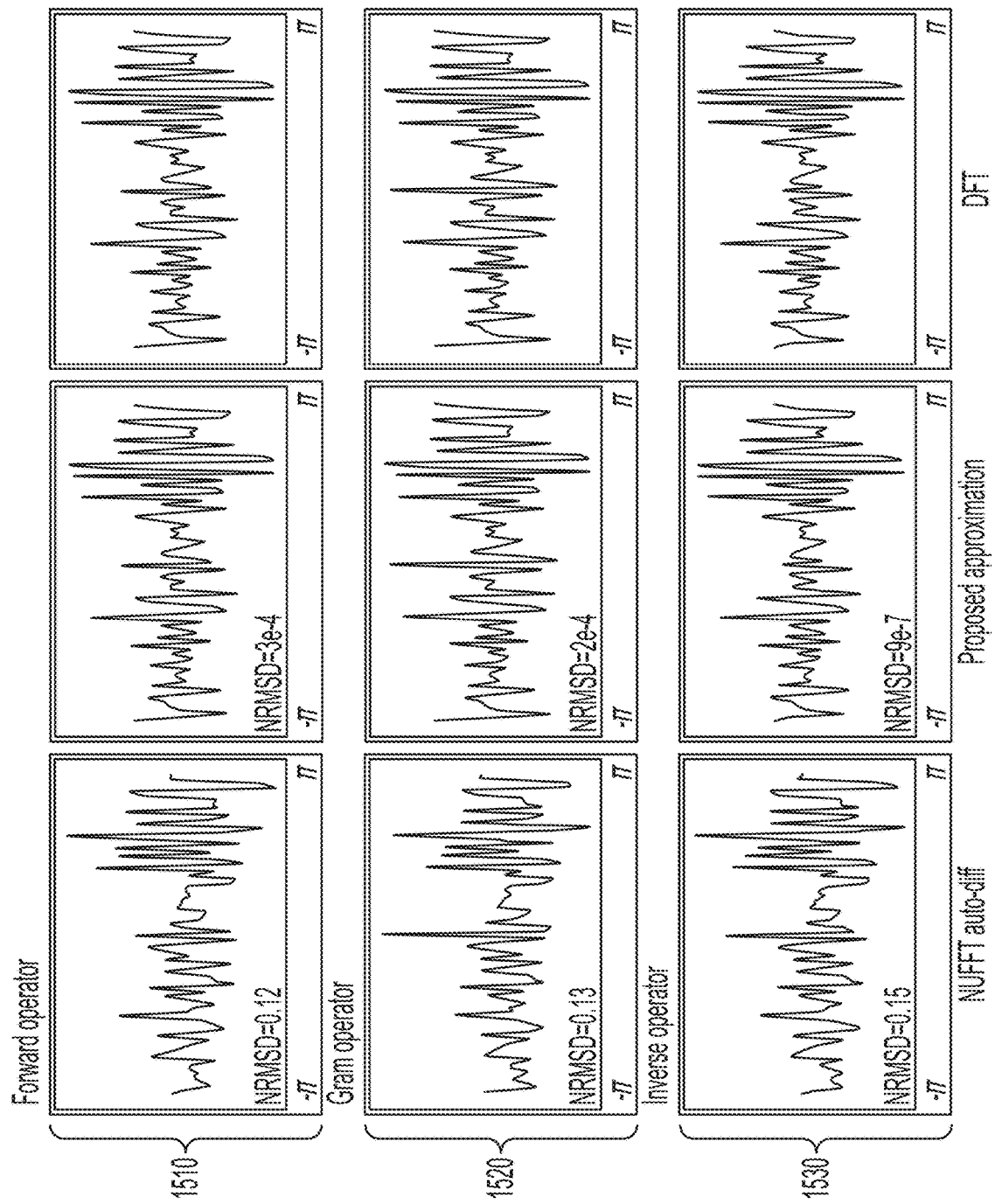
FIG. 15 illustrates an example profile of a gradient w.r.t. ω.

FIGS. 14 and 15 showcase a profile of the gradient w.r.t. x and ω. The three illustrated example methods produce similar results for the gradient w.r.t. x. For co, the auto-differentiation has larger deviations from the results of DFT.

More specifically, FIG. 14 shows examples of gradients w.r.t. the real part of x. The illustrated plots show one representative row of a 40×40 matrix. The rows are the forward, Gram, and inverse operator cases. The illustrated three calculation methods (forward operator shown in row 1410; gram operator shown in row 1420; and inverse operator shown in row 1430) achieve similar results. The horizontal axis is the pixel index. The bottom left corner of each plot shows the normalized root-mean-square difference (NRMSD) compared with the DFT calculation.

FIG. 15 shows examples of gradients w.r.t. ω. Plots show one spoke of 80 points. The rows are the forward, Gram, and inverse operator cases. The proposed approximation better matches the gradient of the DFT. The bottom left corner of each plot shows the normalized root-mean-square difference (NRMSD) compared with the DFT calculation.

Table 5 compares the compute times of approaches (1) and (2). The CPUs is Intel® Xeon® Gold 6138 CPU @ 2.00 GHz and GPU is an Nvidia® RTX2080Ti. In the calculations, PyTorch 1.9.1 and torchkbnufft 1.1.0 were used. As can be seen, the disclosed method is much faster than auto-differentiation on both GPUs and CPUs.

TABLE 5

Computation Time of the Test Case

|  | Gram | | Inverse | |
| --- | --- | --- | --- | --- |
|  | auto-diff | proposed | auto-diff | proposed |
| Large image - GPU | 0.3 s | 0.2 s | 4.3 s | 2.5 s |
| Small image - GPU | 0.1 s | 0.1 s | 1.3 s | 0.9 s |
| Large image - CPU | 5.2 s | 1.7 s | 276.2 s | 48.5 s |
| Small image - CPU | 0.8 s | 0.5 s | 27.4 s | 6.9 s |

Large size: 320*320; small size: 40*40

B. MRI Trajectory Optimization

This experiment optimizes the MRI sampling trajectory using the proposed Jacobian approximations. The reconstruction method (2) here includes two types of algorithms, namely smooth (regularized) least-squares reconstruction and sparsity-based reconstruction.

The smooth reconstruction uses the cost function $$\Psi(x) = \frac{1}{2}\|Ex - y\|_2^2 + \frac{\lambda}{2}\|Tx\|_2^2$$

where T is a finite-difference operator encouraging smoothness.

Correspondingly, the reconstructed image is:

$$x_k = (E'E + \lambda T'T)^{-1} E'y$$

which one may use CG iterations to solve. The following sections refer to this method as quadratic penalized least-squares (QPLS). Some embodiments also implement a simpler case, where T=I, which is also referred as CG-SENSE [O. Maier et al., "CG-SENSE revisited: Results from the first ISMRM reproducibility challenge," Magn. Reson. Med., vol. 85, no. 4, pp. 1821-1839, 2021]. In both scenarios, λ=10⁻³, and 20 CG iterations are applied.

The sparsity-based compressed (CS) sensing algorithm adopts a wavelets-based sparsity penalty, and has the following objective function $$\Psi(x) = \frac{1}{2}\|Ex - y\|_2^2 + \lambda\|Wx\|_1$$

where W is an orthogonal DWT matrix and λ=10⁻⁵ is set. The disclosed calculations used the proximal optimized gradient method (POGM) [D. Kim and J. A. Fessler, "Adaptive Restart of the Optimized Gradient Method for Convex Optimization," J Optim Theory Appl, vol. 178, no. 1, pp. 240-263, July 2018], [J. A. Fessler, "Optimization methods for MR image reconstruction," IEEE Sig. Proc. Mag., vol. 37, no. 1, pp. 33-40, January 2020] to solve this non-smooth optimization problem. The number of POGM iterations is 40.

To optimize the k-space trajectory for each of these three reconstruction methods, the training loss (3) is:

$$L(\omega)=\|x_k(\omega)-x^{true}\|_2^2$$

where $x^{true}$ is the conjugate phase reconstruction of fully sampled Cartesian data [D. C. Noll, J. A. Fessler, and B. P. Sutton, "Conjugate phase MRI reconstruction with spatially variant sample density correction," IEEE Trans. Med. Imag., vol. 24, no. 3, pp. 325-336, 2005]. As disclosed herein, sensitivity maps were estimated in E using ESPIRiT [M. Uecker et al., "ESPIRiT—an eigenvalue approach to auto-calibrating parallel MRI: where SENSE meets GRAPPA," Mag. Reson. Med., vol. 71, no. 3, pp. 990-1001, March 2014], and simulated raw signal $y=E(\omega)x^{true}$ retrospectively w.r.t. trajectories of interest. The training uses the fastMRI brain dataset [J. Zbontar et al., "fastMRI: An open dataset and benchmarks for accelerated MRI," 2018. [Online]. Available: http://arxiv.org/abs/1811.08839] containing 15902 T1w slices, 16020 T2w slices, and 3311 FLAIR slices cropped to size 320 320. The number of coils for each case ranges from 2 to 28. The calculations discussed herein used the Adam optimizer [D. P. Kingma and J. Ba, "Adam: a method for stochastic optimization," 2017. [Online]. Available: http://arxiv.org/abs/1412.6980], with step size $10^{-4}$ and mini-batch size 12. The disclosed calculations used 6 epochs for training. The initialization of learned trajectories is an undersampled radial trajectory in all experiments. Some embodiments apply a soft constraint on gradient strength and slew rate similar to [T. Weiss, O. Senouf, S. Vedula, O. Michailovich, M. Zibulevsky, and A. Bronstein, "PILOT: Physics-Informed Learned Optimized Trajectories for Accelerated MRI," MELBA, pp. 1-23, 2021], [G. Wang, T. Luo, J.-F. Nielsen, D. C. Noll, and J. A. Fessler, "B-spline parameterized joint optimization of reconstruction and kspace trajectories (BJORK) for accelerated 2D MRI," 2021. [Online]. Available: http://arxiv.org/abs/2101.11369]. The maximum gradient strength is 5 Gauss/cm and the maximum slew rate is 15 Gauss/cm/ms. The initialization has 16 "spokes" and each spoke is 5 ms long with 1280 sampling points. Each shot was parameterized with 40 quadratic spline kernels [G. Wang, T. Luo, J.-F. Nielsen, D. C. Noll, and J. A. Fessler, "B-spline parameterized joint optimization of reconstruction and kspace trajectories (BJORK) for accelerated 2D MRI," 2021. [Online]. Available: http://arxiv.org/abs/2101.11369] to avoid sub-optimal local minimizers.

Figure 16:
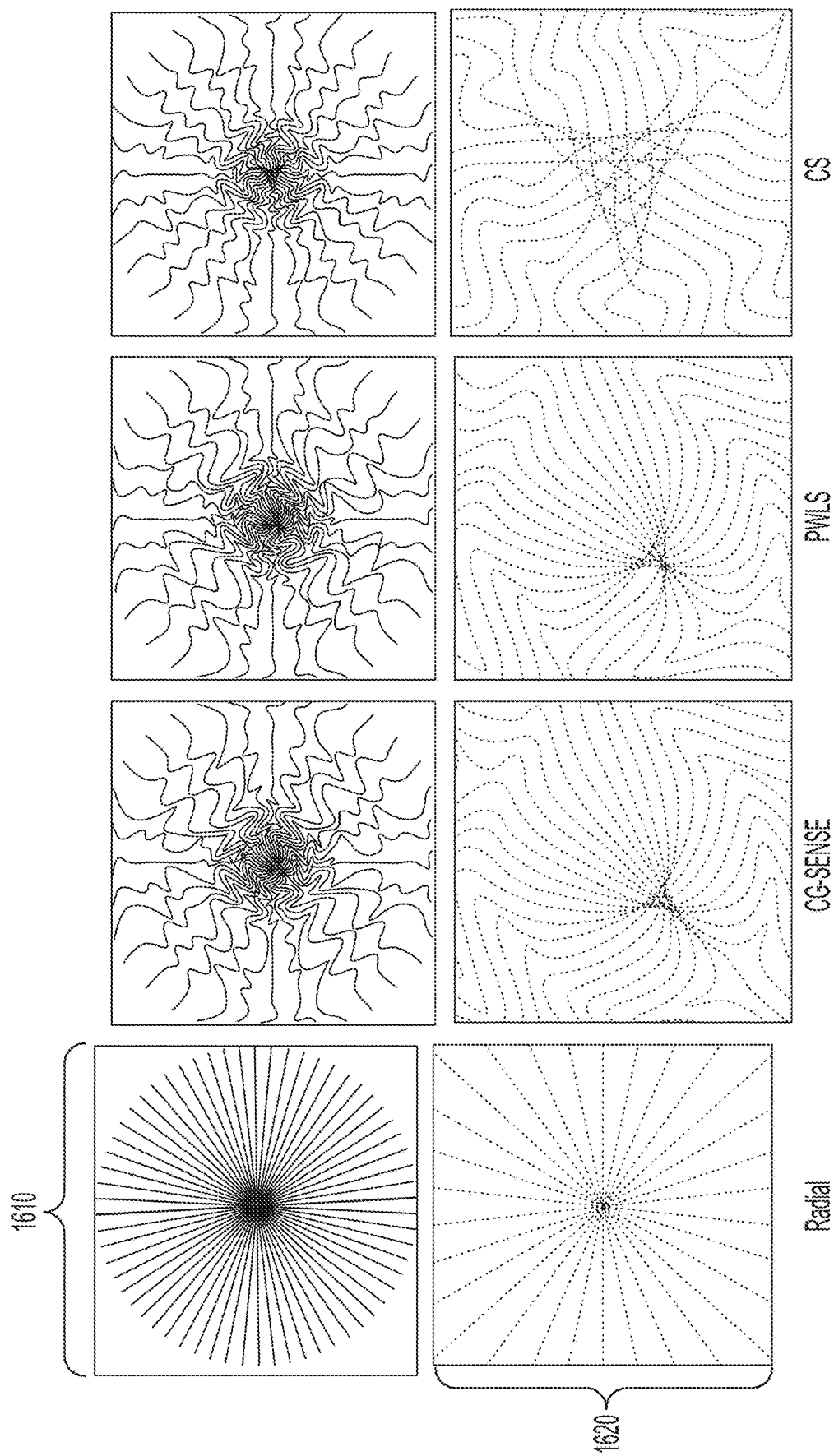
FIG. 16 illustrates example optimized sampling trajectories for three iterative reconstruction methods.

FIG. 16 illustrates example optimized sampling trajectories for three iterative reconstruction methods. The left column 1610 shows the uniform radial initialization. The second row 1620 shows the 8× zoomed-in central k-space. As can be seen, the sparsity regularizer prompts very different sampling trajectories than quadratic regularizer, especially in the central k-space, which is also observed in the Cartesian sampling pattern optimization case [M. V. W. Zibetti, G. T. Herman, and R. R. Regatte, "Fast data-driven learning of parallel MRI sampling patterns for large scale problems," Sci Rep, vol. 11, no. 1, p. 19312, September 2021].

The disclosed experiments also investigated the generalizability of these learned trajectories with reconstruction methods different from the training phase. Table 6 shows the average image reconstruction quality (PSNR and SSIM [A. Hare and D. Ziou, "Image quality metrics: PSNR vs. SSIM," in Intl. Conf. on Patn. Recog. (ICPR), August 2010, pp. 2366-2369]) on 500 test slices. The learned trajectories lead to improved reconstruction quality compared to the initial radial trajectory, even with different reconstruction methods.

TABLE 6

AVERAGE RECONSTRUCTION QUALITY ON TEST SET WITH TRAJECTORIES LEARNED FOR DIFFERENT RECONSTRUCTION METHODS

| Test | Learning | | | |
| --- | --- | --- | --- | --- |
| | QPLS | CG-SENSE | CS | un-optimized |
| | SSIM | | | |
| QPLS | 0.963 | 0.963 | 0.962 | 0.947 |
| CG-SENSE | 0.964 | 0.964 | 0.963 | 0.946 |
| CS | 0.962 | 0.963 | 0.966 | 0.946 |
| | PSNR (in dB) | | | |
| QPLS | 35.1 | 35.1 | 34.9 | 33.1 |
| CG-SENSE | 35.2 | 35.2 | 34.9 | 33.1 |
| CS | 34.8 | 34.9 | 35.4 | 33.0 |

Learning: the reconstruction method that the trajectory is trained with.
Test: the reconstruction method in the test phase.
un-optimized: the undersampled radial trajectory (initialization).

C. Accelerated Training with Low-Accuracy NUFFT

Figure 17:
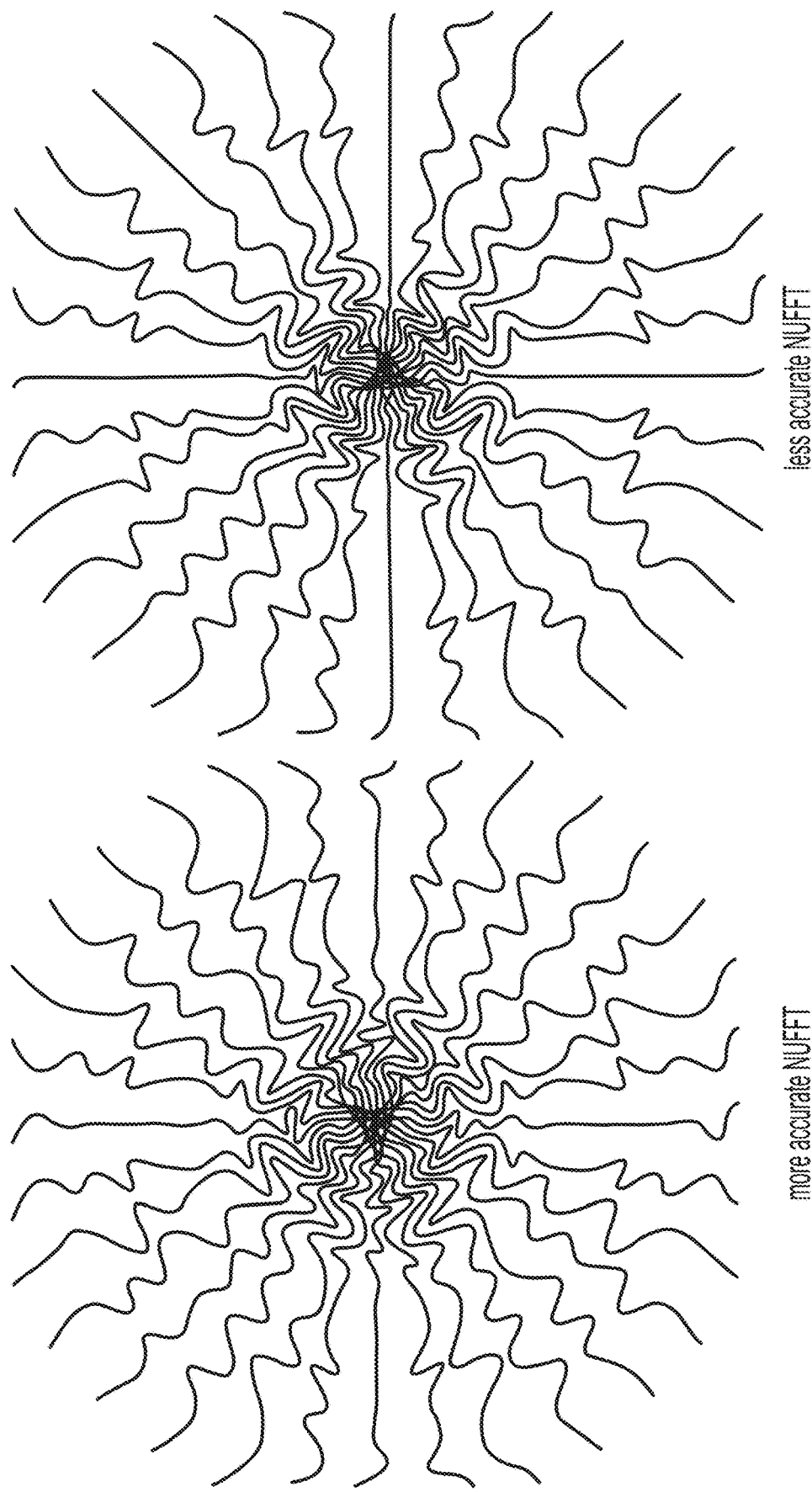
FIG. 17 shows the trajectory optimized by two example non-uniform fast Fourier transform (NUFFT) accuracy levels.

The major computation cost of trajectory learning is with NUFFTs and their Jacobian calculations. To accelerate the training, the techniques disclosed herein propose to use NUFFTs with a smaller gridding size and interpolation kernel size during training [P. J. Beatty, D. G. Nishimura, and J. M. Pauly, "Rapid gridding reconstruction with a minimal oversampling ratio," IEEE Trans. Med. Imag., vol. 24, no. 6, pp. 799-808, June 2005] and still use more accurate NUFFTs during inference. Here, the techniques disclosed herein investigated learning trajectories with two different NUFFT accuracies: (1) gridding size=1:25 image size, interpolation kernel size=5; and (2) gridding size=2 image size, interpolation kernel size=6. On the GPUs, the former setting is around 1:4 faster than the latter. Some embodiments use the compressed sensing-based reconstruction and corresponding training strategy described in the previous section. FIG. 17 shows the trajectory optimized by two example NUFFT accuracy levels. Less accurate NUFFTs still produce similar optimized trajectories.

On the test data described above, the trajectories optimized with the "low accuracy" and "high accuracy" NUFFT both led to test PSNR values of 35.4 dB.

Conclusions for Efficient Approximation of Jacobian Matrices

The techniques described herein provide efficient and accurate approximations of common Jacobian matrices involving NUFFTs. Compared to the auto-differentiation approach, the proposed method is faster and better approximates the exact Jacobians of DFT operations. The MRI sampling trajectory optimization experiment showcases the use of these methods for optimizing frequency domain sampling strategy for given user-defined reconstruction methods.

VIII. Example Methods

Figure 18:
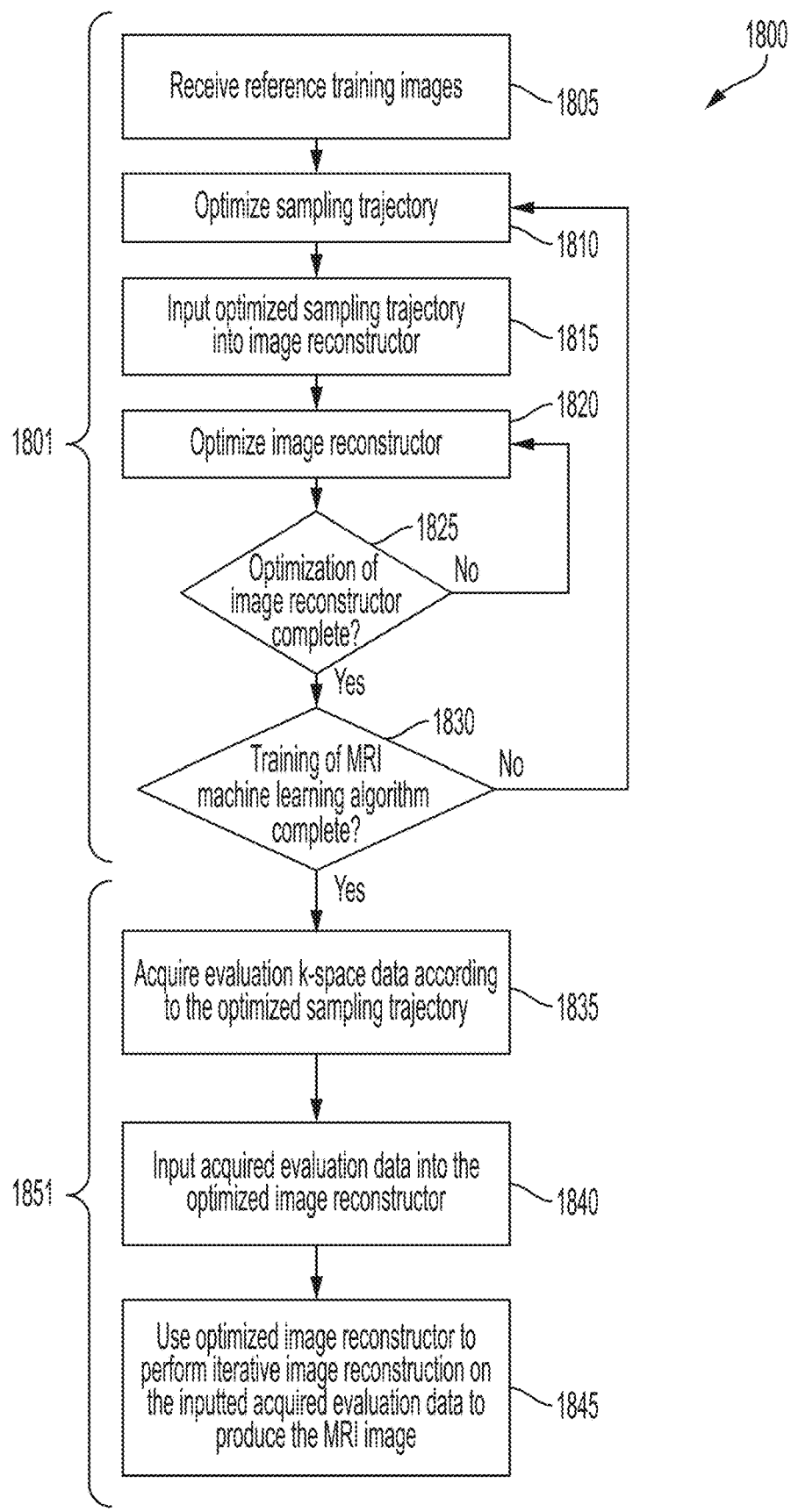
FIG. 18 illustrates a flowchart of an example method in accordance with the techniques described herein.

FIG. 18 illustrates a flowchart of an example method 1800 in accordance with the techniques described herein. The example method 1800 may involve two phases: a training phase 1801, and an evaluation/testing phase 1851. In some embodiments, the blocks of the example method 1800 are performed by the one or more processors 135 of the computing device 130. However, not all of the blocks are required to be performed by the same components. For example, in some embodiments, the blocks of the training phase 1801 may be performed by a first group of one or more processors, and the blocks of the evaluation phase 1851 may be performed by a second group of one or more processors.

The example method 1800 begins at block 1805 when the computing device 130 receives (e.g., with the one or more processors 135) (possibly fully sampled) reference images from the MRI database 170 or any other suitable source. In some embodiments, the reference images are already stored on the memory 140; thus, in these embodiments, the one or more processors 130 may receive the reference images from the memory 140. In some embodiments, block 1805 corresponds to block 210 of FIG. 2A.

In some embodiments, the reference images are used to train a MRI machine learning algorithm. In some implementations, the MRI machine learning algorithm has two components to be trained: a sampling trajectory ω (in some embodiments, trained similarly as in 212 of FIG. 2A), and an image reconstructor 220 (in some embodiments, also trained similarly as in FIG. 2A).

At block 1810, the sampling trajectory ω is optimized (e.g., in accordance with the techniques discussed herein). In some embodiments, the optimization of the sampling trajectory ω involves parameterizing the sampling trajectory ω with second-order quadratic B-spline kernels. In some embodiments, the sampling trajectory ω is optimized by the sampling trajectory optimizer 142.

In some embodiments, the optimizing of the sampling trajectory ω includes penalizing the sampling trajectory ω to obey hardware constraints, such as maximum slew rate and gradient strength.

At block 1815, the optimized sampling trajectory ω is input into the image reconstructor 220. In some embodiments, the optimized sampling trajectory ω has noise added to it to form a simulated k-space signal (e.g., blocks 214 and 216 of FIG. 2A). In some embodiments, the optimized sampling trajectory ω is also initialized prior to input into the image reconstructor 220, such as in the example block 218 of FIG. 2A.

At block 1820, the image reconstructor 220 is optimized (e.g., by the image reconstructor optimizer 144, or any other suitable component). As previously noted, the image reconstructor 220 may comprise any algorithm or model capable of reconstructing a MRI image. For example, the image reconstructor 220 may comprise a model based deep learning algorithm, a CNN denoiser, a regularizer, an invertible neural network, etc. In embodiments where a three-dimensional (3D) image is being reconstructed, and/or where a MRI in motion is being taken (e.g., time is a dimension), it is advantageous to use an invertible neural network to reduce memory requirements.

In some embodiments, the image reconstructor 220 taken together with the data consistency unit 222 form a UNN 224. In some embodiments, the image reconstructor 220 is optimized at block 1820 by optimizing or updating a reconstruction parameter θ. In some embodiments, the data consistency unit 222 may compare data produced by the image reconstructor 220 to data of the fully sampled reference MRI data (e.g., ground truth image(s)). If the data produced by the image reconstructor 220 and the data of the fully sampled reference MRI data differ by more than a predetermined amount, the one or more processors 135 may modify the reconstruction parameter θ of the image reconstructor 220.

At block 1825, the one or more processors 135 determine if the optimization of the image reconstructor 220 is complete. The determination may be made in any suitable way. For instance, if the reconstruction parameter θ converges, it may be determined that the optimization of the image reconstructor 220 is complete. In another example, if it is determined that the image reconstructor 220 produces an acceptable MRI image, it may be determined that the optimization of the image reconstructor 220 is complete. In some embodiments, this may be accomplished by comparing a ground truth image of the fully sampled reference data to a MRI image output by the image reconstructor 220.

If the optimization of the image reconstructor 220 is not complete, the example method 1800 iterates back to block 1820 where the image reconstructor 220 may again be optimized (e.g., by optimizing/updating the reconstruction parameter θ). In this way, the image reconstructor 220 is iteratively optimized.

If the optimization of the image reconstructor 220 is complete, the example method 1800 proceeds to determine if the training of the MRI machine learning algorithm is complete (block 1830) (e.g., with the MRI machine learning algorithm optimizer 146). The determination of if the training of the MRI machine learning algorithm is complete may be done in any suitable way. For example, any suitable set of metrics to determine whether or not the training of the MRI machine learning algorithm is complete. For instance, the determination may depend on one or more accuracy metrics generated during the training phase 1801. In another example, the determination may be made based upon if the MRI machine learning algorithm outputs an acceptable MRI image (e.g., by comparing a ground truth image of the fully sampled reference data to a MRI image output by the MRI machine learning algorithm).

If the training of the machine learning algorithm is not complete, the example method 1800 may proceed to optimize the sampling trajectory ω (block 1810) (e.g., proceed with another iteration). However, in some embodiments, at this stage the sampling trajectory ω, and the reconstruction parameter θ of the image reconstructor 220 are simultaneously updated/optimized, as in some embodiments related to particular implementations of 240 of FIG. 2A. For example, individual blocks of the example method 1800 may be reordered and/or combined such that the sampling trajectory ω, and the reconstruction parameter θ are simultaneously optimized (e.g., optimized together).

If the training of the MRI machine learning algorithm is complete, the example method 1800 may proceed to block 1835 to acquire evaluation data. For example, the one or more processors 135 (e.g., via the MRI data acquirer 148) control the transmit coil 122 and the receive coil 124 of the MRI machine 120 according to the optimized sampling trajectory ω to acquire the evaluation data from patient 110.

At block 1840, the acquired evaluation data may be input into the optimized image reconstructor 220.

At block 1845, the optimized image reconstructor 220 may be used to perform iterative image reconstruction on the inputted acquired evaluation data to produce the MRI image (e.g., MRI image 260). In this regard, a UNN 224 formed by the image reconstructor 220 and the data consistency unit 222 may be used to perform the iterative image reconstruction to produce the MRI image.

It may be further noted that, at block 1845, in some embodiments, a prespecified image reconstructor 220 (e.g., an image reconstructor with prespecified reconstruction parameters) is used rather than an image reconstructor 220 that was trained (e.g., as in a training phase 200 and/or 1801).

Further regarding the example flowcharts provided above, it should be noted that all blocks are not necessarily required to be performed. Moreover, additional blocks may be performed although they are not specifically illustrated in the example flowcharts. In addition, the example flowcharts are not mutually exclusive. For example, block(s) from one example flowchart may be performed in another of the example flowcharts.

IX. Stochastic Optimization of 3D Non-Cartesian Sampling Trajectory (SNOPY) Variations Some variations, referred to herein as stochastic optimization framework for 3D Non-Cartesian sampling trajectory (SNOPY) variations, add to or refine other aspects of certain embodiments. In some aspects, SNOPY is more general than BJORK (e.g., in some embodiments, BJORK may be a 2D implementation of SNOPY).

By way of brief overview, in some embodiments, SNOPY variations may: (i) have a more generalized cost function (e.g., as comparted to eq. (1) above), (ii) optimize arbitrary geometrical properties of sampling trajectory ($\omega$), (iii) improve peripheral nerve stimulation (PNS), and/or (iv) improve image contrast, (v) improve image quality, and/or (vi) improve hardware conformability.

A. Theory/Overview

Figure 19:
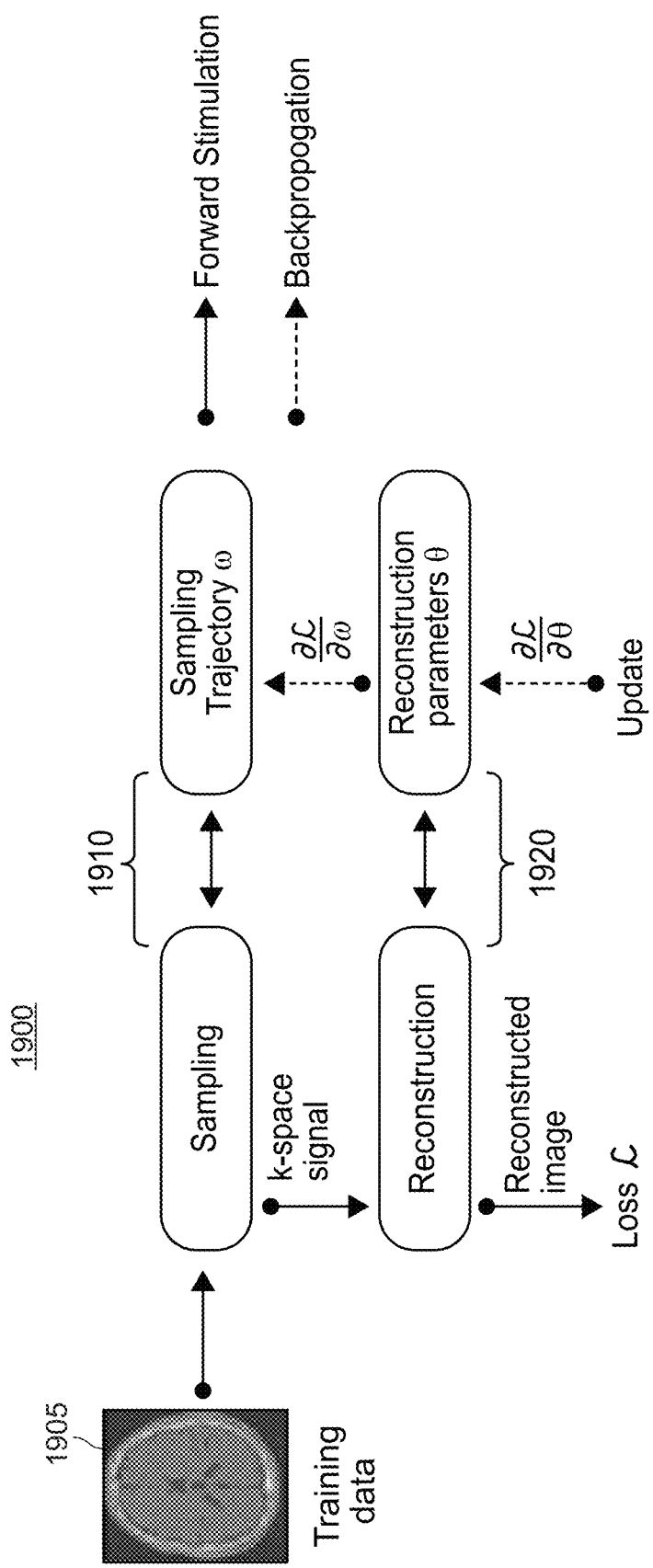
FIG. 19 illustrates an overview corresponding to an embodiment for training a MRI machine learning algorithm.

FIG. 19 illustrates a basic overview corresponding to an embodiment of SNOPY for training the MRI machine learning algorithm. As illustrated, the training data 1905 is used at blocks 1910 to optimize the sampling trajectory ($\omega$), and used at blocks 1920 to update the reconstruction parameters ($\theta$).

A.1 Optimization Objectives

The following section will describe the optimization objectives. Because some embodiments propose to use a stochastic gradient descent-type optimization algorithm, the objective function, or loss function, is by default defined on a mini-batch of data. The final loss function may be a linear combination of the following loss terms to ensure the optimized trajectory has multiple desired properties.

A.1.1 Image Quality

For many MRI applications, efficient acquisition and reconstruction aim to produce high-quality images. Consequently, the learning objective should encourage images reconstructed from sampled k-space signals to be close to the reference image.

Some embodiments formulate this similarity objective as the following image quality training loss:

$$\mathcal{L}_{recon} = \|f_{\theta,\omega}(A(\omega)x+\epsilon) - x\| \qquad \text{eq. (B-1)}$$

Here, $\omega(c) \in \mathbb{R}^{N_{fe} \times N_s \times N_d}$ denotes the trajectory to be optimized, with $N_s$ shots, $N_{fe}$ sampling points in each shot, and $N_d$ image dimensions. c denotes the parameterization coefficients that will be discussed elsewhere herein. For 3D MRI $N_d$=3. x is a mini-batch of data from the training set $\chi$. $\epsilon$ is simulated complex Gaussian noise. $A(\omega)$ is the forward system matrix for sampling trajectory $\omega$ [Fessler J A, Sutton B P. Nonuniform Fast Fourier Transforms Using Min-max Interpolation. IEEE Trans Sig Process 2003 February; 51(2): 560-74.]. A may also incorporate multicoil-sensitivity information [Pruessmann K P, Weiger M, Bornert P, Boesiger P. Advances in Sensitivity Encoding with Arbitrary k-space Trajectories. Magn Reson Med 2001; 46(4):638-651.] and field inhomogeneity [Fessler J A, Lee S, Olafsson V T, Shi H R, Noll D C. Toeplitzbased Iterative Image Reconstruction for MRI with Correction for Magnetic Field Inhomogeneity. IEEE Trans Sig Process 2005 September; 53(9): 3393-402.] 0 denotes the reconstruction algorithm's parameters. $\theta$ may be kernel weights in a convolutional neural network (CNN), or the regularizer coefficient in a model-based reconstruction method. The term $\|\cdot\|$ may be $\ell_1$ norm, $\ell_2$ norm, or a combination of both. There are also other ways to measure the distance between x and $f_{\theta,\omega}(A(\omega)x+\epsilon)$, such as the structural similarity index (SSIM) [Wang Z, Bovik A C, Sheikh H R, Simoncelli E P. Image Quality Assessment: From Error Visibility to Structural Similarity. IEEE Trans Image Process 2004 April; 13(4): 600-612.]. For simplicity, this work used a linear combination of $\ell_1$ norm and square-of-$\ell_2$ norm.

A.1.2 Hardware Limits

The gradient system of MR scanners has physical constraints, namely maximum gradient strength and slew rate. It is desirable to enforce a set of constraints of the form $$\|g_i[j,:]\|_2 \le g_{max}, g_i = D_1 \omega[:,i,:]/(\gamma \Delta t) \in \mathbb{R}^{(N_{fe}-1) \times N_d}$$

for every shot i=1, . . . , $N_s$ and time sample j=1, where $g_i$ denotes the gradient strength of the i shot and $g_{max}$ denotes the desired gradient upper bound. Some embodiments use a Euclidean norm along the spatial axis so that any 3D rotation of the sampling trajectory still obeys the constraint. A similar constraint is enforced on the Euclidean norm of the slew rate $s_i = D_2 \omega[",i,:]/(\gamma \Delta t^2)$, where $D_1$ and $D_2$ denote first-order and second-order finite difference operators applied along the readout dimension, and $\Delta t$ is the raster time interval and $\gamma$ is the gyromagnetic ratio.

To make the optimization more practical [Wang G, Luo T, Nielsen J F, Noll D C, Fessler J A. B-Spline Parameterized Joint Optimization of Reconstruction and K-Space Trajectories (BJORK) for Accelerated 2D MRI. IEEE Trans Med Imaging 2022 September; 41(9):2318-2330. Weiss T, Senouf O, Vedula S, Michailovich O, Zibulevsky M, Bronstein A. PILOT: Physics-Informed Learned Optimized Trajectories for Accelerated MRI. MELBA 2021; p. 1-23.], some embodiments formulate the hardware constraint as a soft penalty term:

$$\mathcal{L}_g = \sum_{i=1}^{N_s} \sum_{j=1}^{N_{fe}-1} \phi_{g_{max}}(\|g_i[j,:]\|_2) \qquad \text{eq. (B-2)}$$

$$\mathcal{L}_s = \sum_{i=1}^{N_s} \sum_{j=1}^{N_{fe}-2} \phi_{s_{max}}(\|s_i[j,:]\|_2) \qquad \text{eq. (B-3)}$$

Here, $\phi$ is a penalty function, and a soft-thresholding function $\phi_\lambda(x) = \max(|x|-\lambda, 0)$ is used. Since $\phi$ here is a soft penalty and the optimization results may exceed $s_{max}$ and a $g_{max}$, $s_{max}$ and $g_{max}$ may be slightly lower than the scanner's physical limits to make the optimization results feasible on the scanner.

A.1.3 Suppression of PNS Effect 3D imaging often leads to stronger PNS effects than 2D imaging because of the additional gradient axis. To quantify possible PNS effects of candidate gradient waveforms, some embodiments use the convolution model in [Schulte R F, Noeske R. Peripheral Nerve Stimulation-Optimal Gradient Waveform Design. Magn Reson Med 2015; 74(2):518-522.]:

$$R_{id}(t) = \frac{1}{s_{min}} \int_0^\tau \frac{s_{id}(\theta)c}{(c+1-\theta)^2} d\theta \qquad \text{eq. (B-4)}$$

where $R_{id}$ denotes the PNS effect of the gradient waveform from the ith shot and the dth dimension. $s_{id}$ is the slew rate of the ith shot in the dth dimension. c (chronaxie) and $s_{min}$ (minimum stimulation slew rate) are scanner parameters.

Likewise, some embodiments discretize the convolution model and formulate a soft penalty term as the following loss function:

$$P_{id}[j] = \sum_{k=1}^{j} \frac{s_{id}[j]c\Delta t}{s_{min}(c + j\Delta t - k\Delta t)^2} \quad \text{eq. (B-5)}$$

$$\mathcal{L}_{pns} = \sum_{i=1}^{N_s} \sum_{j=1}^{N_{fe}} \phi_{p_{max}}\left(\left(\sum_{d=1}^{N_d} P_{id}[j]^2\right)^{1/2}\right)$$

Again, $\phi$ denotes the soft-thresholding function, with PNS threshold $p_{max}$ (usually ≤80% [Schulte R F, Noeske R. Peripheral Nerve Stimulation-Optimal Gradient Waveform Design. Magn Reson Med 2015; 74(2):518-522]). This model combines the 3 spatial axes via the sum-of-squares manner, and does not consider the anisotropic response of PNS34. The implementation may use an FFT (with zero padding) to implement this convolution efficiently.

A.1.4 Image Contrast

In many applications, the optimized sampling trajectory should maintain certain parameter-weighted contrasts. For example, ideally the (gradient) echo time (TE) should be identical for each shot. Again some embodiments replace this hard constraint with an echo time penalty. Other parameters, such as repetition time (TR) and inversion time (TI), may be predetermined in the RF pulse design. Specifically, the corresponding loss function encourages the sampling trajectory to cross the k-space center at certain time points:

$$\mathcal{L}_c = \Sigma_{(i,j,d) \in C} \phi_0(|\omega[i,j,d]|) \quad \text{eq. (B-6)}$$

where C is a collection of gradient time points that are constrained to cross k-space zero point. $\phi$ is still a soft-thresholding function, with threshold 0.

A.2 Reconstruction

In eq. (B-1), the reconstruction algorithm $f_{\theta,\omega}(\cdot)$ may be various algorithms. Consider a typical cost function for regularized MR image reconstruction $$\hat{x} = \arg\min_{x} \|A(\omega)x - y\|_2^2 + \mathcal{R}(x) \quad \text{eq. (B-7)}$$

$\mathcal{R}(x)$ here can be a Tikhonov regularization $\lambda\|x\|_2^2$ (CG-SENSE [Maier O, et al. CG-SENSE Revisited: Results from the First ISMRM Reproducibility Challenge. Magn Reson Med 2021; 85(4):1821-1839.]), a sparsity penalty $\lambda\|Tx\|_1$ (compressed sensing [Lustig M, Donoho D L, Santos J M, Pauly J M. Compressed Sensing MRI. IEEE Signal Process Mag 2008 March; 25(2):72-82.]), Tis a finite-difference operator), a roughness penalty $\lambda\|Tx\|_2^2$ (penalized least squares (PLS)), or a neural network (model-based deep learning (MoDL) [Aggarwal H K, Mani M P, Jacob M. MoDL: Model-based Deep Learning Architecture for Inverse Problems. IEEE Trans Med]. Later sections will show that different reconstruction algorithms lead to distinct optimized sampling trajectories.

To obtain a reconstruction estimation, $\hat{x}$, some embodiments use corresponding iterative reconstruction algorithms. Specifically, the algorithm may be step-wise differentiable (or sub-differentiable) to enable differentiable programming. The backpropagation uses the chain rule to traverse every step of the iterative algorithm to calculate the gradient w.r.t. variables such as $\omega$.

A.3 Parameterization

As is shown in [Wang G, Luo T, Nielsen J F, Noll D C, Fessler J A. B-Spline Parameterized Joint Optimization of Reconstruction and K-Space Trajectories (BJORK) for Accelerate], directly optimizing every k-space sampling point (or equivalently every gradient waveform time point) may lead to sub-optimal results. Additionally, in many applications it is desirable to optimize certain properties of existing sampling patterns, such as the rotation angles of a multishot spiral trajectory, so that the optimized trajectory can be easily integrated into existing workflows. For these cases, some embodiments propose two parameterization strategies.

The first approach, spline-based freeform optimization, is to represent the sampling pattern using a linear basis, i.e., $\omega=Bc$, where B is a matrix of samples of a basis such as quadratic B-spline kernels and c denotes the coefficients to be optimized [Wang G, Luo T, Nielsen J F, Noll D C, Fessler J A. B-Spline Parameterized Joint Optimization of Reconstruction and K-Space Trajectories (BJORK) for Accelerated 2D MRI. IEEE Trans Med Imaging 2022 September; 41(9):2318-2330. Weiss T, Senouf O, Vedula S, Michailovich O, Zibulevsky M, Bronstein A. PILOT: Physics-Informed Learned Optimized Trajectories for Accelerated MRI. MELBA 2021; p. 1-23.]. This approach fully exploits the generality of a gradient system. Using a linear parameterization such as B-splines reduces the degrees of freedom and facilitates applying hardware constraints [Wang G, Luo T, Nielsen J F, Noll D C, Fessler J A. B-Spline Parameterized Joint Optimization of Reconstruction and K-Space Trajectories (BJORK) for Accelerated 2D MRI. IEEE Trans Med Imaging 2022 September; 41(9):2318-2330. Hao S, Fessler J A, Noll D C, Nielsen J F. Joint Design of Excitation k-Space Trajectory and RF Pulse for Small-Tip 3D Tailored Excitation in MRI. IEEE Trans Med Imaging 2016 February; 35(2):468-479.]. Additionally, it enables multiscale optimization for avoiding sub-optimal local minima and further improving optimization results [Lazarus C, et al. SPARKLING: Variable-density K-space Filling Curves for Accelerated T2*-weighted MRI. Mag Res Med 2019 June; 81(6):3643-61. Wang G, Luo T, Nielsen J F, Noll D C, Fessler J A. B-Spline Parameterized Joint Optimization of Reconstruction and K-Space Trajectories (BJORK) for Accelerated 2D MRI. IEEE Trans Med Imaging 2022 September; 41(9):2318-2330. Weiss T, Senouf O, Vedula S, Michailovich O, Zibulevsky M, Bronstein A. PILOT: Physics-Informed Learned Optimized Trajectories for Accelerated MRI. MELBA 2021; p. 1-23.]. However, the freeformly optimized trajectory could have implementation challenges. For example, some MRI systems cannot restore hundreds of different gradient waveforms.

The second approach is to optimize attributes (c) of existing trajectories such as rotation angles, where $\omega(c)$ is a nonlinear function of the parameters. The trajectory parameterization should be differentiable in c to enable differentiable programming. This approach is easier to implement on scanners, and may work with existing workflows, such as reconstruction and eddy-current correction, with minimal modification.

A.4 Efficient and Accurate Jacobian Calculation

In optimization, the sampling trajectory is embedded in the forward system matrix within the similarity loss eq. (B-1). The system matrix for non-Cartesian sampling usually includes a NUFFT operation [Fessler J A, Sutton B P. Nonuniform Fast Fourier TransformsvUsing Min-max Interpolation. IEEE Trans Sig Process 2003 February; 51(2):560-74.]. Updating the sampling trajectory in each optimization step requires the Jacobian, or the gradient w.r.t. the sampling trajectory. The NUFFT operator typically involves interpolation in the frequency domain, which is non-differentiable in typical implementations due to rounding operations. Several previous works used auto-differentiation (with sub-gradients) to calculate an approximate numerical gradient [Weiss T, Senouf O, Vedula S, Michailovich O, Zibulevsky M, Bronstein A. PILOT: Physics-Informed Learned Optimized Trajectories for Accelerated MRI. MELBA 2021; p. 1-23. Alush-Aben J, Ackerman-Schraier L, Weiss T, Vedula S, Senouf O, Bronstein A. 3D FLAT: Feasible Learned Acquisition Trajectories for Accelerated MRI. In: Deeba F, Johnson P, Würfl T, Ye J C, editors. Mach. Learn. Med. Image Reconstr. Lecture Notes in Computer Science, Cham: Springer International Publishing; 2020. p. 3-16.], but that approach is inaccurate and slow [Wang G, Fessler J A, Efficient Approximation of Jacobian Matrices Involving a Non-uniform Fast Fourier Transform (NUFFT); 2021. https://arxiv.org/abs/2111.02912.]. Some embodiments derived an efficient and accurate Jacobian approximation method [Id.]. For example, the efficient Jacobian of a forward system model A is:

$$\frac{\partial Ax}{\partial \omega^{[d]}} = -i \text{diag}\{A(x \odot r^{[d]})\} \quad \text{eq. (B-8)}$$

where $d \in \{1,2,3\}$ denotes a spatial dimension, and $r^{[d]}$ denotes the Euclidean spatial grid. Calculating this Jacobian simply uses another NUFFT, which is more efficient than the auto-differentiation approach. The article [Wang G, Fessler J A, Efficient Approximation of Jacobian Matrices Involving a Non-uniform Fast Fourier Transform (NUFFT); 2021. https://arxiv.org/abs/2111.02912.] illustrates additional cases, such as $$\frac{\partial A'Ax}{\partial \omega^{[d]}}$$

and the detailed derivation.

A.5 Efficient Optimization

A.5.1 Optimizer

Generally, to optimize the sampling trajectory ω and other parameters (such as reconstruction parameters θ) via stochastic gradient descent-like methods, each update needs to take a gradient step (in the simplest form)

$$\theta^K = \theta^{K-1} - \eta_\theta \frac{\partial \mathcal{L}}{\partial \theta}(\theta^{K-1}, \omega^{K-1})$$

$$\omega^K = \omega^{K-1} - \eta_\omega \frac{\partial \mathcal{L}}{\partial \omega}(\omega^{K-1}, \theta^{K-1})$$

where $\mathcal{L}$ is the loss function described in Section A.1 and where $\eta_\theta$ and $\eta_\omega$ denote step-size parameters.

The optimization is highly non-convex and may suffer from sub-optimal local minima. Some embodiments use stochastic gradient Langevin dynamics (SGLD) [Welling M, Teh Y W. Bayesian Learning via Stochastic Gradient Langevin Dynamics. In: Proc. 28th Int. Conf. Int. Conf. Mach. Learn (ICML). Madison, Wis., USA: Omnipress; 2011. p. 681-688.] as the optimizer to improve results and accelerate training. Each update of SGLD injects Gaussian noise into the gradient to introduce randomness $$\theta^K = \theta^{K-1} - \eta_\theta \frac{\partial \mathcal{L}}{\partial \theta^{K-1}} + \sqrt{2\eta_\theta} \mathcal{N}(0,1) \quad \text{eq. (B-9)}$$

$$\omega^K = \omega^{K-1} - \eta_\omega \frac{\partial \mathcal{L}}{\partial \omega^{K-1}} + \sqrt{2\eta_\omega} \mathcal{N}(0,1)$$

A.5.2 Memory Saving Techniques

Due to the large dimension, the memory cost for naive 3D trajectory optimization would be prohibitively intensive. Some embodiments develop several techniques to reduce memory use and accelerate training.

As discussed above, the efficient Jacobian approximation uses only 10% of the memory used in the standard auto-differentiation approach [Wang G, Fessler J A, Efficient Approximation of Jacobian Matrices Involving a Non-uniform Fast Fourier Transform (NUFFT); 2021. https://arxiv.org/abs/2111.02912]. Some embodiments also used in-place operations in certain reconstruction steps, such as the conjugate gradient (CG) method because with careful design it will still permit auto-differentiation. The primary memory bottleneck is with the 3D NUFFT operators. Some embodiments pre-calculate the Toeplitz embedding kernel to save memory and accelerate computation [Fessler J A, Lee S, Olafsson V T, Shi H R, Noll D C. Toeplitz-based Iterative Image Reconstruction for MRI with Correction for Magnetic Field Inhomogeneity. IEEE Trans Sig Process 2005 September; 53(9):3393-402. Muckley M J, Stern R, Murrell T, Knoll F. TorchKbNufft: A High-Level, Hardware-Agnostic Non-Uniform Fast Fourier Transform. In: ISMRM Workshop on Data Sampling & Image Reconstruction; 2020.]. In the training phase, some embodiments use a NUFFT with lower accuracy, for instance, with a smaller oversampling ratio for gridding [Wang G, Fessler J A, Efficient Approximation of Jacobian Matrices Involving a Non-uniform Fast Fourier Transform (NUFFT); 2021. https://arxiv.org/abs/2111.02912.]. Table 7 shows the incrementally improved efficiency achieved with these techniques. Without the proposed techniques, optimizing 3D trajectories would require hundreds of gigabytes of memory, which would be impractical. SNOPY enables solving this otherwise prohibitively large problem on a single graphic card (GPU).

TABLE 6

| Plain | +Efficient Jacobian | +In-place ops | +Toeplitz embedding | +Low-res NUFFT |
|---|---|---|---|---|
| 5.7 GB/ 10.4 s | 272 MB/ 1.9 s | 253 MB/ 1.6 s | 268 MB/ 0.4 s | 136 MB/ 0.2 s |

B. Methods

B.1 Datasets

Some embodiments use two publicly available datasets, both of which contain 3D multi-coil raw k-space data. SKM-TEA [Desai A D, Schmidt A M, Rubin E B, Sandino C M, Black M S, Mazzoli V, et al., SKM-TEA: A Dataset for Accelerated MRI Reconstruction with Dense Image Labels for Quantitative Clinical Evaluation; 2022. http://arxiv.org/abs/2203.06823.] is a 3D quantitative double-echo steady-state (qDESS [Welsch G H, Scheffler K, Mamisch T C, Hughes T, Millington S, Deimling M, et al. Rapid Estimation of Cartilage T2 Based on Double Echo at Steady State (DESS) with 3 Tesla. Magn Reson Med 2009; 62(2):544-549.]) knee dataset. It was acquired by 3 T GE MR750 scanners and 15/16-channel receiver coils. SKM-TEA includes 155 subjects. Some embodiments used 132 for training, 10 for validation, and 13 for the test. Calgary brain dataset [Souza R, Lucena O, Garrafa J, Gobbi D, Saluzzi M, Appenzeller S, et al. An Open, Multi-vendor, Multi-field-strength Brain M R Dataset and Analysis of Publicly Available Skull Stripping Methods Agreement. NeuroImage 2018; 170:482-494.] is a 3D brain T1w MP-RAGE [Brant-Zawadzki M, Gillan G D, Nitz W R. MP RAGE: A Three-Dimensional, T1-weighted, Gradient-Echo Sequence—Initial Experience in the Brain. Radiology 1992 March; 182 (3):769-775.] k-space dataset. It includes 67 available subjects, acquired by an MR750 scanner and 12-channel head coils. Some embodiments used 50 for training, 6 for validation, and 7 for testing. All receiver coil sensitivity maps were calculated by ESPIRiT [Uecker M, et al. ESPIRiT—An Eigenvalue Approach to Autocalibrating Parallel MRI: Where SENSE Meets GRAPPA. Mag Reson Med 2014 March; 71(3):990-1001.].

8.2 Simulation Experiments

Some experiments experimented with multiple scenarios to show the broad applicability of the proposed method. These experiments used a server node equipped with an Nvidia Tesla A40 GPU for training.

B.2.1 Optimizing 3D Gradient Waveform

Some experiments optimized the sampling trajectory with a 3D radial ("kooshball") initialization [Barger A V, Block W F, Toropov Y, Grist T M, Mistretta C A. Time-Resolved Contrast-Enhanced Imaging with Isotropic Resolution and Broad Coverage Using an Undersampled 3D Projection Trajectory. Magn Reson Med 2002; 48(2):297-305. Herrmann K H, Kramer M, Reichenbach J R. Time Efficient 3D Radial UTE Sampling with Fully Automatic Delay Compensation on a Clinical 3 T MR Scanner. PLOS ONE 2016 March; 11(3):e0150371.]. As described in above, some experiments directly optimized the readout waveform of each shot. The trajectory may be parameterized by B-spline kernels to reduce the number of degrees of freedom and enable multi-scale optimization. The initial 3D radial trajectory had a 5.1 2 ms readout (raster time=4 μs) and 1024 spokes/shots (8× acceleration), using the rotation angle described in [Chaithya G R, Weiss P, Daval-Frérot G, Massire A, Vignaud A, Ciuciu P. Optimizing Full 3D SPARKLING Trajectories for High-Resolution Magnetic Resonance Imaging. IEEE Trans Med Imaging 2022 August; 41(8):2105-2117.]. The training used the SKM-TEA dataset. The FOV was 15.8×15.8×5.1 cm with 1 mm³ resolution. The receiver bandwidth was +125 kHz. The training loss was $$\mathcal{L} = \mathcal{L}_{recon} + 0.1\mathcal{L} + 0.1\mathcal{L} + \mathcal{L}_{pns}$$

The gradient strength ($g_{max}$), slew rate ($s_{max}$), and PNS threshold ($p_{max}$) were 50 mT/m, 150 T/m/s, 80%, respectively. The learning rate $\eta_\omega$ decayed from 1e-4 to 0 linearly. For the multi-level optimization, some experiments used 3 levels (with B-spline kernel widths=32, 16, and 8 time samples), and each level used 200 epochs. The total training time was ~180 hours. Some experiments also optimized the trajectory for several image reconstruction algorithms. Some experiments used a regularizer weight of 1 e-3 and 30 CG iterations for CG-SENSE and PLS. For learning-based reconstruction, some experiments used the MoDL [Aggarwal H K, Mani M P, Jacob M. MoDL: Model-based Deep Learning Architecture for Inverse Problems. IEEE Trans Med Imaging 2019 February; 38(2):394-405.] approach that alternates between a neural network-based denoiser and data consistency updates. Some experiments used a 3D version of the denoising network [Yu S, Park B, Jeong J. Deep Iterative Down-up CNN for Image Denoising. In: Proc. of the IEEE Conf. on Comput. Vis. and Patt. Recog. Work. (CVPRW); 2019. p. 0-0.], 20 CG iterations for the data consistency update, and 6 outer iterations. Similar to previous investigations [Aggarwal H K, Jacob M. Joint Optimization of Sampling Patterns and Deep Priors for Improved Parallel MRI. In: 2020 IEEE Intl. Conf. on Acous., Speech and Sig. Process. (ICASSP); 2020. p. 8901-8905. Wang G, Luo T, Nielsen J F, Noll D C, Fessler J A. B-Spline Parameterized Joint Optimization of Reconstruction and K-Space Trajectories (BJORK) for Accelerated 2D MRI. IEEE Trans Med Imaging 2022 September; 41(9):2318-2330.], SNOPY jointly optimized the neural network's parameters and the sampling trajectories using [Lee J H, Hargreaves B A, Hu B S, Nishimura D G. Fast 3D Imaging Using Variable-density Spiral Trajectories with Applications to Limb Perfusion. Magn Reson Med 2003; 50(6):1276-1285.].

Figure 20:
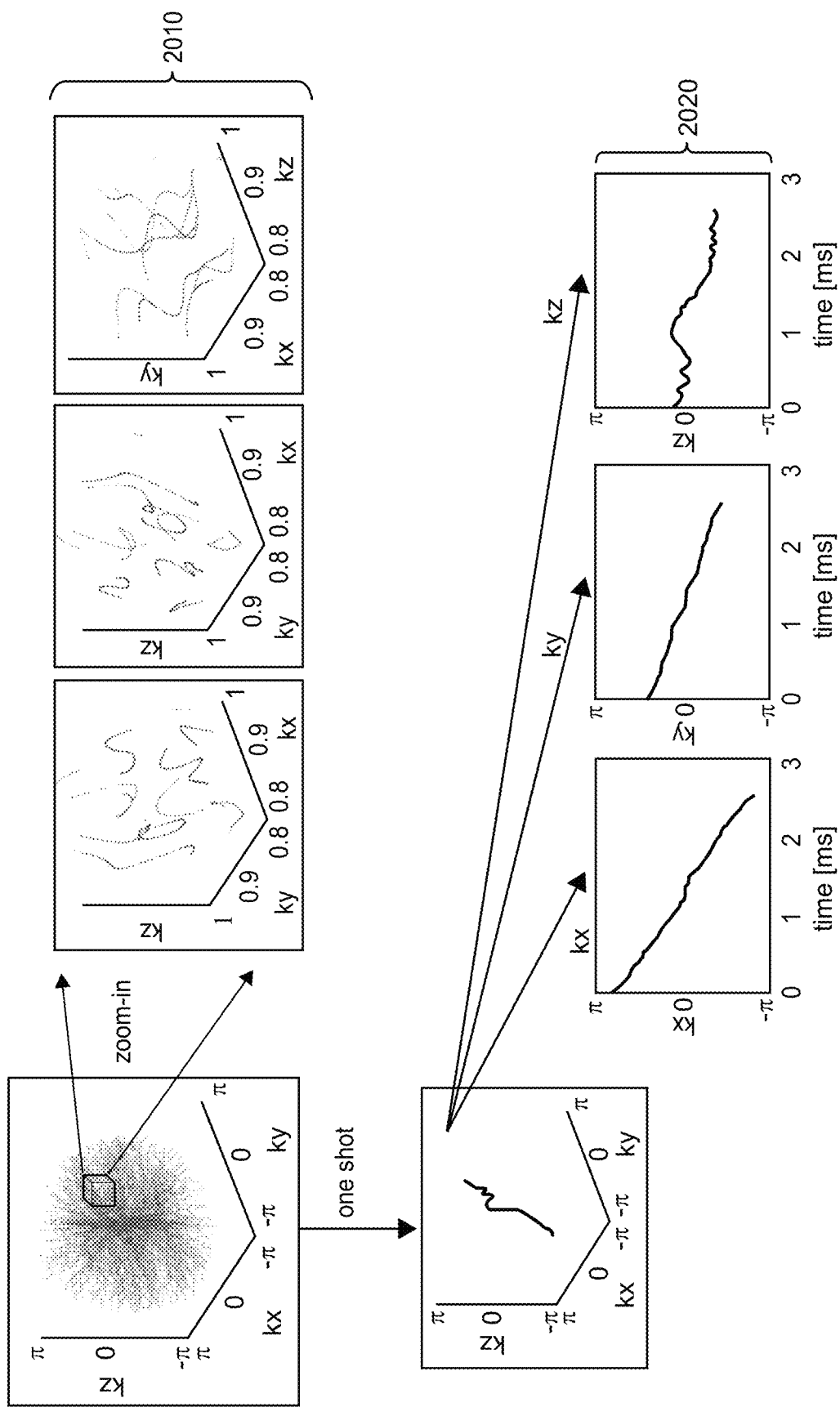
FIG. 20 illustrates example training.
Figure 21:
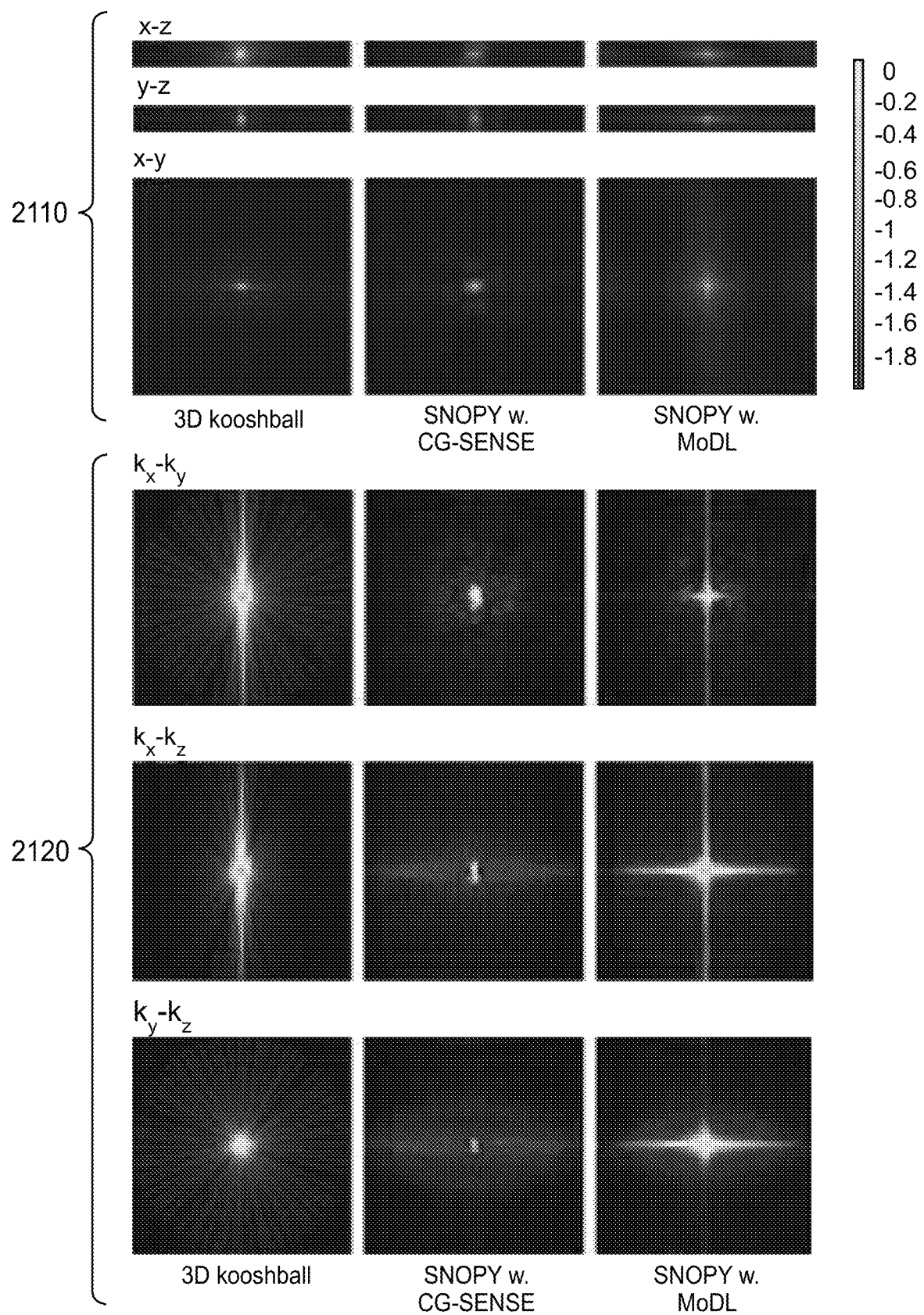
FIG. 21 illustrates example visualizations of the experiment of FIG. 20.
Figure 22:
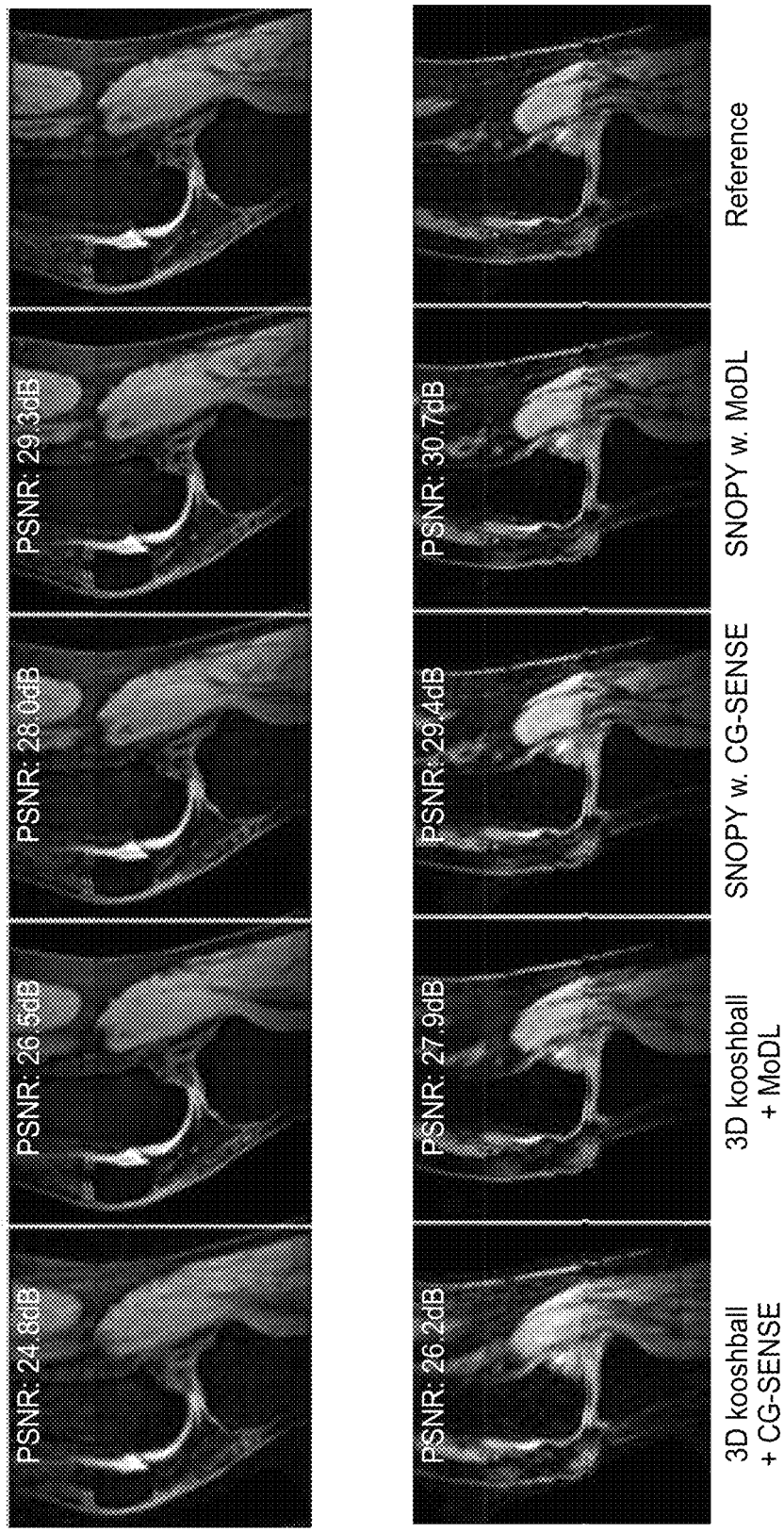
FIG. 22 illustrates examples of the reconstructed images for two knee slices in experiment of FIG. 20.

The results of the experiments described in this section are illustrated in FIGS. 20-22. More specifically, FIG. 20 illustrates the optimized sampling trajectory of the experiments. The training involves a particular dataset (SKM-TEA dataset) and a particular reconstruction (MoDL37 reconstruction). The upper row 2010 includes illustrations of zoomed-in regions from different perspectives. The lower row 2020 includes illustrations of one shots from different perspectives.

FIG. 21 illustrates a visualization of the optimized trajectory. 2110 illustrates PSFs (log-scaled, single-coil) of trajectories optimized with different reconstruction methods. 2120 illustrates the density of sampling trajectories, by convolving the sampling points with a Gaussian kernel. The three rows are central profiles from three perspectives.

FIG. 22 illustrates examples of reconstructed images for two knee slices from the experiments.

B.2.2 Optimizing Rotation Angles of Stack-of-Stars Trajectory

This section describes an experiment that optimized the rotation angles of the stack-of-stars. The training used Calgary brain dataset. The experiment further used PLS as the reconstruction method for simplicity, with $\lambda=10^{-3}$ and 30 iterations. The experiment used 200 epochs and a learning rate linearly decaying from 1e-4 to 0. The FOV was 25.6× 21.8×3.2 cm and the resolution is 1 mm³. The experiment used 40 spokes per kz location (6× acceleration), and 1280 spokes in total. The readout length was 3.5 ms. The receiver bandwidth was, ±125 kHz. The trajectory was a stack of 32 stars, so some embodiments optimized 1280 rotation angles c.

Since optimizing rotation angles does not impact the gradient strength, slew rate, PNS, and image contrast, the experiment used only the reconstruction loss $\mathcal{L} = \mathcal{L}_{recon}$. It is possible to regard the method (RSOS-GR) proposed in [Zhou Z, Han F, Yan L, Wang D J J, Hu P. Golden-Ratio Rotated Stack-of-Stars Acquisition for Improved Volumetric MRI. Magn Reson Med 2017; 78(6)2290-2298.] as the best currently available scheme. The experiment applied 200 epochs with a linearly decaying learning rate from 1e-3 to 0. The training cost was ~20 hours.

The results of the experiment described in this section are illustrated in the examples of FIGS. 23A and 23B. More specifically, FIGS. 23A and 23B illustrate optimizing the rotation angles of the stack-of-stars (6× acceleration). 'Best empirical' uses the design from [Zhou Z, Han F, Yan L, Wang D J J, Hu P. Golden-Ratio Rotated Stack-of-Stars Acquisition for Improved Volumetric MRI. Magn Reson Med 2017; 78(6):2290-2298.]. FIG. 23A shows two slices from prospective in-vivo experiments. The reconstruction algorithm was PLS. Avg. PSNR is the average PSNR of the 4 subjects compared to the fully sampled reference. FIG. 23B shows the log-scaled PSF (single-coil) of two trajectories.

B.2.3 PNS Suppression of 3D Rotational EPI Trajectory for Functional Imaging

A further experiment optimized the rotation EPI (REPI) trajectory [Rettenmeier C A, Maziero D, Stenger V A. Three Dimensional Radial Echo Planar Imaging for Functional MRI. Magn Reson Med 2022; 87(1)193-206.], which provides an efficient sampling strategy for fMRI. For higher resolution (i.e., ≤1 mm), it was found that subjects may experience strong PNS effects introduced by REPI. This experiment aimed to reduce the PNS effect of REPI while preserving the original image contrast. The experiment optimized one shot/readout waveform of REPI with a B-spline kernel with a width of 16 to parameterize the trajectory, and rotated the optimized readout shot using the angle scheme similar to [Id.].

The experiment designed the REPI readout for an oscillating stead steady imaging (OSSI) sequence, a novel fMRI signal model that can improve the SNR [Guo S, Noll D C. Oscillating Steady-State Imaging (OSSI): A Novel Method for Functional MRI. Magn Reson Med 2020; 84(2):698-712. Guo S, Fessler J A, Noll D C. High-Resolution Oscillating Steady-State fMRI Using Patch-Tensor Low-Rank Reconstruction. IEEE Trans Med Imaging 2020 December; 39(12):4357-4368.]. The FOV is 20×20×1.2 cm, with 1 mm$^3$ isotropic resolution, TR=16 ms, and TE=7.4 ms. The readout length is 10.6 ms. The receiver bandwidth is, ±250 kHz.

To accelerate training, the loss term here excluded the reconstruction loss $\mathcal{L}_{recon}$:

$$\mathcal{L} = 0.01\mathcal{L}_g + 0.01\mathcal{L}_s + \mathcal{L}_{pns} + \mathcal{L}_C$$

The training used 40,000 steps, with a learning rate decaying linearly from 1e-4 to 0. The training cost was ~1 hours.

8.3 In-Vivo Experiments

Some experiments implemented the optimized trajectory prospectively on a GE UHP 3.0 T scanner equipped with a Nova Medical 32-channel head coil. Participants gave informed consent under local IRB approval. Because the cache in the MR system cannot load hundreds of distinct gradient waveforms, the experiment from section B.2.1 above was not implemented prospectively. Corresponding 2D prospective studies [Wang G, Luo T, Nielsen J F, Noll D C, Fessler J A. B-Spline Parameterized Joint Optimization of Reconstruction and K-Space Trajectories (BJORK) for Accelerated 2D MRI. IEEE Trans Med Imaging 2022 September; 41(9):2318-2330.] may be referred to for image quality improvement and correction of eddy current effects. For the experiment in B.2.2, the sampling was programmed with a trajectory of a 3D T1w fat-saturated GRE sequence [Nielsen J F, Noll D C. TOPPE: a framework for rapid prototyping of MR pulse sequences. Magn Reson Med 2018; 79(6):3128-3134.], with TR/TE=14/3.2 ms and FA=20°. The experiment included 4 healthy subjects. For the experiment in B.2.3, to rate the PNS effect, 3 participants scored the nerve stimulation with a 5-point Likert scale from 'mild tingling' to 'strong muscular twitch.'

C Results

FIG. 20 shows an example of the optimized trajectory with zoomed-in regions and plots of a single shot for the spline-based freeform optimization experiment delineated in B.2.1. Similar to the 2D case [Wang G, Luo T, Nielsen J F, Noll D C, Fessler J A. B-Spline Parameterized Joint Optimization of Reconstruction and K-Space Trajectories (BJORK) for Accelerated 2D MRI. IEEE Trans Med Imaging 2022 September; 41(9):2318-2330.] and SPARKLING [Chaithya G R, Weiss P, Daval-Frérot G, Massire A, Vignaud A, Ciuciu P. Optimizing Full 3D SPARKLING Trajectories for High-Resolution Magnetic Resonance Imaging. IEEE Trans Med Imaging 2022 August; 41(8):2105-2117. Lazarus C, et al. SPARKLING: Variable-density K-space Filling Curves for Accelerated T2*-weighted MRI. Mag Res Med 2019 June; 81(6):3643-61.], the multilevel B-spline optimization leads to a swirling trajectory that can cover more k-space in the fixed readout time, to reduce large gaps between sampling locations and thus help reduce aliasing artifacts. FIG. 21 displays point spread functions (PSF) of trajectories optimized jointly with different reconstruction algorithms. To visualize the sampling density in different regions of k-space, the experiment convolved the trajectory with a Gaussian kernel, and FIG. 21 shows the density of central profiles from different views. Compared with 3D kooshball, the SNOPY optimization led to fewer radial patterns in the PSF, corresponding to fewer streak artifacts in FIG. 22. Different reconstruction algorithms generated distinct optimized PSFs and densities, which agrees with previous studies [Wang G, Fessler J A, Efficient Approximation of Jacobian Matrices Involving a Non-uniform Fast Fourier Transform (NUFFT); 2021. https://arxiv.org/abs/2111.02912. Zibetti M V W, Herman G T, Regatte R R. Fast Data-Driven Learning of Parallel MRI Sampling Patterns for Large Scale Problems. Sci Rep 2021 September; 11(1): 19312. Gözcü B, Sanchez T, Cevher V. Rethinking Sampling in Parallel MRI: A Data-Driven Approach. In: 2019 27th Euro. Sig. Process. Conf. (EUSIPCO); 2019. p. 1-5.]. Table 8 lists the quantitative reconstruction quality of different trajectories. The image quality metric is the average peak signal-to-noise ratio (PSNR) of the test set. SNOPY led to ~4 dB higher PSNR than the kooshball initialization.

TABLE 8

|  | CG-SENSE | PLS | MoDL |
| --- | --- | --- | --- |
| 3D kooshball | 28.15 dB | 28.16 dB | 30.07 dB |
| SNOPY | 32.47 dB | 32.53 dB | 33.68 dB |

FIG. 22 includes examples of reconstructed images. Compared to kooshball, SNOPY's reconstructed images have fewer artifacts and blurring. Though MoDL reconstruction (and its variants) is one of the best reconstruction algorithms based on the open fastMRI reconstruction challenge [Muckley M J, Riemenschneider B, Radmanesh A, Kim S, Jeong G, Ko J, et al. Results of the 2020 fastMRI Challenge for Machine Learning MR Image Reconstruction. IEEE Trans Med Imaging 2021 September; 40(9):2306-2317.], many important structures are misplaced with the kooshball reconstruction. Using the SNOPY-optimized trajectory, even a simple model-based reconstruction (CG-SENSE) can reconstruct these structures.

FIGS. 23A and 23B show the PSF of the optimized angle and RSOS-GR angle scheme [Zhou Z, Han F, Yan L, Wang D J J, Hu P. Golden-Ratio Rotated Stack-of-Stars Acquisition for Improved Volumetric MRI. Magn Reson Med 2017; 78(6):2290-2298] for the experiment of B.2.2. For the in-plane (x-y) PSF, the SNOPY rotation shows noticeably reduced streak-like patterns. In the y-z direction, SNOPY optimization leads to a narrower central lobe and suppressed aliasing. The prospective in-vivo experiments also support this theoretical finding. In FIGS. 23A and 23B, the example slices (reconstructed by PLS) from prospective studies show that SNOPY reduces streaking artifacts and blurring. The average PSNR of SNOPY and RSOS-GR for the 4 participants were 39.23 dB and 37.84 dB, respectively.

Figure 23:
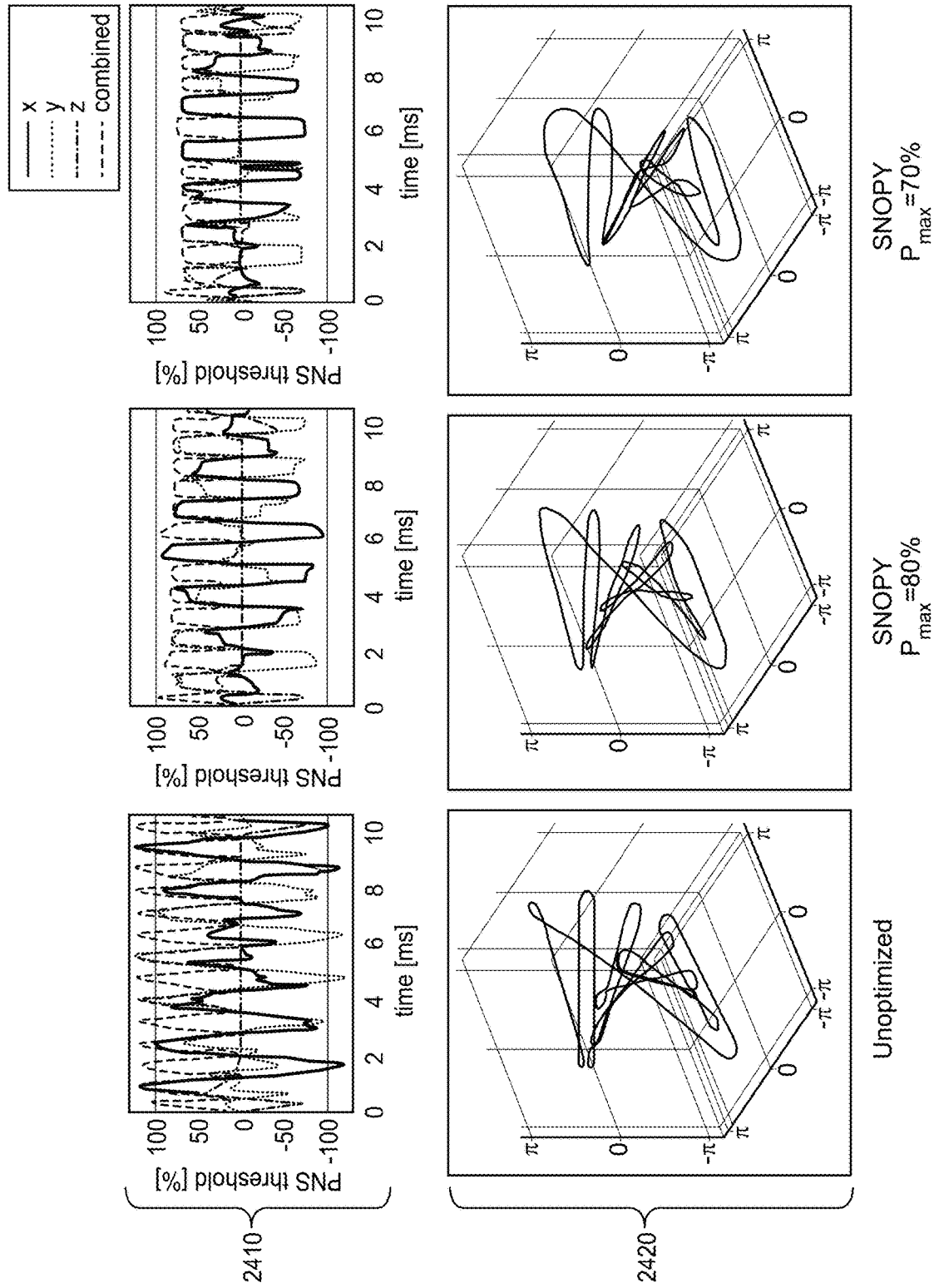
FIG. 23 shows, from an experiment, one shot before and after the optimization, and a plot of simulated PNS effects.

The experiment of B.2.3 tested three settings: unoptimized REPI, optimized with PNS threshold ($p_{max}$ in eq. (B-5))=80%, and optimized with $p_{max}$=70%. FIG. 23 shows one shot before and after the optimization, and a plot of simulated PNS effects. For the subjective rating of PNS, the first participant reported 5, 2, 1; the second participant reported 4, 3, 2; the third participant reported 5, 4, 3. The SNOPY optimization effectively reduced the subjective PNS effect of the given REPI readout in both simulation and in-vivo experiments. SNOPY smooths the trajectory to avoid a constantly high slew rate, preventing the high PNS effect. The first row 2410 plots the PNS effect calculated by the convolution model eq. (B-5) of the experiment of B.2.3. The second row 2420 shows one readout trajectory before/after the SNOPY optimization.

Figure 24:
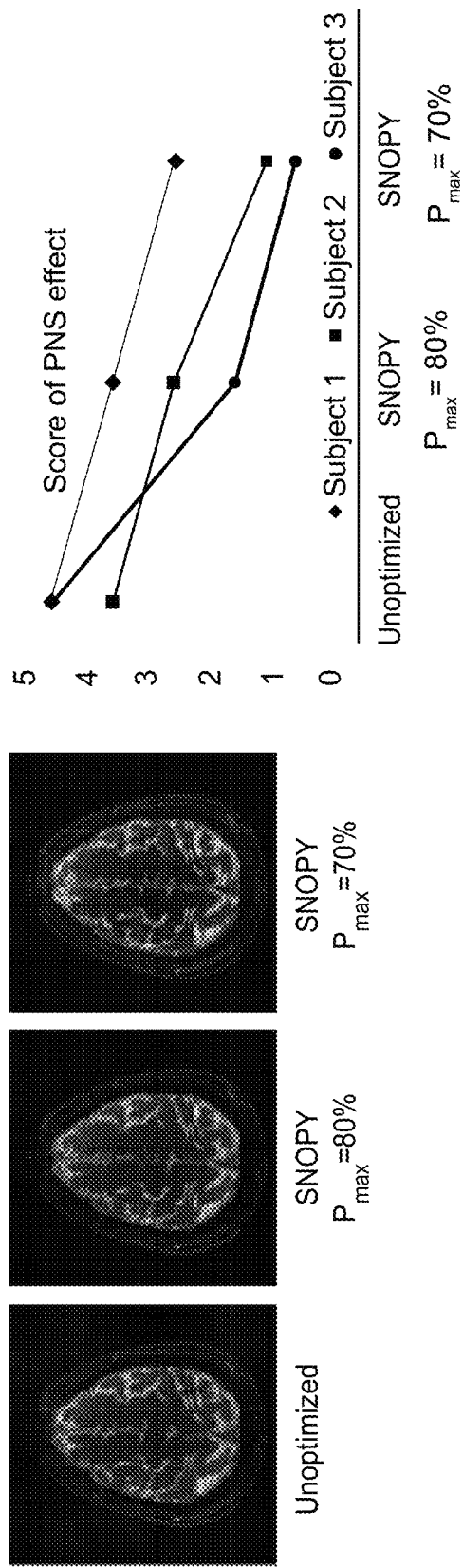
FIG. 24 shows one slice of reconstructed images corresponding to the experiment of FIG. 23.

FIG. 24 shows one slice of reconstructed images by the CS-SENSE algorithm. Though SNOPY suppressed the PNS effect, the image contrast was well preserved by the image contrast regularizer eq. (B-6).

C. Discussion

SNOPY presents a novel approach to optimizing non-Cartesian sampling trajectories. Via differentiable programming, SNOPY enables applying gradient-based and data-driven methods to trajectory design. Various applications and in-vivo experiments showed the applicability and robustness of SNOPY.

Experiments from B.2.1 and B.2.2 used training data to improve image quality by trajectory optimization. SNOPY may tailor the sampling trajectory to specific training datasets and reconstruction algorithms by formulating the reconstruction image quality as a training loss. An accompanying question is whether the learned sampling trajectories could overfit the training dataset. In the experiment of section B.2.2, the training set used an MP-RAGE sequence, while the prospective sequence was an RF-spoiled GRE. In a 2D experiment [Wang G, Luo T, Nielsen J F, Noll D C, Fessler J A. B-Spline Parameterized Joint Optimization of Reconstruction and K-Space Trajectories (BJORK) for Accelerated 2D MRI. IEEE Trans Med Imaging 2022 September; 41(9):2318-2330.], it was found that trajectories learned with one anatomy (brain), contrast (T1w), and a vendor still improved the image quality of other anatomies (such as the knee), contrasts (T2w), and vendors (GE).

These empirical studies indicate that trajectory optimization is robust to a moderate distribution shift between training and inference. An intuitive explanation is that SNOPY can improve the PSF by reducing the aliasing, and such improvement is universally beneficial.

An MRI system suffers from imperfections, such as field inhomogeneity [Sutton B P, Noll D C, Fessler J A. Fast, Iterative Image Reconstruction for MRI in the Presence of Field Inhomogeneities. IEEE Trans Med Imaging 2003 February; 22(2):178-188.], eddy currents [Ahn C B, Cho Z H. Analysis of the Eddy-Current Induced Artifacts and the Temporal Compensation in Nuclear Magnetic Resonance Imaging. IEEE Trans Med Imaging 1991 March; 10(1):47-52.], and gradient nonlinearity [Hidalgo-Tobon S s. Theory of Gradient Coil Design Methods for Magnetic Resonance Imaging. Concepts Magn Reson Part A 2010; 36A(4):223-242.]. Many correction approaches exist, such as B0-informed reconstruction [Fessler J A, Lee S, Olafsson V T, Shi H R, Noll D C. Toeplitzbased Iterative Image Reconstruction for MRI with Correction for Magnetic Field Inhomogeneity. IEEE Trans Sig Process 2005 September; 53(9):3393-402.] and trajectory mapping [Duyn J H, Yang Y, Frank J A, van der Veen J W. Simple correction method for k-space trajectory deviations in MRI. J Magn Reson 1998 May; 132:150-153. Robison R K, Li Z, Wang D, Ooi M B, Pipe J G. Correction of B0 Eddy Current E_ects in Spiral MRI. Magn Reson Med 2019; 81(4):2501-2513.].

SNOPY-optimized trajectories are compatible with these existing methods. For example, eddy-current corrections may be implemented for a 2D freeform optimized trajectory in [Wang G, Luo T, Nielsen J F, Noll D C, Fessler J A. B-Spline Parameterized Joint Optimization of Reconstruction and K-Space Trajectories (BJORK) for Accelerated 2D MRI. IEEE Trans Med Imaging 2022 September; 41(9): 2318-2330.]. It is also possible to consider these perfections in the forward learning/optimization phase, so the optimized trajectory has innate robustness to imperfections. For instance, the forward system model A in eq. (B-1) could include off-resonance maps. This prospective learning approach will require prior knowledge of the distribution of system imperfections, which is usually scanner-specific and hard to simulate.

SNOPY uses a relatively simplified model of PNS. More precise models, such as [Davids M, Guérin B, Vom Endt A, Schad L R, Wald L L. Prediction of Peripheral Nerve Stimulation Thresholds of MRI Gradient Coils Using Coupled Electromagnetic and Neurodynamic Simulations. Magn Reson Med 2019; 81(1):686-701.], may lead to improved PNS suppression results.

The training uses several loss terms, including image quality, PNS suppression, hardware limits, and image contrast. By combining these terms, the optimization can lead to trajectories that boast multiple desired characteristics. The weights of different loss terms were determined empirically. One may control the optimization results by altering the coefficients.

For example, with a larger coefficient of the hardware constraint loss, the trajectory will better conform to $s_{max}$ and $g_{max}$. Bayesian experiment design is also applicable to finding the optimal loss weights. Additionally, the training losses (constraints) may contradict each other, and the optimization may get stuck in a local minimizer. Several empirical solutions to this problem were considered. Similar to SPARKLING [Lazarus C, et al. SPARKLING: Variable-density K-space Filling Curves for Accelerated T2*-weighted MRI. Mag Res Med 2019 June; 81(6):3643-61.], one may relax the constraint on maximum gradient strength by using a higher receiver bandwidth. Using SGLD can also help escape the local minima because of its injected randomness. One may also use a larger B-spline kernel width to optimize the gradient waveform in the early stages of a coarse-to-fine search.

Trajectory optimization is a non-convex problem. SNOPY uses several methods, including effective Jacobian approximation, parameterization, multi-level optimization, and SGLD, to alleviate the non-convexity and lead to better optimization results. Such methods were found to be effective in this and previous studies [Wang G, Luo T, Nielsen J F, Noll D C, Fessler J A. B-Spline Parameterized Joint Optimization of Reconstruction and K-Space Trajectories (BJORK) for Accelerated 2D MRI. IEEE Trans Med Imaging 2022 September; 41(9):2318-2330. Wang G, Fessler J A, Efficient Approximation of Jacobian Matrices Involving a Non-uniform Fast Fourier Transform (NUFFT); 2021. https://arxiv.org/abs/2111.02912]. Initialization is also important for non-convex problems. SNOPY can take advantage of existing knowledge of MR sampling as a benign optimization initialization. For example, experiments disclosed herein used the well-received golden-angle stack-of-stars and rotational EPI as optimization bases. The SNOPY algorithm can continue to improve these skillfully designed trajectories to combine the best of both stochastic optimization and researchers' insights.

SNOPY can be extended to many applications, including dynamic and quantitative imaging. These new applications may require task-specific optimization objectives in addition to the ones described in section A.1. In particular, if the reconstruction method is not readily differentiable, such as the MR fingerprinting reconstruction based on dictionary matching [Ma D, Gulani V, Seiberlich N, Liu K, Sunshine J L, Duerk J L, et al. Magnetic Resonance Fingerprinting. Nature 2013; 495(7440):187.], one needs to design a surrogate objective for image quality.

X. Exemplary Embodiments

Aspect 1. A computer-implemented method for designing a non-Cartesian sampling trajectory for either a prespecified image reconstructor or an optimized image reconstructor for producing a magnetic resonance imaging (MRI) image, the method comprising:
    training, via machine learning with one or more processors, to design a non-Cartesian MRI sampling trajectory for either the prespecified image reconstructor or for the optimized image reconstructor for producing an MRI image;
    parameterizing, by the one or more processors, the non-Cartesian sampling trajectory using a basis function set;
    generating, by the one or more processors, the non-Cartesian sampling trajectory for imaging a patient using the MRI machine learning model;
    generating, by the one or more processors, MRI data for the patient using the non-Cartesian sampling trajectory; and
    reconstructing, by the one or more processors, the MRI data using either prespecified reconstruction parameters or the trained reconstruction parameters.

Aspect 2. The computer-implemented method of aspect 1, wherein training the MRI machine learning model includes:
    obtaining, by the one or more processors, a training set of MRI data for an MRI image;
    selecting, by the one or more processors, a non-Cartesian sampling trajectory ($\omega$) for the training set;
    constructing, by the one or more processors, a stochastic matrix for the training set in accordance with the non-Cartesian sampling trajectory ($\omega$);
    initializing, by the one or more processors, a reconstruction of the matrix using an initial set of reconstruction parameters; and
    iteratively updating the reconstruction by updating a reconstruction parameter ($\theta$) of a convolutional neural network (CNN) denoiser and updating the non-Cartesian sampling trajectory ($\omega$) to minimize a difference between a ground truth MRI image and the reconstruction.

Aspect 3. The computer-implemented method of any one of aspects 1-2, wherein the MRI data is generated using the updated non-Cartesian sampling trajectory ($\omega$) and the MRI data is reconstructed using the updated reconstruction parameter ($\theta$).

Aspect 4. The computer-implemented method of any one of aspects 1-3, wherein iteratively updating the reconstruction includes increasing a number of basis functions of the basis function set, beginning a new round of training, and refining the reconstruction parameter ($\theta$).

Aspect 5. The computer-implemented method of any one of aspects 1-4, wherein a matrix for the training set is constructed using a non-uniform fast Fourier transform (NUFFT).

Aspect 6. The computer-implemented method of any one of aspects 1-5, wherein the reconstruction parameter ($\theta$) and the non-Cartesian sampling trajectory ($\omega$) are selected simultaneously.

Aspect 7. The computer-implemented method of any one of aspects 1-6, wherein training the MRI machine learning model to design the non-Cartesian sampling trajectory comprises penalizing the non-Cartesian sampling trajectory to obey hardware constraints, the hardware constraints comprising maximum slew rate and gradient strength.

Aspect 7A. The computer-implemented method of any one of aspects 1-6, wherein training the MRI machine learning model to design the non-Cartesian sampling trajectory comprises penalizing the non-Cartesian sampling trajectory according to a threshold of peripheral nerve stimulation.

Aspect 7B. The computer-implemented method of claim 1, wherein training the MRI machine learning model to design the non-Cartesian sampling trajectory comprises penalizing an echo time of the non-Cartesian sampling trajectory to according to a parameter-weighted image contrast.

Aspect 7C. The computer-implemented method of claim 1, wherein training the MRI machine learning model to design the non-Cartesian sampling trajectory comprises penalizing a point spread function of the non-Cartesian sampling trajectory to be robust to field inhomogeneity.

Aspect 7D. The computer-implemented method of claim 1, wherein training the MRI machine learning model to design the non-Cartesian sampling trajectory comprises penalizing the non-Cartesian sampling trajectory to reduce acoustic noise.

Aspect 8. The computer-implemented method of any one of aspects 1-7, wherein the basis function comprises second-order quadratic B-spline kernels.

Aspect 8a. The computer-implemented method of any one of aspects 1-8, wherein the non-Cartesian sampling trajectory is generated as part of the training of the MRI machine learning model.

Aspect 9. A device for designing a non-Cartesian sampling trajectory for either a prespecified image reconstructor or an optimized image reconstructor for producing a magnetic resonance imaging (MRI) image, the device comprising one or more processors configured to:
    train, via machine learning, to design a non-Cartesian MRI sampling trajectory for either the prespecified image reconstructor or for the optimized image reconstructor for producing an MRI image;
    parameterize the non-Cartesian sampling trajectory using a basis function set;
    generate the non-Cartesian sampling trajectory for imaging a patient using the MRI machine learning model;
    generate MRI data for the patient using the non-Cartesian sampling trajectory; and
    reconstruct the MRI data using either prespecified reconstruction parameters or the trained reconstruction parameters.

Aspect 10. The aspect of claim 9, wherein the non-Cartesian sampling trajectory is step-wise differentiable, thereby enabling differentiable programming.

Aspect 10A. The device of aspect 9, wherein the one or more processors are further configured to train the MRI machine learning by:

obtaining a training set of MRI data for an MRI image;
selecting a non-Cartesian sampling trajectory (ω) for the training set;
constructing a matrix for the training set in accordance with the non-Cartesian sampling trajectory (ω);
initializing a reconstruction of the matrix using an initial set of reconstruction parameters; and
iteratively updating the reconstruction by updating a reconstruction parameter (θ) of a convolutional neural network (CNN) denoiser and updating the non-Cartesian sampling trajectory (ω) to minimize a difference between a ground truth MRI image and the reconstruction.

Aspect 10B. The device of aspect 9, wherein either the prespecified image reconstructor or the optimized image reconstructor is configured to use Jacobians of operations involving a non-uniform fast Fourier transform (NUFFT), and wherein the Jacobians are either calculated by auto-differentiation, or approximated using the approximation relationship between the NUFFT and a non-uniform Fourier transform.

Aspect 11. The device of any one of aspects 9-10, wherein the one or more processors are configured to train the MRI machine learning model according to:

$$\mathcal{L}_{recon} = \|f_{\theta,\omega}(A(\omega)x+\varepsilon)-x\|$$

where:
$\mathcal{L}_{recon}$ is loss during reconstruction during the training; $\|\cdot\|$ is a norm comprising a loss function that compares a reconstructed image to a training image;
θ is the reconstruction parameters;
ω is the non-Cartesian sampling trajectory;
A(ω) denotes a system matrix for the non-Cartesian sampling trajectory ω;
x is training data; and
ε is simulated additive noise.

Aspect 11A. The device of any one of aspects 9-10, wherein the one or more processors are configured to train the MRI machine learning model according to an argument of the minimum equation comprising:

$$\underset{\omega \in \mathbb{R}^{N_s \times N_d}, \theta \in \mathbb{R}^M}{\arg\min} \quad \mathbb{E}\|f_\theta(\omega; A(\omega)x+\varepsilon) - x\| + \phi_{\gamma \Delta t g_{max}}(|D_1\omega|) + \phi_{\gamma \Delta t^2 s_{max}}(|D_2\omega|)$$

where:
ω is the non-Cartesian sampling trajectory;
θ is the reconstruction parameters;
$N_s$ denotes a total number of k-space samples;
$N_d$ denotes an image dimensionality;
$f_\theta(\omega;\cdot)$ denotes the image reconstructor;
ε is simulated additive noise;
$x \in \mathbb{C}^{N_v}$ is the fully sampled reference MRI data having $N_V$ voxels from the fully sampled reference MRI data and;
$A \in \mathbb{C}^{N_s N_c \times N_v}$ denotes a system matrix of MR imaging, where $N_C$ denotes a number of receive coils;
$D_1$ is a first-order finite difference operator;
$D_2$ is a second-order finite difference operator; and
γ is a gyromagnetic ratio.

Aspect 11B The device of any one of aspects 9-10, wherein the one or more processors are configured to train the MRI machine learning model according to a loss that includes: (i) a penalty based on a hardware constraint, (ii) a penalty to minimize a peripheral nerve stimulation effect, (iii) a penalty to control the image contrast by controlling an echo time, (iv) a penalty to reduce acoustic noise, and/or (v) a penalty to counteract a main field inhomogeneity.

Aspect 12. The device of any one of aspects 9-11, wherein the image reconstructor is part of an unrolled neural network, and the unrolled neural network comprises the image reconstructor, and a data consistency unit.

Aspect 13. The device of any one of aspects 9-12, the one or more processors further configured to train the MRI machine learning algorithm by:
obtaining a training set of MRI data for an MRI image;
using a data consistency unit to compare data produced by the image reconstructor to the training set of MRI data; and
if the data produced by the image reconstructor and the training set of MRI data differ by more than a predetermined amount, updating the reconstruction parameters.

Aspect 14. The device of any one of aspects 9-13, wherein the one or more processors are further configured to train by optimizing trajectory attributes (c), wherein ω is the non-Cartesian sampling trajectory, and ω(c) is a nonlinear function of the trajectory attributes (c).

Aspect 14A. The device of any one of aspects 9-13, wherein the one or more processors are further configured to parameterize the non-Cartesian sampling trajectory according to the equation:

$$\omega^{[d]} = Bc^{[d]}$$

where:
ω is the non-Cartesian sampling trajectory;
$B \in \mathbb{R}^{N_s \times L}$ denotes an interpolation matrix for a bias function;
$c^{[d]}$ denotes the dth column of the coefficient matrix $c \in \mathbb{R}^{L \times N_d}$;
L denotes a length of $c^{[d]}$; and
$N_d$ denotes an image dimensionality.

Aspect 15. A system for designing a non-Cartesian sampling trajectory for either a prespecified image reconstructor or an optimized image reconstructor for producing a magnetic resonance imaging (MRI) image, the system comprising:
one or more processors;
at least one transmit coil;
at least one receive coil; and
one or more memories coupled to the one or more processors;
the one or more memories including computer executable instructions stored therein that, when executed by the one or more processors, cause the one or more processors to:
train, via machine learning, to design a non-Cartesian MRI sampling trajectory for either the prespecified image reconstructor or for the optimized image reconstructor for producing an MRI image;
parameterize the non-Cartesian sampling trajectory using a basis function set;
generate the non-Cartesian sampling trajectory for imaging a patient using the MRI machine learning model;
generate MRI data for the patient using the non-Cartesian sampling trajectory; and
reconstruct the MRI data using either prespecified reconstruction parameters or the trained reconstruction parameters.

Aspect 16. The computer system of aspect 15, wherein the one or more memories including computer executable instructions stored therein that, when executed by the one or more processors, further cause the one or more processors to: generate the MRI data by controlling the transmit coil and the receive coil to acquire the MRI data according to the non-Cartesian sampling trajectory.

Aspect 17. The computer system of any one of aspects 15-16, wherein:
the image reconstructor is an invertible neural network; and
the one or more memories including computer executable instructions stored therein that, when executed by the one or more processors, further cause the one or more processors to generate the MRI data for the patient in non-Cartesian three-dimensional (3D) k-space.

Aspect 18. The computer system of any one of aspects 15-17, wherein:
the one or more memories including computer executable instructions stored therein that, when executed by the one or more processors, further cause the one or more processors to generate the MRI data for the patient in non-Cartesian k-space, the non-Cartesian k-space having a plurality of dimensions; and
no dimension of the plurality of dimensions has a least common divisor.

Aspect 19. The computer system of any one of aspects 15-18, wherein:
the image reconstructor is a regularizer; and
the one or more memories including computer executable instructions stored therein that, when executed by the one or more processors, further cause the one or more processors to train the MRI machine learning algorithm by updating a proximal operator of the regularizer.

Aspect 20. The computer system of any one of aspects 15-19, wherein the image reconstructor is a model-based deep learning (MoDL) image reconstructor.

Other Matters

Additionally, certain embodiments are described herein as including logic or a number of routines, subroutines, applications, or instructions. These may constitute either software (code embodied on a non-transitory, tangible machine-readable medium) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of geographic locations.

Furthermore, the patent claims at the end of this patent application are not intended to be construed under 35 U.S.C. § 112(f) unless traditional means-plus-function language is expressly recited, such as "means for" or "step for" language being explicitly recited in the claim(s). The systems and methods described herein are directed to an improvement to computer functionality, and improve the functioning of conventional computers.

What is claimed:

1. A computer-implemented method for designing a non-Cartesian sampling trajectory for either a prespecified image reconstructor or an optimized image reconstructor for producing a magnetic resonance imaging (MRI) image, the method comprising:
   training, via one or more processors, a MRI machine learning model to design a non-Cartesian MRI sampling trajectory for either the prespecified image reconstructor or for the optimized image reconstructor for producing an MRI image;
   parameterizing, by the one or more processors, the non-Cartesian sampling trajectory using a basis function set;
   generating, by the one or more processors, the non-Cartesian sampling trajectory for imaging a patient using the MRI machine learning model;
   generating, by the one or more processors, MRI data for the patient using the non-Cartesian sampling trajectory;
   reconstructing, by the one or more processors, the MRI data using either prespecified reconstructor or the optimized image reconstructor; and
   storing, by the one or more processors, the reconstructed MRI data in a memory.

2. A device for designing a non-Cartesian sampling trajectory for either a prespecified image reconstructor or an optimized image reconstructor for producing a magnetic resonance imaging (MRI) image, the device comprising one or more processors configured to:
   train a MRI machine learning model to design a non-Cartesian MRI sampling trajectory for either the prespecified image reconstructor or for the optimized image reconstructor for producing an MRI image;
   parameterize the non-Cartesian sampling trajectory using a basis function set;
   generate the non-Cartesian sampling trajectory for imaging a patient using the MRI machine learning model;
   generate MRI data for the patient using the non-Cartesian sampling trajectory;
   reconstruct the MRI data using either prespecified reconstruction parameters or optimized image reconstruction parameters; and
   store the reconstructed MRI data in a database.

3. A system for designing a non-Cartesian sampling trajectory for either a prespecified image reconstructor or an optimized image reconstructor for producing a magnetic resonance imaging (MRI) image, the system comprising:
   one or more processors;
   at least one transmit coil;
   at least one receive coil;
   a user interface; and
   one or more memories coupled to the one or more processors;
   the one or more memories including computer executable instructions stored therein that, when executed by the one or more processors, cause the one or more processors to:
      train a MRI machine learning model to design a non-Cartesian MRI sampling trajectory for either the prespecified image reconstructor or for the optimized image reconstructor for producing an MRI image;
      parameterize the non-Cartesian sampling trajectory using a basis function set;
      generate the non-Cartesian sampling trajectory for imaging a patient using the MRI machine learning model;
      generate MRI data for the patient using the non-Cartesian sampling trajectory;
      reconstruct the MRI data using either prespecified reconstruction parameters or reconstruction parameters to produce the MRI image; and
      display the MRI image on the user interface.

4. The computer-implemented method of claim 1, wherein training the MRI machine learning model includes:
   obtaining, by the one or more processors, a training set of MRI data for an MRI image;
   selecting, by the one or more processors, a non-Cartesian sampling trajectory ($\omega$) for the training set;
   initializing, by the one or more processors, a reconstruction of the training set of MRI data using an initial set of reconstruction parameters; and
   iteratively updating the reconstruction by updating a reconstruction parameter ($\theta$) of a convolutional neural network (CNN) denoiser and updating the non-Cartesian sampling trajectory ($\omega$) to minimize a difference between a ground truth MRI image and the reconstruction.

5. The computer-implemented method of claim 1, wherein training the MRI machine learning model to design the non-Cartesian sampling trajectory comprises penalizing the non-Cartesian sampling trajectory to obey hardware constraints, the hardware constraints comprising maximum slew rate and gradient strength.

6. The computer-implemented method of claim 1, wherein the basis function set comprises second-order quadratic B-spline kernels.

7. The device of claim 2, wherein the non-Cartesian sampling trajectory is step-wise differentiable, thereby enabling differentiable programming.

8. The device of claim 2, wherein the one or more processors are configured to train the MRI machine learning model according to:

$$\mathcal{L}_{recon} = \|f_{\theta,\omega}(A(\omega)x+\varepsilon)-x\|$$

where:
   $\mathcal{L}_{recon}$ is loss during reconstruction during the training;
   $\|\cdot\|$ is a norm comprising a loss function that compares a reconstructed image to a training image;
   $\theta$ is the reconstruction parameters;
   $\omega$ is the non-Cartesian sampling trajectory;
   $A(\omega)$ denotes a system matrix for the non-Cartesian sampling trajectory $\omega$;
   x is training data; and
   $\varepsilon$ is simulated additive noise.

9. The device of claim 2, wherein the image reconstructor is part of an unrolled neural network, and the unrolled neural network comprises the image reconstructor, and a data consistency unit.

10. The device of claim 2, the one or more processors further configured to train the MRI machine learning model by:
   obtaining a training set of MRI data for an MRI image;
   using a data consistency unit to compare data produced by the image reconstructor to the training set of MRI data; and
   if the data produced by the image reconstructor and the training set of MRI data differ by more than a predetermined amount, updating the reconstruction parameters.

11. The device of claim 2, wherein the one or more processors are further configured to train by optimizing trajectory attributes (c), wherein $\omega$ is the non-Cartesian sampling trajectory, and $\omega(c)$ is a nonlinear function of the trajectory attributes (c).

12. The system of claim 3, wherein the one or more memories including computer executable instructions stored therein that, when executed by the one or more processors, further cause the one or more processors to:

generate the MRI data by controlling the transmit coil and the receive coil to acquire the MRI data according to the non-Cartesian sampling trajectory.

13. The system of claim 3, wherein:

the image reconstructor is an invertible neural network; and the one or more memories including computer executable instructions stored therein that, when executed by the one or more processors, further cause the one or more processors to generate the MRI data for the patient in non-Cartesian three-dimensional (3D) k-space.

14. The system of claim 3, wherein:

the one or more memories including computer executable instructions stored therein that, when executed by the one or more processors, further cause the one or more processors to generate the MRI data for the patient in non-Cartesian k-space, the non-Cartesian k-space having a plurality of dimensions; and no dimension of the plurality of dimensions has a least common divisor.

15. The system of claim 3, wherein:

the image reconstructor is a regularizer; and the one or more memories including computer executable instructions stored therein that, when executed by the one or more processors, further cause the one or more processors to train the MRI machine learning model by updating a proximal operator of the regularizer.

16. The system of claim 3, wherein the image reconstructor is a model-based deep learning (MoDL) image reconstructor.

17. The computer-implemented method of claim 4, wherein the MRI data is generated using the updated non-Cartesian sampling trajectory ($\omega$) and the MRI data is reconstructed using the updated reconstruction parameter ($\theta$).

18. The computer-implemented method of claim 4, wherein iteratively updating the reconstruction includes increasing a number of basis functions of the basis function set, beginning a new round of training, and refining the reconstruction parameter ($\theta$).

19. The computer-implemented method of claim 4, wherein a matrix for the training set is constructed using a non-uniform fast Fourier transform (NUFFT).

20. The computer-implemented method of claim 4, wherein the reconstruction parameter ($\theta$) and the non-Cartesian sampling trajectory ($\omega$) are designed simultaneously.

\* \* \* \* \*